United States Patent
Tsukamoto et al.

(10) Patent No.: US 7,842,583 B2
(45) Date of Patent: Nov. 30, 2010

(54) METHOD FOR MANUFACTURING SEMICONDUCTOR SUBSTRATE AND METHOD FOR MANUFACTURING SEMICONDUCTOR DEVICE

(75) Inventors: Naoki Tsukamoto, Sagamihara (JP); Akihisa Shimomura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 160 days.

(21) Appl. No.: 12/333,650

(22) Filed: Dec. 12, 2008

(65) Prior Publication Data
US 2009/0170286 A1 Jul. 2, 2009

(30) Foreign Application Priority Data
Dec. 27, 2007 (JP) .............................. 2007-336454

(51) Int. Cl.
*H01L 21/30* (2006.01)
(52) U.S. Cl. ....................... 438/458; 438/795
(58) Field of Classification Search ................ 438/455, 438/458, 795
See application file for complete search history.

(56) References Cited

U.S. PATENT DOCUMENTS

| | | | |
|---|---|---|---|
| 5,374,564 A | 12/1994 | Bruel | |
| 6,140,210 A | 10/2000 | Aga et al. | |
| 6,287,941 B1 | 9/2001 | Kang et al. | |
| 6,335,231 B1 | 1/2002 | Yamazaki et al. | |
| 6,372,609 B1 | 4/2002 | Aga et al. | |
| 6,486,008 B1 | 11/2002 | Lee | |
| 6,653,209 B1 | 11/2003 | Yamagata | |
| 6,759,277 B1 | 7/2004 | Flores et al. | |
| 6,818,529 B2 | 11/2004 | Bachrach et al. | |
| 6,884,694 B2 | 4/2005 | Park et al. | |
| 7,119,365 B2 | 10/2006 | Takafuji et al. | |
| RE39,484 E | 2/2007 | Bruel | |
| 7,253,040 B2 | 8/2007 | Itoga et al. | |
| 7,354,844 B2 | 4/2008 | Endo et al. | |
| 2004/0238851 A1 | 12/2004 | Flores et al. | |
| 2007/0063281 A1 | 3/2007 | Takafuji et al. | |
| 2007/0224839 A1* | 9/2007 | Shimizu | 438/795 |

FOREIGN PATENT DOCUMENTS

| JP | 05-211128 | 8/1993 |
|---|---|---|
| JP | 2000-124092 | 4/2000 |

(Continued)

*Primary Examiner*—Bradley K Smith
(74) *Attorney, Agent, or Firm*—Eric J. Robinson; Robinson Intellectual Property Law Office, P.C.

(57) ABSTRACT

A semiconductor substrate is manufactured in which a plurality of single crystal semiconductor layers is fixed to a base substrate having low heat resistance such as a glass substrate with a buffer layer interposed therebetween. A plurality of single crystal semiconductor substrates is prepared, each of which includes a buffer layer and a damaged region which is formed by adding hydrogen ions to each semiconductor substrate and contains a large amount of hydrogen. One or more of these single crystal semiconductor substrates is fixed to a base substrate and irradiated with an electromagnetic wave having a frequency of 300 MHz to 300 GHz, thereby being divided along the damaged region. Fixture of single crystal semiconductor substrates and electromagnetic wave irradiation are repeated to manufacture a semiconductor substrate where a required number of single crystal semiconductor substrates are fixed onto the base substrate.

28 Claims, 40 Drawing Sheets

FOREIGN PATENT DOCUMENTS

| | | |
|---|---|---|
| JP | 2000-150905 | 5/2000 |
| JP | 2001-244444 | 9/2001 |
| JP | 2003-257804 | 9/2003 |
| JP | 2005-252244 | 9/2005 |
| WO | WO 2004/025360 | 3/2004 |

\* cited by examiner

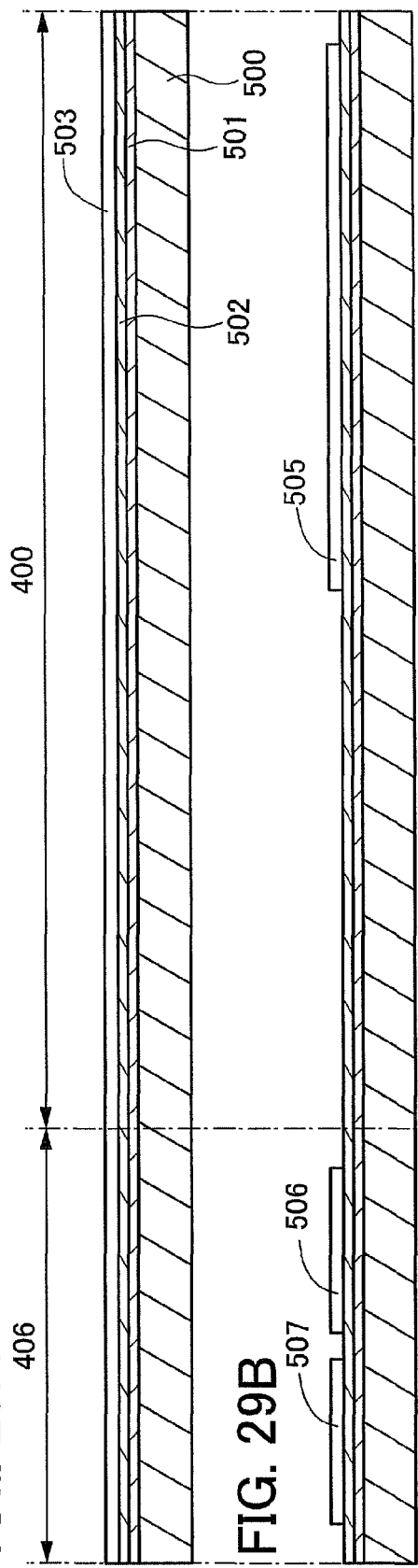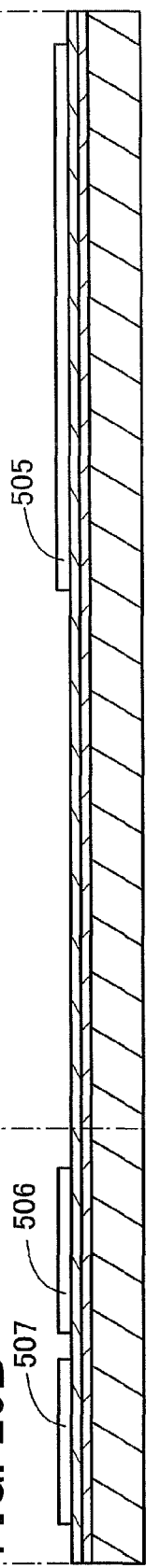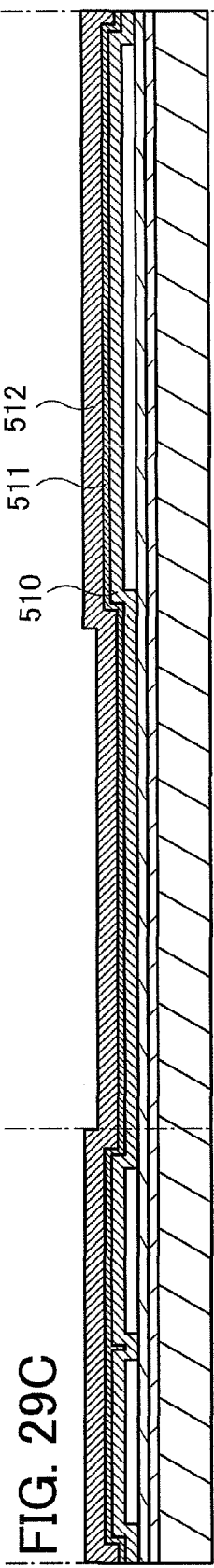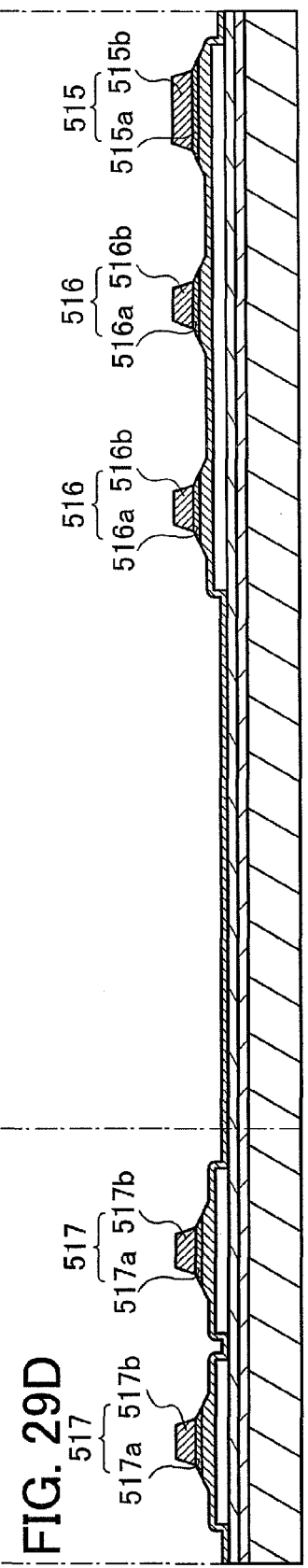

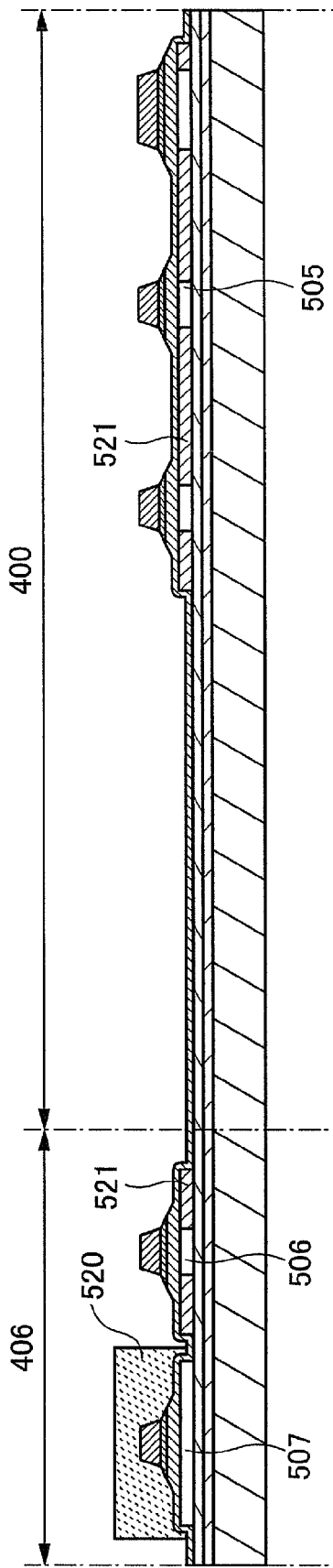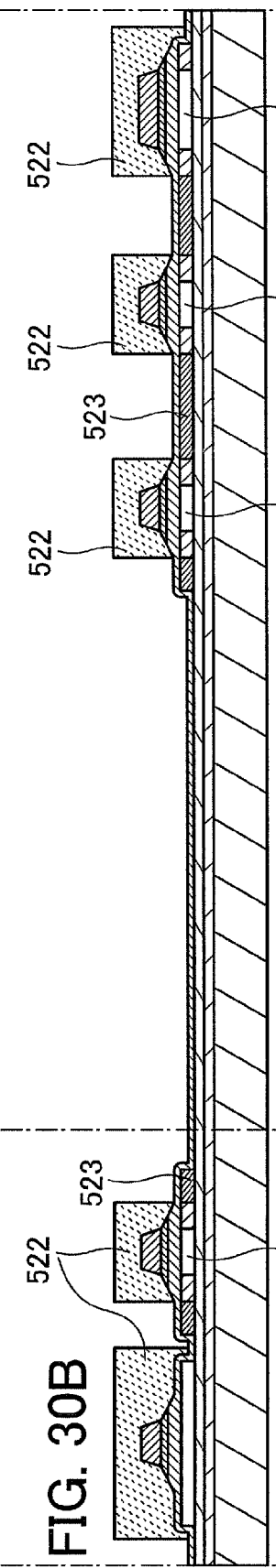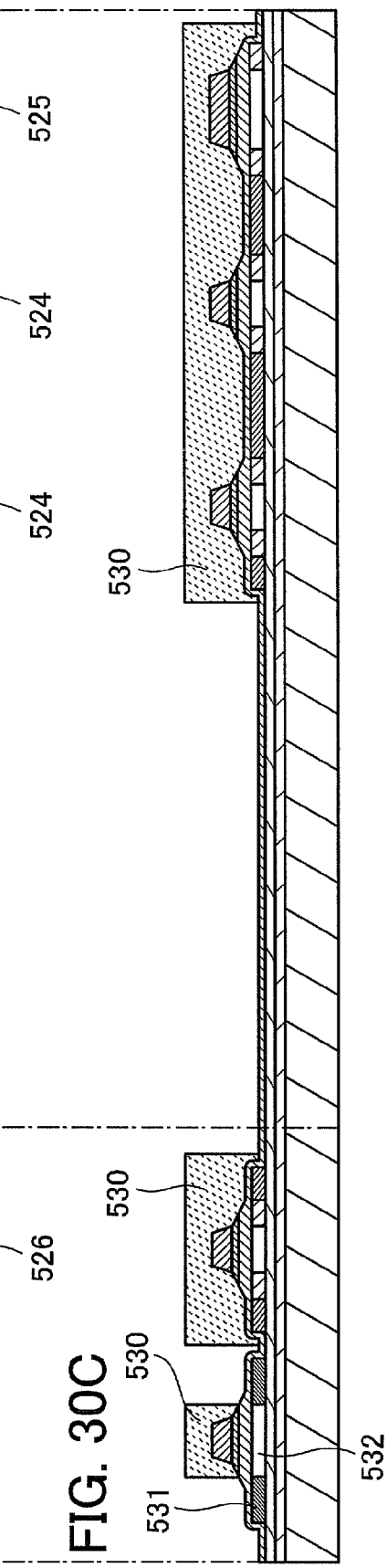

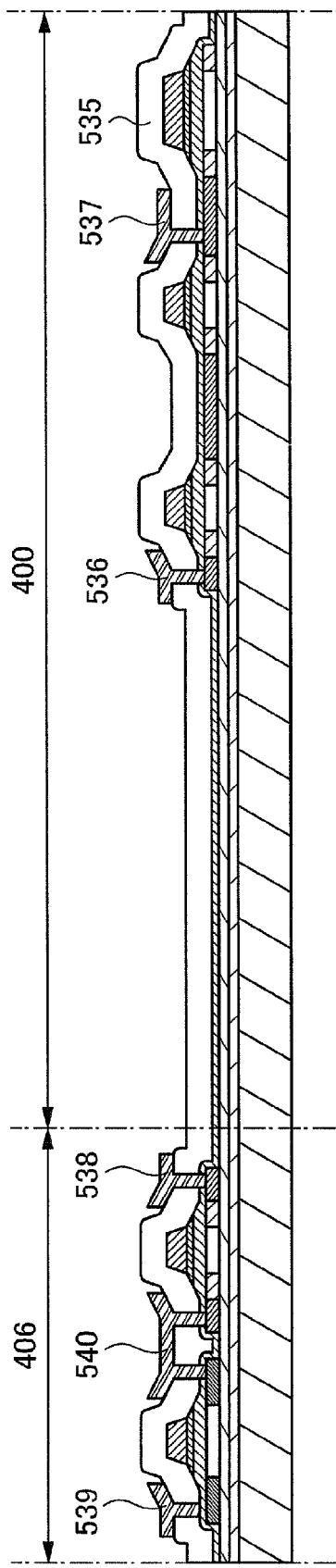
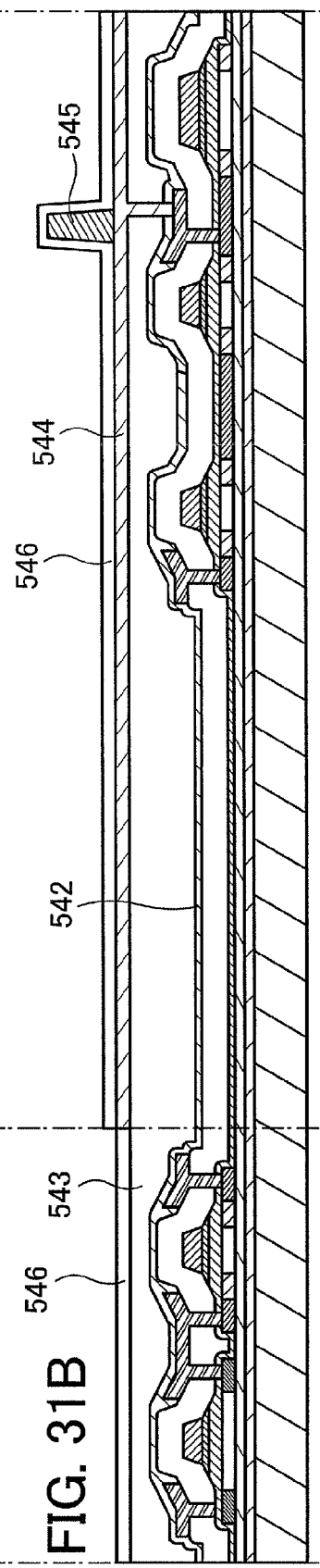
FIG. 31A
FIG. 31B
FIG. 31C

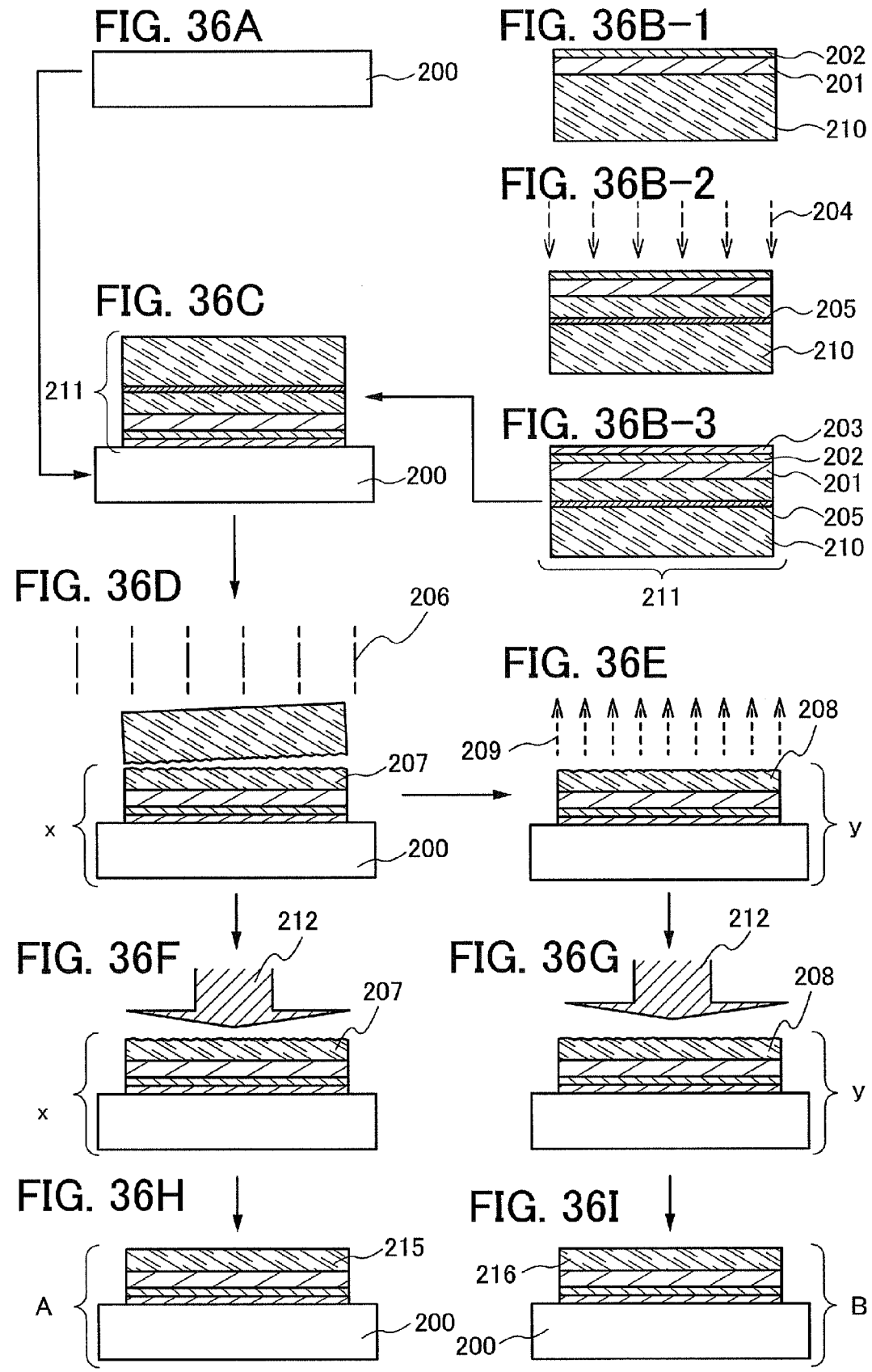

semiconductor substrate x−1
microwave irradiation(2.45GHz)

semiconductor substrate z−1(ref.)
heat treatment (600°C)

FIG. 39A  microwave irradiation (2.45GHz)
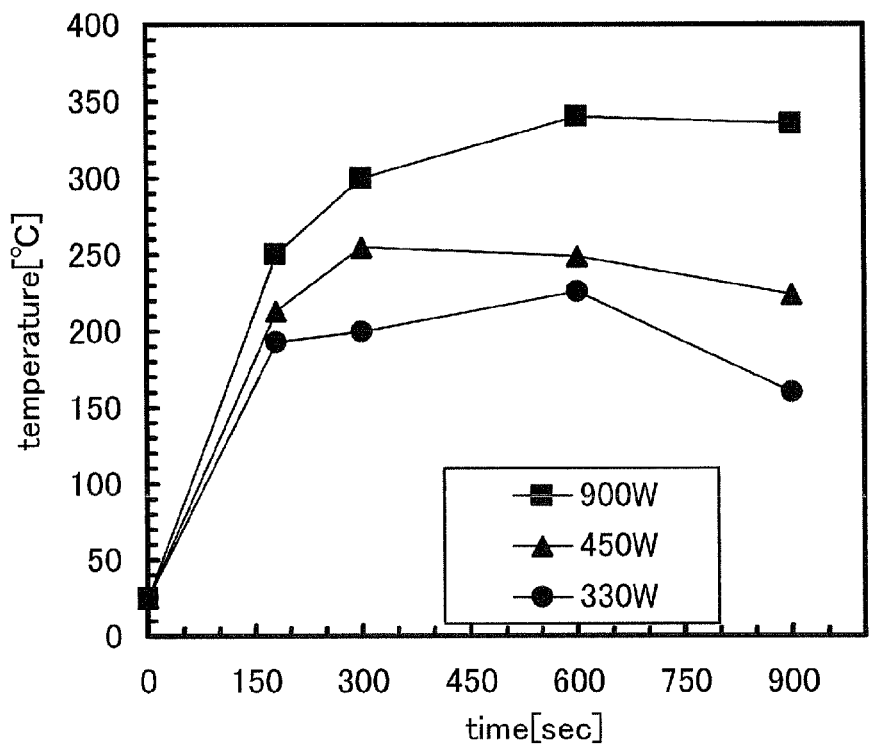
FIG. 39B  millimeter wave irradiation (28GHz)
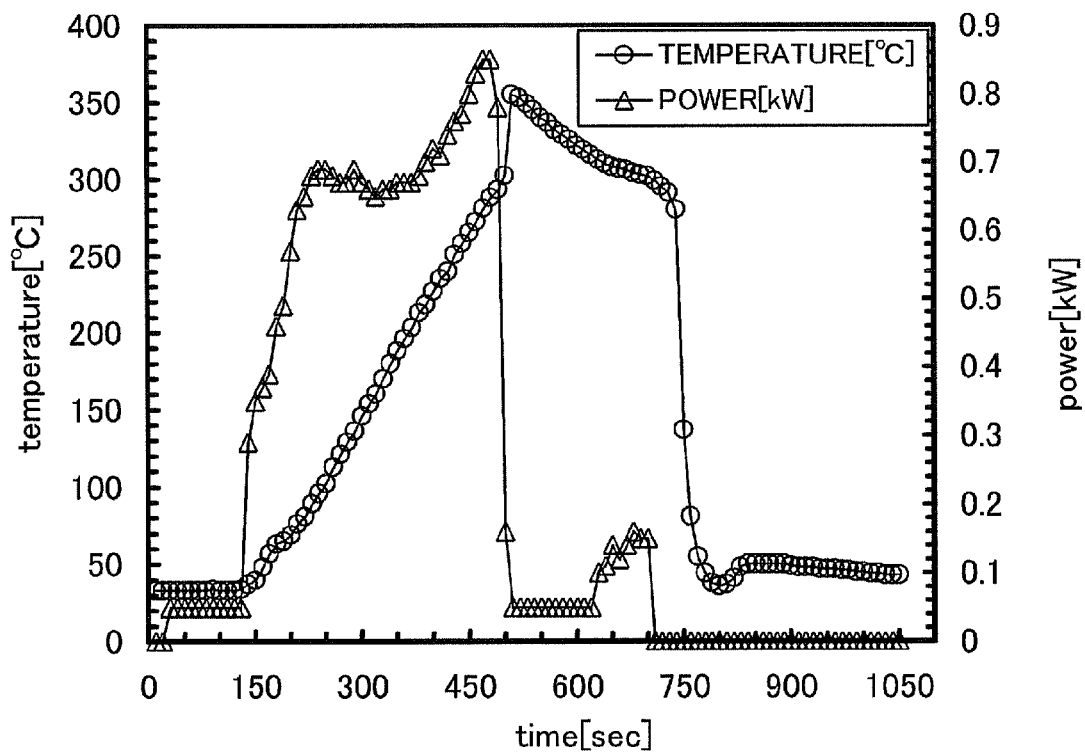

FIG. 41

| heat treatment semiconductor substrate B-2 | before irradiation | 497mJ/cm² | 521mJ/cm² | 544mJ/cm² | 568mJ/cm² | 592mJ/cm² |
|---|---|---|---|---|---|---|
| before heat treatment semiconductor substrate B-2 | | | | | | |

| heat treatment semiconductor substrate B-2 | 616mJ/cm² | 639mJ/cm² | 661mJ/cm² | 683mJ/cm² | 704mJ/cm² |
|---|---|---|---|---|---|
| before heat treatment semiconductor substrate B-2 | | | | | |

FIG. 46
| | | before irradiation | 565mJ/cm² | 579mJ/cm² |
|---|---|---|---|---|
| heat treatment | semiconductor substrate B-3 | 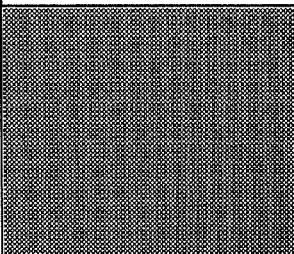 |  | 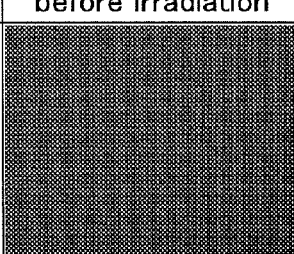 |
| | | before irradiation | | 574mJ/cm² |
|---|---|---|---|---|
| before heat treatment | semiconductor substrate β-3 | 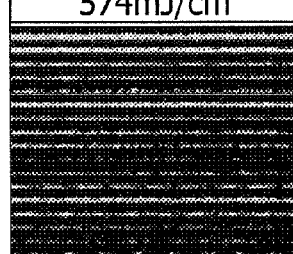 | | 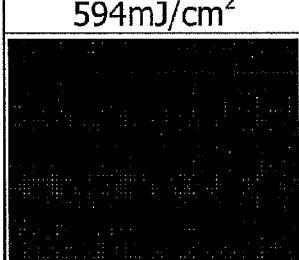 |
| | | 594mJ/cm² | 609mJ/cm² | 623mJ/cm² |
|---|---|---|---|---|
| heat treatment | semiconductor substrate B-3 | 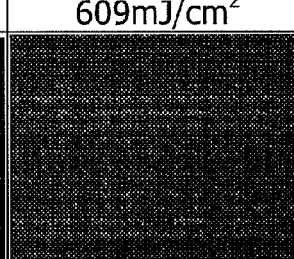 | 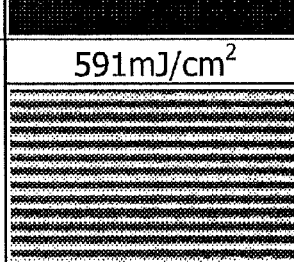 | 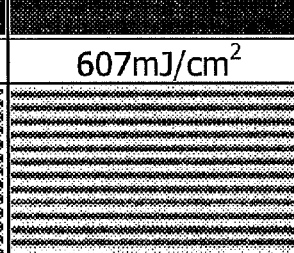 |
| | | 591mJ/cm² | 607mJ/cm² | 623mJ/cm² |
|---|---|---|---|---|
| before heat treatment | semiconductor substrate β-3 | 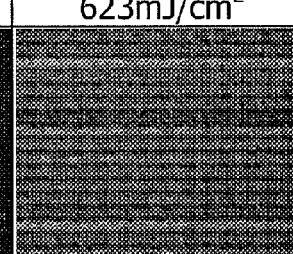 |  |  |

METHOD FOR MANUFACTURING SEMICONDUCTOR SUBSTRATE AND METHOD FOR MANUFACTURING SEMICONDUCTOR DEVICE

BACKGROUND OF THE INVENTION

1. Field of the Invention

The present invention relates to a method for manufacturing a semiconductor substrate including a single crystal semiconductor layer. The present invention also relates to a method for manufacturing a semiconductor device using a semiconductor substrate including a single crystal semiconductor layer.

2. Description of the Related Art

In recent years, integrated circuits using a silicon-on-insulator (SOI) substrate instead of a bulk silicon wafer have been developed. A feature of a thin single crystal silicon layer formed over an insulating layer can be taken advantage of to form a completely electrically isolated semiconductor layer of a transistor in an integrated circuit and to form a completely depleted transistor. Accordingly, a semiconductor integrated circuit having high added values such as high integration, high-speed operation, and low power consumption can be realized.

A separation-by-implanted-oxygen (SIMOX) technique and a bonding technique are well known as techniques for manufacturing SOI substrates. A SIMOX technique refers to a technique in which oxygen ions are implanted at high concentration to a predetermined depth in a single crystal silicon wafer and heat treatment is performed at 1300° C. or higher, thereby forming a buried oxide layer (hereinafter referred to as a "BOX layer") of silicon oxide. In this technique, a single crystal silicon layer is formed by formation of a BOX layer in a bulk single crystal silicon wafer. Due to implantation of oxygen ions, the technique has a disadvantage in that the crystal structure of the single crystal silicon layer is greatly damaged.

A bonding technique refers to a technique in which two single crystal silicon wafers are bonded to each other with an insulating film interposed therebetween and one of the single crystal silicon substrates is divided, thereby forming a thin single crystal silicon layer over the other single crystal silicon wafer with the insulating film interposed therebetween (for example, see Reference 1: Japanese Published Patent Application No. H5-211128).

In Reference 1, first, H$^+$ ions (protons) are implanted into a single crystal silicon wafer to form a microbubble layer therein in order to cleave the single crystal silicon wafer. Next, a silicon wafer which is covered with an oxide and the single crystal silicon wafer in which the microbubble layer is formed are disposed in contact with each other and subjected to heat treatment or electrostatic treatment, thereby bonding the two single crystal silicon wafers to each other. Then, heat treatment is performed to cleave the single crystal silicon wafer along the microbubble layer, thereby forming a thin single crystal silicon layer. A technique of forming a microbubble layer where ions such as hydrogen ions are implanted at high concentration in a semiconductor substrate and dividing the substrate along this layer is referred to as a Smart Cut (registered trademark) method, a hydrogen ion implantation method, or the like.

There are known methods for manufacturing a semiconductor substrate having an SOI structure by forming a single crystal silicon layer over a substrate of a different kind of material such as a glass substrate with the use of such a hydrogen ion implantation method as described above (see References 2 to 5). Reference 2 discloses a method for manufacturing a semiconductor device using a single crystal silicon layer which is formed over a light-transmitting substrate by being separated from a single crystal silicon wafer with the use of a hydrogen ion implantation method (Reference 2: Japanese Published Patent Application No. 2000-150905).

Reference 3 discloses a method for manufacturing an SOI substrate which does not require any heat treatment at a high temperature exceeding 800° C. (Reference 3: Japanese Published Patent Application No. 2005-252244). After a semiconductor wafer is bonded to a glass substrate, heat treat is performed at a temperature not exceeding 600° C. Accordingly, the semiconductor wafer is cleaved along a microbubble layer to separate a semiconductor thin film from the semiconductor wafer, thereby forming a semiconductor thin film layer over the glass substrate. After this separation step, laser light irradiation is performed to improve crystal quality of the semiconductor thin film layer and to strongly bond the semiconductor thin film layer and the glass substrate.

Reference 4 discloses the following: bonding a silicon wafer and a glass substrate; dividing the silicon wafer where ions are implanted, by microwave irradiation; and cooling two substrates to 400° C. or lower in microwave irradiation, when a silicon wafer is bonded to a substrate of a different kind of material, in order to prevent a bonding structure between the two substrates from being destroyed with a temperature increase in dividing the silicon wafer, due to a difference in coefficient of thermal expansion between the silicon wafer and the substrate (Reference 4: Japanese Published Patent Application No. 2001-244444).

Reference 5 discloses that a plurality of single crystal silicon layers is bonded to one glass substrate in a tiled manner (Reference 5: Japanese Translation of PCT International Application No. 2005-539259). In Reference 5, a semiconductor substrate (donor substrate) is divided not by heat treatment but by separation through destruction with a mechanical means such as a nitrogen gas flow (see page 12, lines 40 to 44).

SUMMARY OF THE INVENTION

Because a glass substrate has a larger area and is less expensive than a silicon wafer, a large-area, inexpensive SOI substrate can be manufactured by providing a plurality of single crystal silicon layers over a glass substrate as in Reference 5. In addition, because a glass substrate transmits light, an SOI substrate which is suitable for manufacture of a display device can be manufactured by use of a glass substrate as a base substrate.

However, a glass substrate has disadvantages in that a glass substrate shrinks when heated, has a strain point of 700° C. or lower, is more likely to bend than a silicon wafer, and has an undulating surface, etc. Due to such disadvantages, there are more restrictions on a method for manufacturing an SOI substrate using a glass substrate as a base substrate than on a method for manufacturing an SOI substrate using a semiconductor substrate.

In treatment for dividing a semiconductor substrate into a thin film shape through the aforementioned hydrogen ion implantation method, the semiconductor substrate is desirably heated at a temperature of 400° C. or higher in order to expand a hydrogen gas in the semiconductor substrate. However, if the temperature of a glass substrate as well as that of the semiconductor substrate is increased in the heat treatment, the glass substrate may shrink.

As a method for bonding a plurality of semiconductor layers to a glass substrate, there is a method in which the step of bonding a semiconductor substrate to a glass substrate and the step of dividing the semiconductor substrate by heat treatment are repeated. However, if the glass substrate shrinks every time heat treatment is performed, it becomes impossible to control positions where semiconductor substrates are bonded in the second and later bonding steps.

As a method for solving such problems, the present applicant has developed a method in which a glass substrate is subjected to heat treatment at a high temperature of about 600° C. to 700° C. in a heating furnace to make the glass substrate shrink in advance before a semiconductor substrate is bonded thereto. When a glass substrate is subjected to heat treatment at a high temperature of 600° C. or higher in advance, the shrinkage of the glass substrate in manufacturing an SOI substrate can be decreased. However, it takes about 16 hours of treatment to make the glass substrate sufficiently shrink through the high-temperature heat treatment. Thus, the high-temperature heat treatment has adverse effects on productivity and cost when employed to solve a shrinkage problem.

In addition, the planarity of a division surface of a semiconductor layer that is separated from a semiconductor substrate by a hydrogen ion implantation method is lowered. On the other hand, suppression of unevenness on a division surface and increase of dielectric strength of a gate insulating layer are required to manufacture a high-performance transistor. Although mechanical polishing has been employed for planarization treatment of a division surface of a semiconductor layer that is bonded to a silicon wafer, mechanical polishing treatment is not suitable for planarization treatment of a plurality of semiconductor layers that is bonded to a glass substrate in view of processing accuracy, yield, and the like because a glass substrate is more likely to bend than a silicon wafer and has an undulating surface. That is, when a substrate such as a glass substrate is used as a base substrate, a problem emerges in that it is difficult to improve surface unevenness of a semiconductor layer which is fixed to the base substrate.

Furthermore, in a hydrogen ion implantation method, the crystal structure of a semiconductor layer is damaged by addition of ions, division of a semiconductor substrate, or the like. On the other hand, recovery of crystallinity of a semiconductor layer is required to manufacture a high-performance transistor. Removal of crystal defects in a semiconductor layer which is bonded to a silicon wafer can be achieved by heating at a temperature of 1000° C. or higher; however, such a high temperature process cannot be employed for removal of crystal defects in a semiconductor layer that is bonded to a glass substrate having a strain point of 700° C. or lower.

In view of the aforementioned problems, it is an object of the present invention to provide a method for manufacturing a semiconductor substrate and a method for manufacturing a semiconductor device, by which a plurality of single crystal semiconductor layers can be fixed to a base substrate with high positioning accuracy even when a glass substrate which shrinks easily is used as the base substrate.

It is another object of the present invention to provide methods for manufacturing a semiconductor substrate and a method for manufacturing a semiconductor device, by which a semiconductor substrate where a plurality of single crystal semiconductor layers is fixed to a base substrate which shrinks easily, such as a glass substrate, can be manufactured with high productivity.

It is yet anther object of the present invention to provide methods for manufacturing a semiconductor substrate and a semiconductor device, by which planarity of a single crystal semiconductor layer fixed to a base substrate can be improved and crystallinity thereof can be recovered even when a substrate which has low heat resistance and is more likely to bend, such as a lass substrate, is used as the base substrate.

Note that the present invention achieves at least one of the listed objects.

One aspect of the present invention is a method for manufacturing a semiconductor substrate, which includes: preparing a base substrate and a plurality of single crystal semiconductor substrates each having a buffer layer on a surface and a damaged region that is formed in a region at a predetermined depth from the surface by irradiation with accelerated ions; performing a substrate fixing treatment to fix one or more of the plurality of single crystal semiconductor substrates to the base substrate by bonding a surface of the buffer layer and a surface of the base substrate; performing an electromagnetic wave irradiation treatment to divide the one or more of the plurality of single crystal semiconductor substrates fixed to the base substrate through the substrate fixing treatment along the damaged region by irradiating the one or more of the plurality of single crystal semiconductor substrates with an electromagnetic wave having a frequency of 300 MHz to 300 GHz; and performing the substrate fixing treatment and the electromagnetic wave irradiation treatment twice or more to form a semiconductor substrate where a plurality of single crystal semiconductor layers is fixed to the base substrate. In this aspect of the present invention, the semiconductor substrate manufactured by the above-described method is preferably subjected to a laser irradiation treatment. In this laser irradiation treatment, the plurality of single crystal semiconductor layers is melted by being each irradiated with laser light.

Another aspect of the present invention is a method for manufacturing a semiconductor substrate, which includes: preparing a base substrate and a plurality of single crystal semiconductor substrates each provided with a buffer layer on a surface and a damaged region which is formed in a region at a predetermined depth from the surface by irradiation with accelerated hydrogen ions; performing a substrate fixing treatment to fix one or more of the plurality of single crystal semiconductor substrates to the base substrate by bonding a surface of the buffer layer and a surface of the base substrate; performing an electromagnetic wave irradiation treatment to divide the one or more of the plurality of single crystal semiconductor substrates fixed to the base substrate through the substrate fixing treatment along the damaged region by irradiating the one or more of the plurality of single crystal semiconductor substrates with an electromagnetic wave having a frequency of 300 MHz to 300 GHz; performing the substrate fixing treatment and the electromagnetic wave irradiation treatment twice or more to form a semiconductor substrate where a plurality of single crystal semiconductor layers is fixed to the base substrate; performing a heat treatment to heat the plurality of single crystal semiconductor layers of the semiconductor substrate at a temperature equal to or higher than 410° C. and lower than a melting point of the plurality of the single crystal semiconductor layers; and performing a laser irradiation treatment to melt the plurality of single crystal semiconductor layers by irradiating each of the plurality of single crystal semiconductor layers with laser light after the heat treatment.

The heat treatment before the laser irradiation treatment is preferably performed at 500° C. or higher. Through this heat treatment, the hydrogen concentration of the plurality of single crystal semiconductor layers is preferably made $1 \times 10^{21}$ atoms/cm$^3$ or less. Note that the hydrogen concentration of the single crystal semiconductor layers is defined by the minimum value of hydrogen concentration measured by secondary ion mass spectrometry (SIMS).

In the present invention, the buffer layer can be formed not only on the surface of the single crystal semiconductor substrate but also on a surface of the base substrate. Alternatively, the buffer layer can be formed only on the surface of the base substrate. The buffer layer preferably includes a barrier layer which can prevent sodium from diffusing into the single crystal semiconductor layer from the base substrate side. As the barrier layer, a silicon nitride oxide film or a silicon nitride film can be used.

Note that "single crystal" means a crystal in which, when a certain crystal axis is focused, the direction of the crystal axis is oriented in the same direction in any portion of a sample and which has no crystal grain boundaries. Note that, in this specification, the single crystal includes a crystal in which the direction of crystal axes is uniform as described above and which has no grain boundaries even when it includes a crystal defect or a dangling bond.

In addition, recrystallization of a layer having a crystalline structure means that a layer having a crystalline structure returns to a layer having a crystalline structure after being in a state different from its crystalline structure (e.g., a liquid phase state). In addition, recrystallization of a single crystal semiconductor into a single crystal semiconductor is referred to as "re-single-crystallization" in this specification.

In methods for manufacturing a semiconductor substrate and a semiconductor device of the present invention, by laser light irradiation, a region irradiated with laser light in a single crystal semiconductor layer is partly melted from the surface in a depth direction. For example, by laser light irradiation, a surface of a single crystal semiconductor layer and its vicinity are melted. Alternatively, by laser light irradiation, the region irradiated with laser light in the single crystal semiconductor layer is entirely melted in a depth direction.

In the present invention, the substrate fixing treatment, the electromagnetic wave irradiation treatment, and the laser irradiation treatment can be performed at a process temperature of 700° C. or lower; thus, a glass substrate with a strain point of 700° C. or lower can be used as the base substrate.

In addition, treatment for dividing the single crystal semiconductor substrate is performed by irradiation with electromagnetic waves having a frequency of 300 MHz to 300 GHz; thus, the temperature of the base substrate can be prevented from exceeding 400° C. Thus, even if a glass substrate is used as the base substrate and treatment for dividing the single crystal semiconductor substrate is performed a plurality of times, the base substrate hardly shrinks; accordingly, a plurality of single crystal semiconductor layers can be fixed onto the glass substrate by a plurality of substrate fixing treatments. In addition, in the substrate fixing treatment, a position at which the single crystal semiconductor substrate is fixed can be determined with high accuracy.

Furthermore, in the present invention, the plurality of single crystal semiconductor layers is melted by the laser irradiation treatment. Accordingly, even if a substrate which has low heat resistance and is more likely to bend, such as a glass substrate, is used as the base substrate, planarity of the single crystal semiconductor layers fixed to the base substrate can be improved and crystallinity thereof can be recovered.

Note that the present invention has at least one of the listed advantageous effects.

BRIEF DESCRIPTION OF THE DRAWINGS

FIG. 6B, a cross-sectional view taken along a section line b1-b2 of FIG. 9; FIG. 6C, a cross-sectional view taken along a section line c1-c2 of FIG. 10; and FIG. 6E, a cross-sectional view taken along a section line e1-e2 of FIG. 11).

FIGS. 29A to 29D are cross-sectional views illustrating a method for manufacturing an active-matrix liquid crystal display device.

FIGS. 30A to 30C are cross-sectional views illustrating a method for manufacturing an active-matrix liquid crystal display device.

FIGS. 31A to 31C are cross-sectional views illustrating a method for manufacturing an active-matrix liquid crystal display device.

FIG. 34B, a digital camera; FIG. 34C, a notebook personal computer; FIG. 34D, a portable information terminal; FIG. 34E, a DVD reproduction device; FIG. 34F, an electronic book reader; FIG. 34G a video camera; and FIG. 34H, a cellular phone).

FIG. 35B, a rear view; and FIG. 35C, a development view).

FIGS. 36A, 36B-1 to 36B-3, and 36C to 36I are cross-sectional views illustrating a method for manufacturing a semiconductor substrate (FIG. 36A illustrates a step of preparing a base substrate; FIGS. 36B-1 to 36B-3, a step of preparing a single crystal semiconductor substrate; FIG. 36C, substrate fixing treatment; FIG. 36D, electromagnetic wave irradiation treatment; FIG. 36E, heat treatment of a semiconductor substrate; FIGS. 36F and 36G, laser irradiation treatment; and FIGS. 36H and 36I, semiconductor substrates after laser irradiation treatment).

FIG. 37B, a semiconductor substrate after heat treatment at 600° C.).

FIGS. 39A and 39B are graphs of changes in temperature of a single crystal silicon wafer (FIG. 39A: microwave irradiation, FIG. 39B: millimeter wave irradiation).

FIG. 41 shows optical photomicrographs (dark field images) of single crystal silicon layers of semiconductor substrates.

FIG. 46 shows optical photomicrographs (dark field images) of single crystal silicon layers of semiconductor substrates.

DETAILED DESCRIPTION OF THE INVENTION

Figure 1A:
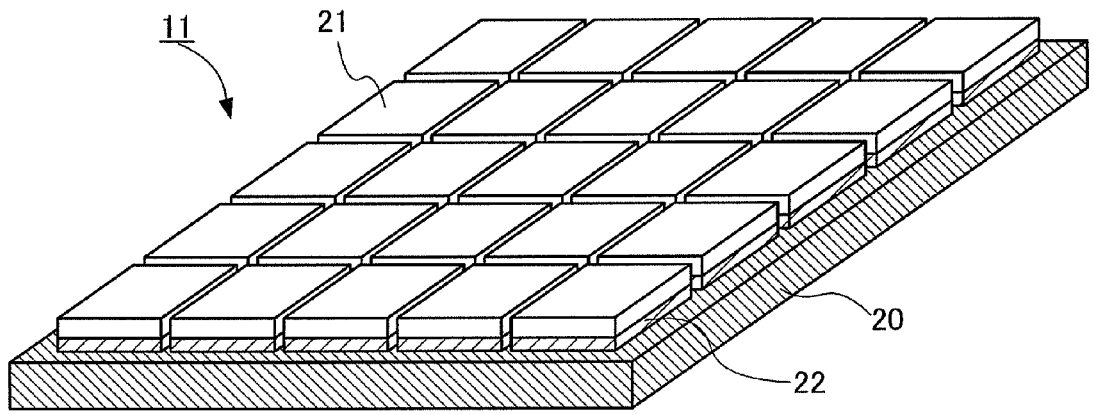
FIGS. 1A to 1C are each a perspective view of a semiconductor substrate.

The present invention will be hereinafter described. The present invention can be carried out in many different modes and it is easily understood by those skilled in the art that the mode and detail of the present invention can be changed in various ways without departing from the spirit and scope thereof. Thus, the present invention should not be interpreted as being limited to the description in the embodiment modes and embodiments to be given below. Components denoted by the same reference numerals in different drawings are the same components; therefore, repetitive descriptions on material, form, manufacturing method, and the like are omitted.

Embodiment Mode 1

In this embodiment mode, a semiconductor substrate in which a single crystal semiconductor layer is fixed to a base substrate with a buffer layer interposed therebetween and a manufacturing method thereof are described. In addition, in this embodiment mode, planarization treatment and crystallinity recovery treatment of a single crystal semiconductor layer which is fixed to a base substrate are described.

Figure 1B:
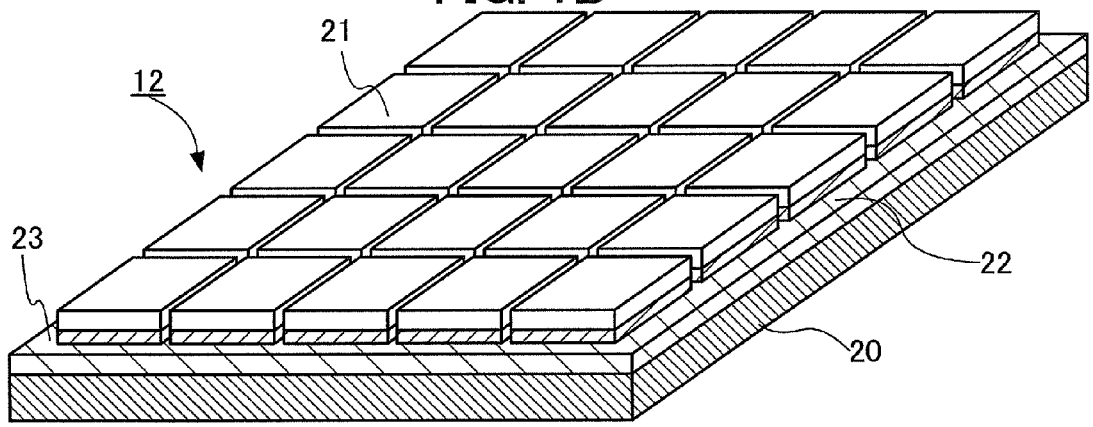
Figure 1C:
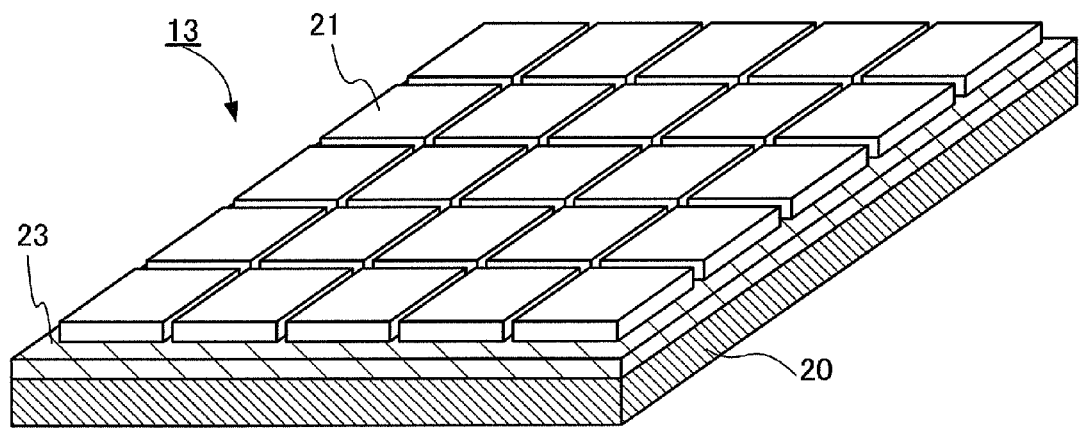

In this embodiment mode, a structure of a semiconductor substrate is described. FIGS. 1A to 1C are perspective views each illustrating an example of a structure of a semiconductor substrate. Semiconductor substrates 11 to 13 illustrated in FIGS. 1A to 1C are each a substrate in which a plurality of single crystal semiconductor layers 21 is each bonded to one base substrate 20 with an insulating layer interposed therebetween. The single crystal semiconductor layer 21 is a layer formed by division of a single crystal semiconductor substrate. The semiconductor substrates 11 to 13 are substrates having a so-called SOI structure, in which a single crystal semiconductor layer is formed over an insulating layer.

As illustrated in FIG. 1A, the semiconductor substrate 11 is a substrate in which a plurality of single crystal semiconductor layers 21 is each fixed to a base substrate 20 with a buffer layer 22 interposed therebetween. The buffer layer 22 is a layer which is formed over a single crystal semiconductor substrate. By bonding between a surface of the buffer layer 22 and a surface of the base substrate 20, each of the single crystal semiconductor layers 21 is fixed to the base substrate 20.

As illustrated in FIG. 1B, the semiconductor substrate 12 is a semiconductor substrate obtained by additionally providing a buffer layer 23 in the semiconductor substrate 11, in which a plurality of single crystal semiconductor layers 21 is each provided over a base substrate 20 with a buffer layer 22 and the buffer layer 23 interposed therebetween. The buffer layer 23 is a layer which is formed over the base substrate 20. By bonding between the buffer layer 22 and the buffer layer 23, each of the single crystal semiconductor layers 21 is fixed to the base substrate 20.

As illustrated in FIG. 1C, the semiconductor substrate 13 is a substrate in which a plurality of single crystal semiconductor layers 21 is fixed to a base substrate 20 with a buffer layer 23 interposed therebetween. By bonding between the buffer layer 23 and a surface of each of the plurality of single crystal semiconductor layers 21, the plurality of single crystal semiconductor layers 21 is fixed to the base substrate 20.

As the base substrate 20, a substrate having an insulating surface can be used. The base substrate 20 preferably has a coefficient of thermal expansion equal to or substantially equal to that of a single crystal semiconductor substrate. For example, the base substrate 20 preferably has a coefficient of thermal expansion of $25 \times 10^{-7}/°$ C. to $50 \times 10^{-7}/°$ C. In addition, the base substrate 20 preferably has a strain point of 580° C. to 700° C., more preferably, 600° C. to 700° C.

For example, as the base substrate 20, a glass substrate can be used. As a glass substrate, a non-alkali glass substrate of aluminosilicate glass, aluminoborosilicate glass, barium borosilicate glass, or the like is preferably used. Note that the base substrate 20 is not limited to a glass substrate and can be an insulating substrate made of an insulator, such as a ceramic substrate, a quartz substrate, or a sapphire substrate, a semiconductor substrate made of a semiconductor, such as a silicon substrate or a gallium arsenide substrate, or the like.

As the base substrate 20, a large-sized substrate of 300 mm×300 mm or larger can be used. As such a large-sized substrate, a mother glass substrate which is developed for manufacture of liquid crystal panels is preferred. Substrates with the following sizes are known as mother glass substrates, for example: 3rd generation (550 mm×650 mm), 3.5th generation (600 mm×720 mm), 4th generation (680 mm×880 mm or 730 mm×920 mm), 5th generation (1100 mm×1300 mm), 6th generation (1500 mm×1850 mm), 7th generation (1870 mm×2200 mm), 8th generation (2200 mm×2400 mm), and the like. With the use of a large-sized mother glass substrate as the base substrate 20 for manufacture of the semiconductor substrates 11 to 13, the size of the semiconductor substrates 11 to 13 can be increased.

The single crystal semiconductor layers 21 are each a layer formed by division of a single crystal semiconductor substrate. As a single crystal semiconductor substrate, a commercially available semiconductor substrate can be used. For example, a single crystal semiconductor substrate that is formed of a group 14 element, such as a single crystal silicon substrate, a single crystal germanium substrate, or a single crystal silicon germanium substrate can be used. In addition, a compound semiconductor substrate of gallium arsenide, indium phosphide, or the like can also be used.

The buffer layers 22 and 23 are each formed of an insulating layer having a single-layer structure or a stacked-layer structure. Examples of films that can be used to form the buffer layers 22 and 23 are insulating films containing silicon or germanium as their components, such as a silicon oxide film, a silicon nitride film, a silicon oxynitride film, a silicon nitride oxide film, a germanium oxide film, a germanium nitride film, a germanium oxynitride film, and a germanium nitride oxide film. Other examples are as follows: insulating films made of a metal oxide such as aluminum oxide, tantalum oxide, or hafnium oxide; insulating films made of a metal nitride such as aluminum nitride; insulating films made of a metal oxynitride such as an aluminum oxynitride film; and insulating films made of a metal nitride oxide such as an aluminum nitride oxide film.

These insulating films can be formed by a chemical vapor deposition (CVD) method, a sputtering method, an atomic layer epitaxy (ALE) method, or a method of, for example, oxidizing or nitriding a single crystal semiconductor substrate. A CVD method includes a low-pressure CVD method, a thermal CVD method, a plasma-enhanced CVD method (hereinafter referred to as a PECVD method), and the like. A PECVD method is preferable because it is low-temperature treatment at 350° C. or lower and provides a higher deposition rate than other CVD methods.

Note that, in this specification, oxynitride refers to a substance which contains more oxygen atoms than nitrogen atoms, and nitride oxide refers to a substance which contains more nitrogen atoms than oxygen atoms. An example of silicon oxynitride is a substance which contains more oxygen than nitrogen and contains oxygen, nitrogen, and silicon at concentrations ranging from 55 at. % to 65 at. %, 1 at. % to 20 at. %, and 25 at. % to 35 at. %, respectively. Silicon oxynitride may contain hydrogen at concentrations ranging from 0.1 at. % to 10 at. %. An example of silicon nitride oxide is a substance which contains more nitrogen than oxygen and contains oxygen, nitrogen, and silicon at concentrations ranging from 15 at. % to 30 at. %, 20 at. % to 35 at. %, and 25 at. % to 35 at. %, respectively. Note that a silicon nitride oxide film may contain hydrogen at concentrations ranging from 15 at. % to 25 at. %.

It is preferable that the buffer layers 22 and 23 include at least one insulating film which functions as a barrier layer. Note that, in the semiconductor substrate 12, at least one of the buffer layers 22 and 23 may be provided with a barrier layer.

The barrier layer is provided to prevent impurities, which may decrease reliability of a semiconductor device, such as alkali metal and alkaline earth metal (typically, sodium), from entering the single crystal semiconductor layer 21 from the base substrate 20 during manufacture of a semiconductor substrate, during manufacture of a semiconductor device with the semiconductor substrate, and during use of the semiconductor device. When the barrier layer is formed, a semiconductor substrate and a semiconductor device can be prevented from being contaminated by impurities; therefore, reliability thereof can be improved.

Examples of films which function as barrier layers are as follows: a silicon nitride film, a silicon nitride oxide film, an aluminum nitride film, an aluminum nitride oxide film, and the like. These insulating films can each be formed to have a thickness of 5 nm to 200 nm.

Note that, when the buffer layers 22 and 23 each have a stacked-layer structure, the buffer layers 22 and 23 may each include a conductive layer made of a metal, an alloy, a metal compound, or the like or a semiconductor layer made of silicon or the like. Note that a layer in each of the buffer layers 22 and 23, which is in contact with the single crystal semiconductor layer 21 or which forms a bonding plane, is preferably formed using an insulating film.

Semiconductor devices can be manufactured using the semiconductor substrates 11 to 13 of this embodiment mode. A variety of semiconductor elements, such as a transistor, a diode, a capacitor, a resistor, or a memory transistor, are manufactured using at least one of the plurality of single crystal semiconductor layers 21 which is fixed to the base substrate 20 in each of the semiconductor substrates 11 to 13. In addition, a variety of integrated circuits are manufactured with a combination of these semiconductor elements.

Embodiment Mode 2

Figure 2:
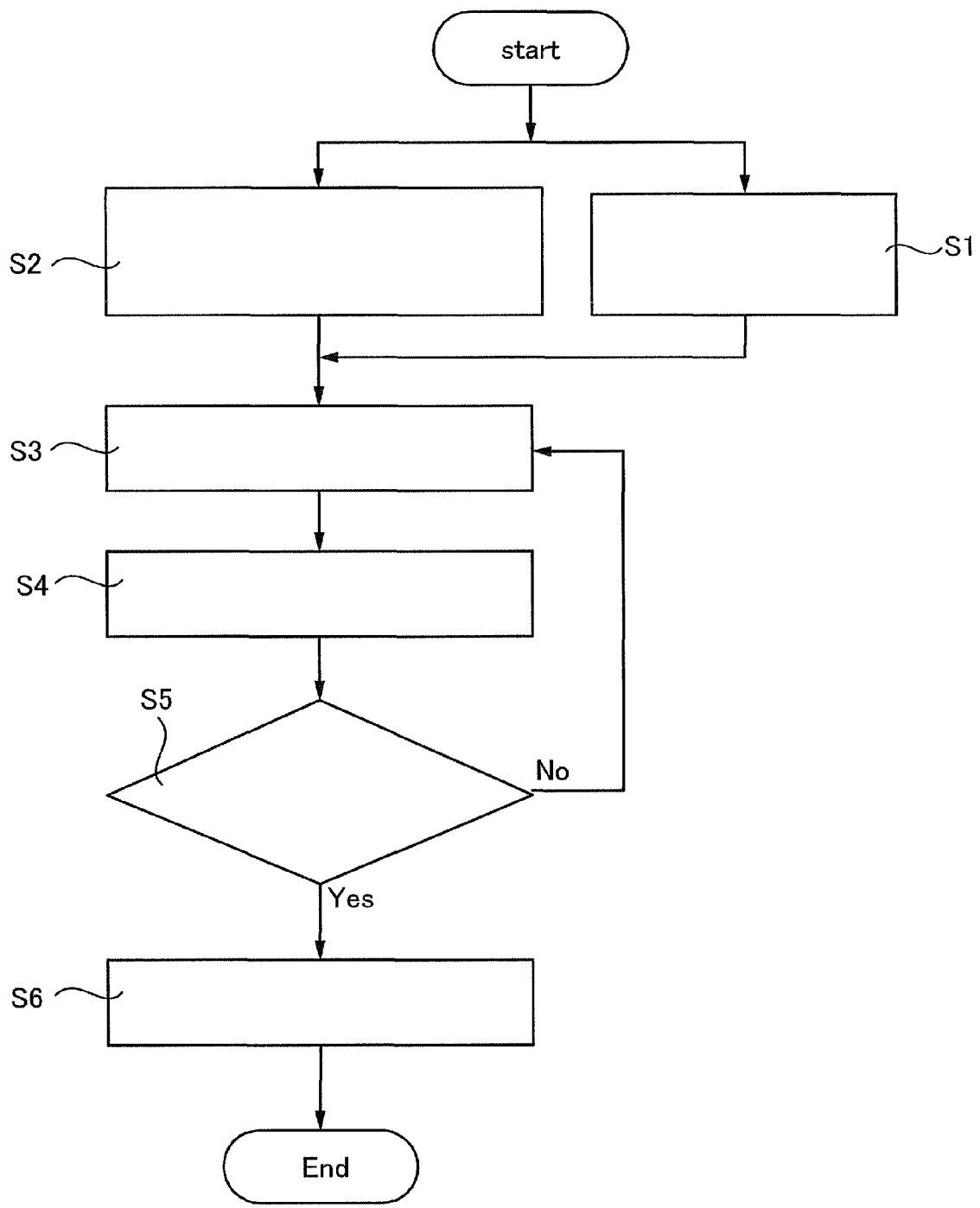
FIG. 2 is a flow chart of a method for manufacturing a semiconductor substrate.

In this embodiment mode, a method for manufacturing a semiconductor substrate is described. FIG. 2 is a flow chart of a method for manufacturing a semiconductor substrate of the present invention. With the flow of FIG. 2, the semiconductor substrates 11 to 13 illustrated in FIGS. 1A to 1C can be manufactured.

A base substrate is prepared (Step S1), and a plurality of single crystal semiconductor substrates to be fixed to the base substrate is prepared (Step S2). In Step S1, a buffer layer is formed over a surface of the base substrate as necessary. For example, in the case of manufacturing the semiconductor substrate 12 of FIG. 1B or the semiconductor substrate 13 of FIG. 1C, a base substrate provided with a buffer layer is prepared in Step S1.

In Step S2, ions (for example, hydrogen ions) are added to a single crystal semiconductor substrate, whereby a damaged region is formed in the single crystal semiconductor substrate at a predetermined depth in order to divide the single crystal semiconductor substrate. A buffer layer is also formed as necessary over a surface of the single crystal semiconductor substrate. In the case of manufacturing the semiconductor substrate 11 of FIG. 1A or the semiconductor substrate 12 of FIG. 1B, a single crystal semiconductor substrate provided with a buffer layer is prepared in Step S2. In Step S2, a plurality of single crystal semiconductor substrates each provided with a damaged region or both a damaged region and a buffer layer is prepared.

Next, substrate fixing treatment is performed (Step S3) to bond the base substrate prepared in Step S1 and the single crystal semiconductor substrate prepared in Step S2 to each other. In the substrate fixing treatment, one or more of the single crystal semiconductor substrates is bonded to the base substrate.

Next, the one or more of single crystal semiconductor substrates bonded to the base substrate through the substrate fixing treatment is irradiated with electromagnetic waves having a frequency of 300 MHz to 300 GHz, whereby the one or more of single crystal semiconductor substrates is divided along the damaged region (Step S4). Through this electromagnetic wave irradiation treatment, one or a plurality of single crystal semiconductor layers is fixed to the base substrate.

Step S3 and Step S4 are repeated (Step S5) until a predetermined number of single crystal semiconductor layers are fixed to the base substrate. When Step S5 is completed, a semiconductor substrate of the present invention is manufactured.

In the present invention, a single crystal semiconductor substrate is divided by irradiation with electromagnetic waves having a frequency of 300 MHz to 300 GHz; thus, the temperature of the single crystal semiconductor substrate can be prevented from exceeding 400° C. and irradiation with electromagnetic waves can be completed in a short time, five minutes or shorter. In addition, a glass substrate hardly absorbs electromagnetic waves in this frequency band. Accordingly, even without any intentional control of temperature of a glass substrate, such as cooling, a glass substrate is not heated in electromagnetic wave irradiation treatment to a temperature at which shrinkage occurs. Thus, shrinkage of a glass substrate can be suppressed. Accordingly, even when the step of bonding a single crystal semiconductor substrate (substrate fixing treatment) and the step of dividing a single crystal semiconductor substrate (electromagnetic wave irradiation treatment) are repeated, a plurality of single crystal semiconductor layers can be bonded to a glass substrate with high accuracy.

Electromagnetic waves used for the electromagnetic wave irradiation treatment have a wavelength of 1 mm to 1 m and are in any of ultra high frequency (UHF), super high frequency (SHF), and extremely high frequency (EHF) bands. The frequency of each band is as follows.

UHF: 300 MHz to 3 GHz
SHF: 3 GHz to 30 GHz
EHF: 30 GHz to 300 GHz

A semiconductor substrate of the present invention is manufactured by fixture of a required number of single crystal semiconductor layers to a base substrate. Furthermore, in this embodiment mode, laser irradiation treatment is performed (Step S6) to irradiate the plurality of single crystal semiconductor layers of the semiconductor substrate with laser light. The laser irradiation treatment is treatment for recovering crystallinity of the single crystal semiconductor layers that are bonded to the base substrate. By being irradiated with laser light, the single crystal semiconductor layers are melted and recrystallized. The laser irradiation treatment is also treatment for melting the single crystal semiconductor layers to planarize their surfaces.

In this embodiment mode, polishing treatment such as mechanical polishing or chemical mechanical polishing can be performed as planarization treatment for the single crystal semiconductor layers. In addition, heat treatment in which the single crystal semiconductor layers are heated by radiation or heat conduction can be performed as crystallinity recovery treatment for the single crystal semiconductor layers. For this heat treatment, a diffusion furnace, a heating furnace such as a resistance heating furnace, a rapid thermal annealing (RTA) apparatus, or the like can be used.

Through Steps S1 to S6, a semiconductor substrate in which a plurality of single crystal semiconductor layers with favorable crystallinity and planarity is fixed to a base substrate can be manufactured. Each step of FIG. 2 is specifically described below. In this embodiment mode, a method for manufacturing a semiconductor substrate which has a stacked-layer structure similar to that of the semiconductor substrate 11 of FIG. 1A is described as an example of a method for manufacturing a semiconductor substrate.

Figure 3A:
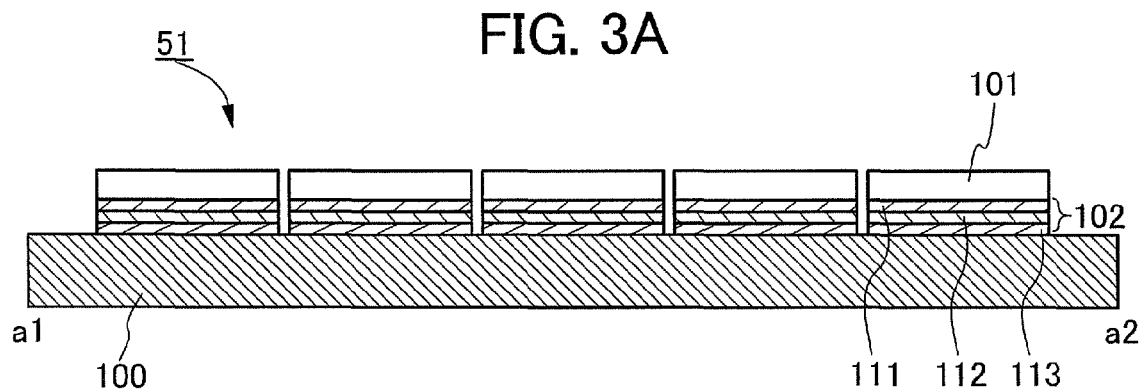
FIGS. 3A and 3B are a cross-sectional view of a semiconductor substrate and a plan view thereof, respectively.
Figure 3B:
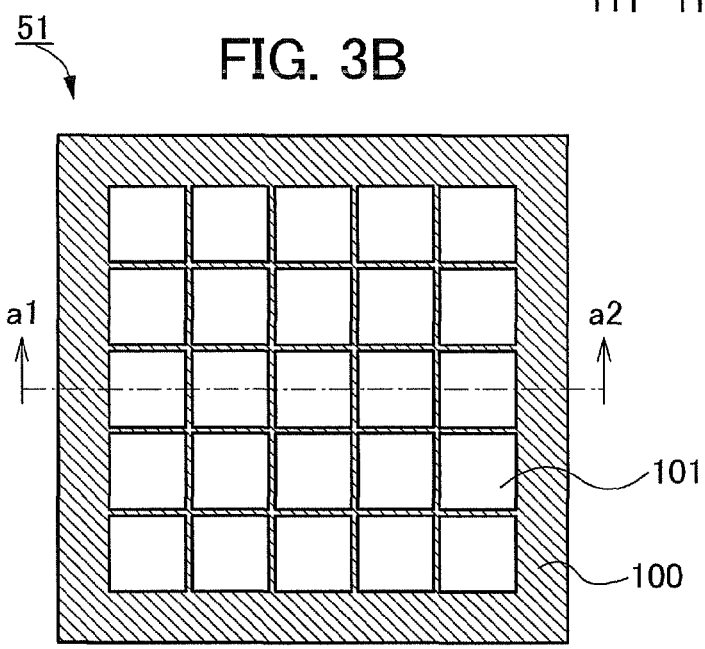

FIG. 3A is a cross-sectional view of a semiconductor substrate 51 which is manufactured by a method of this embodiment mode and FIG. 3B is a plan view thereof. FIG. 3A is a cross-sectional view taken along a section line a1-a2 of FIG. 3B.

In the semiconductor substrate 51, as in the semiconductor substrate 11, a plurality of single crystal semiconductor layers 101 is each provided over a base substrate 100 with a buffer layer 102 interposed therebetween. In the semiconductor substrate 51, each of the single crystal semiconductor layers 101 is fixed to the base substrate 100 by bonding between the base substrate 100 and the buffer layer 102. The buffer layer 102 is an insulating layer having a three-layer structure of insulating layers 111 to 113. The plurality of single crystal semiconductor layers 101 is arranged in a matrix of five rows and five columns.

A method for manufacturing the semiconductor substrate 51 is hereinafter described with reference to FIG. 4, FIGS. 5A to 5E, FIGS. 6A to 6E, and FIGS. 7 to 11.

Figure 4:
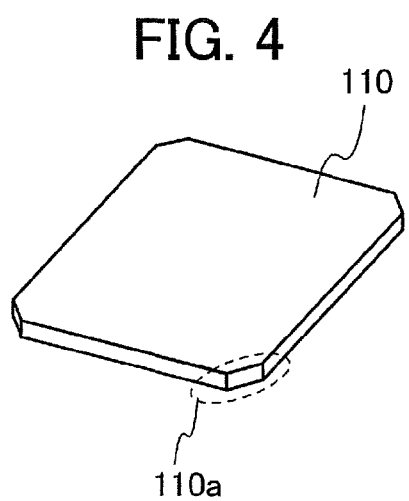
FIG. 4 is a perspective view of a single crystal semiconductor substrate.

A single crystal semiconductor substrate 110 which has been processed into a desired size and shape is prepared. FIG. 4 is a perspective view illustrating an example of a structure of the single crystal semiconductor substrate 110. In consideration of the facts that the single crystal semiconductor substrate 110 is bonded to the base substrate 100 having a rectangular shape, that a light exposure region of a light exposure apparatus such as a stepper is rectangular, and the like, it is preferable that the single crystal semiconductor substrate 110 have a rectangular shape as illustrated in FIG. 4. Note that, in this specification, a rectangle also includes a square and an oblong unless otherwise specified. In this embodiment mode, corners 110a of the single crystal semiconductor substrate 110 having a rectangular shape are chamfered. This is intended to bond two adjacent single crystal semiconductor layers 101 to the base substrate 100 in such a way that the distance between the two adjacent single crystal semiconductor layers 101 is made as short as possible.

Needless to say, the shape of the single crystal semiconductor substrate 110 is not limited to that illustrated in FIG. 4 and the single crystal semiconductor substrate 110 may have a variety of shapes. For example, the shape may be a polygonal shape such as a tetragon, a pentagon, or a hexagon, a circular shape, or any given shape. It is natural that a commercially available circular single crystal semiconductor wafer can also be used as the single crystal semiconductor substrate 110. Note that a circular wafer may be provided with an orientation flat.

Examples of circular single crystal semiconductor wafers include semiconductor wafers of silicon, germanium, and the like and compound semiconductor wafers of gallium arsenide, indium phosphide, and the like. Typical known examples of single crystal semiconductor wafers are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter.

The single crystal semiconductor substrate 110 having a rectangular shape can be formed by cutting of a circular single crystal semiconductor wafer. To cut the wafer, a cutting apparatus such as a dicer or a wire saw may be used. Alternatively, a single crystal semiconductor wafer can be cut by being irradiated with laser light, plasma, or a high-energy beam such as an electron beam. Alternatively, the single crystal semiconductor substrate 110 having a rectangular shape can be formed as follows: an ingot used for manufacture of semiconductor substrates is processed into a rectangular solid so that it has a rectangular cross section before being sliced into substrates and then this ingot that is a rectangular solid is sliced.

A plurality of single crystal semiconductor substrates 110 is bonded in the substrate fixing treatment, and their plane orientations may be the same or different from each other. For example, in the case where a single crystal semiconductor substrate having a diamond structure as a crystal structure, such as a single crystal silicon substrate, is used as the single crystal semiconductor substrate 110, the plane orientation of its main surface may be (100), (110), or (111). In addition, the plurality of single crystal semiconductor substrates 110 bonded to the base substrate 100 may have either the same or different electric characteristics such as conductivity type (n type, i type, or p type) or resistance.

Next, a method for providing the single crystal semiconductor substrate 110 with the buffer layer 102 and a damaged region is described with reference to FIGS. 5A to 5E.

First, the single crystal semiconductor substrate 110 is washed and cleaned. Next, a stacked film of the insulating layer 111 and the insulating layer 112 is formed over the single crystal semiconductor substrate 110 (see FIG. 5A). Here, the insulating layer 112 is formed as a barrier layer. Examples of combinations of the insulating layer 111 and the insulating layer 112 are as follows: a silicon oxide film and a silicon nitride film; a silicon oxynitride film and a silicon nitride film; a silicon oxide film and a silicon nitride oxide film; a silicon oxynitride film and a silicon nitride oxide film; and the like.

A silicon oxynitride film can be formed using $SiH_4$ and $N_2O$ as a process gas by a PECVD method. A silicon oxide film can be formed using an organosilane gas and oxygen as a process gas by a PECVD method. When the single crystal semiconductor substrate 110 is a single crystal silicon substrate, a silicon oxide film can be formed by oxidation of the single crystal semiconductor substrate. A silicon nitride oxide film can be formed using $SiH_4$, $N_2O$, $NH_3$, and $H_2$ as a process gas by a PECVD method. A silicon nitride film can be formed using $SiH_4$, $N_2$, $NH_3$, and $H_2$ as a process gas by a PECVD method.

Note that organosilane refers to compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

For example, to form the insulating layer 111 using silicon oxynitride and the insulating layer 112 using silicon nitride oxide by a PECVD method, first, the single crystal semiconductor substrate 110 is carried into a chamber of a PECVD apparatus. Then, $SiH_4$ and $N_2O$ are supplied to the chamber as a process gas for formation of the insulating layer 111, and plasma of this process gas is generated, whereby a silicon oxynitride film is formed over the single crystal semiconductor substrate 110. Next, the gas introduced into the chamber is changed to a process gas for formation of the insulating layer 112. Here, $SiH_4$, $N_2O$, $NH_3$, and $H_2$ are used. Plasma of a mixed gas of these is generated, and a silicon nitride oxide film is successively formed over the silicon oxynitride film. In the case where a PECVD apparatus having a plurality of chambers is used, the silicon oxynitride film and the silicon nitride oxide film can be formed in different chambers. Needless to say, by change of gases introduced into the chamber, a silicon oxide film can be formed as the insulating layer 111 and a silicon nitride film can be formed as the insulating layer 112.

When the insulating layer 111 and the insulating layer 112 are successively formed as described above, throughput can be improved. In addition, because the insulating layer 111 and the insulating layer 112 can be formed without being exposed to the atmosphere, the interface between the insulating layer 111 and the insulating layer 112 can be prevented from being contaminated by the atmosphere.

Alternatively, as the insulating layer 111, an oxide film can be formed by oxidation treatment of the single crystal semiconductor substrate 110. As this oxidation treatment, there are thermal oxidation treatment, plasma treatment with plasma including oxygen radicals (O radicals) or hydroxide radicals (OH radicals), oxidation treatment with ozone-containing water ($O_3$ water), and the like.

Thermal oxidation treatment may be dry oxidation, and it is preferable to add a halogen-containing gas to an oxidizing atmosphere. By oxidation of the single crystal semiconductor substrate 110 in a halogen-containing atmosphere, a halogen-containing oxide film can be formed as the insulating layer 111. As a halogen-containing gas, a kind or plural kinds of gases selected from HCl, HF, $NF_3$, HBr, $Cl_2$, $ClF_3$, $BCl_3$, $F_2$, $Br_2$, and the like can be used. For example, thermal oxidation may be performed at a heating temperature of 900° C. to 1100° C. in an atmosphere containing HCl at 0.5 volume % to 10 volume % (for example, 3 volume %) with respect to oxygen. Treatment time may be 0.1 to 6 hours, preferably, 0.5 to 1 hour. The thickness of the oxide film to be formed can be set to 10 nm to 1000 nm (preferably, 50 nm to 200 nm); for example, an oxide film with a thickness of 100 nm can be formed as the insulating layer 111 by thermal oxidation treatment.

Figure 5A:
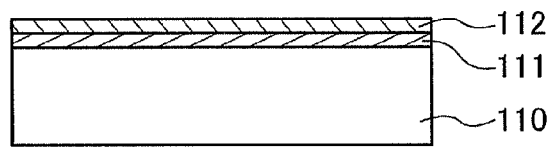
FIGS. 5A to 5D are cross-sectional views illustrating a method for forming a buffer layer and a damaged region in a single crystal semiconductor substrate and FIG. 5E is a plan view thereof.
Figure 5B:
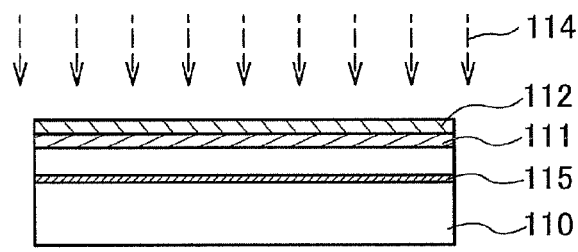

Next, the single crystal semiconductor substrate 110 is irradiated with ions 114, whereby a damaged region 115 whose crystal structure is damaged is formed in the single crystal semiconductor substrate 110 at a predetermined depth (see FIG. 5B).

The ions 114 are generated by excitation of a source gas into plasma. The ions 114 included in the plasma of the source gas are extracted from the plasma by the action of an electric field and then accelerated, and the single crystal semiconductor substrate 110 is irradiated with the ions 114. As the source gas, a hydrogen gas, a halogen gas, a helium gas, or the like can be used.

Ions can be introduced into the single crystal semiconductor substrate 110 by use of an ion implantation apparatus or an ion doping apparatus. An ion implantation apparatus has a mass separator for extracting ions having a specific mass from plasma, with which only the ions 114 having a specific mass can be added to the single crystal semiconductor substrate 110. There are two types of ion doping apparatuses: those which have a mass separator, and those which do not. With an ion doping apparatus which does not have a mass separator, all ion species in plasma are accelerated, with which an object is irradiated.

Main components of an ion doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting a source gas to discharge the source gas, and the like. As the electrode for discharging a source gas, a filament electrode, a high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes that are included in the acceleration mechanism are provided with a number of openings or slits, through which ions that are generated with the ion source are accelerated. Note that the components of the ion doping apparatus are not limited to the above-mentioned components, and an as-needed mechanism can be provided.

The depth of a region where the damaged region 115 is formed in the single crystal semiconductor substrate 110 can be adjusted by the acceleration energy of the ions 114 and the incident angle of the ions 114. The acceleration energy can be adjusted by acceleration voltage, dose, or the like. The damaged region 115 is formed in a region at the same or substantially the same depth as the average penetration depth of the ions 114. Thus, the thickness of a single crystal semiconductor layer 117 (see FIG. 6B) separated from the single crystal semiconductor substrate 110 can be controlled by adjustment of the depth to which the ions 114 penetrate the single crystal semiconductor substrate 110.

In this embodiment mode, the ions 114 are added to the single crystal semiconductor substrate 110 with an ion doping apparatus. In addition, a hydrogen gas ($H_2$ gas) is used as a source gas for generating the ions 114. With an ion doping apparatus, plasma is generated by excitation of a hydrogen gas; ions included in plasma are accelerated without mass separation; and the single crystal semiconductor substrate 110 is irradiated with the ions 114 that are accelerated. Thus, the single crystal semiconductor substrate 110 is irradiated with $H^+$, $H_2^+$, and $H_3^+$ as the ions 114.

In an ion doping apparatus, the percentage of $H_3^+$ to the total amount of ion species ($H^+$, $H_2^+$, and $H_3^+$) that are generated from a hydrogen gas is preferably set to be 50% or higher. More preferably, the percentage of $H_3^+$ is set to be 80% or higher. In the case of using an ion doping apparatus which does not have a mass separating function, the percentage of one kind of ion species to plural kinds of ion species that are generated in plasma is preferably 50% or higher, more preferably, 80% or higher. This is because ions can be added in a concentrated manner to the same depth in the single crystal semiconductor substrate 110 by irradiation with ions having the same mass.

In order to form the damaged region 115 in a shallow region, the acceleration voltage for the ions 114 needs to be low. By an increase in the percentage of $H_3^+$ ions in plasma, atomic hydrogen (H) can be added to a shallow region in the single crystal semiconductor substrate 110 with high efficiency. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the cycle time for ion irradiation treatment can be shortened, and productivity and throughput can be improved.

The step of adding the ions 114 to the single crystal semiconductor substrate 110 can also be performed with an ion implantation apparatus. In the case of using an ion implantation apparatus, $H^+$ ions and $H_2^+$ ions that are generated by excitation of a hydrogen gas are subjected to mass separation, and either $H^+$ ions or $H_2^+$ ions are accelerated, with which the single crystal semiconductor substrate 110 is irradiated.

In the case of adding hydrogen ions, it is preferable that the damaged region 115 contain hydrogen (H) at $1 \times 10^{21}$ atoms/$cm^3$ or more. This is intended to destroy a crystal lattice and make the damaged region 115 have a brittle, porous structure by local addition of hydrogen at high concentration to the single crystal semiconductor substrate 110. The hydrogen concentration in the damaged region 115 can be controlled by the dose, acceleration voltage, or the like of the ions 114.

Figure 5C:
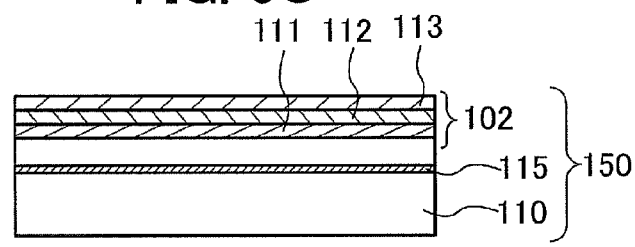

After the damaged region 115 is formed, the insulating layer 113 is formed over an upper surface of the insulating layer 112 as illustrated in FIG. 5C. In this step, the buffer layer 102 having a three-layer structure of the insulating layers 111 to 113 is formed. Here, the single crystal semiconductor substrate 110 provided with the buffer layer 102 and the damaged region 115 is referred to as a "donor substrate 150."

The insulating layer 113 is a bonding layer which is bonded to the base substrate 100. In order to form a smooth hydrophilic bonding surface over the single crystal semiconductor substrate 110 with the insulating layer 113, the insulating layer 113 preferably has an average roughness $R_a$ of 0.7 nm or less, more preferably, 0.4 nm or less. In addition, the insulating layer 113 can have a thickness of 10 nm to 200 nm. The insulating layer 113 preferably has a thickness of 5 nm to 500 nm, more preferably, 10 nm to 200 nm.

For example, a silicon oxide film, a silicon oxynitride film, a silicon nitride oxide film, a silicon nitride film, or the like can be formed as the insulating layer 113. These insulating films formed by a CVD method can be formed in a manner similar to insulating films that are used to form the insulating layers 111 and 112. Note that, in the step of forming the insulating layer 113, the heating temperature for the single crystal semiconductor substrate 110 is 350° C. or lower. This is intended to prevent the ions that are added to form the damaged region 115 from being changed into a gas and being released from the damaged region 115.

For example, in order to form the insulating layer 113 with a silicon oxide film by a PECVD method using TEOS and $O_2$ as a source gas, TEOS is introduced into a chamber at a flow rate of 15 sccm and $O_2$ is introduced at a flow rate of 750 sccm. Then, a silicon oxide film is formed by discharge of the source gas under conditions where the deposition pressure is 100 Pa, the deposition temperature is 300° C., the RF output is 300 W, and the power frequency is 13.56 MHz.

Figure 5D:
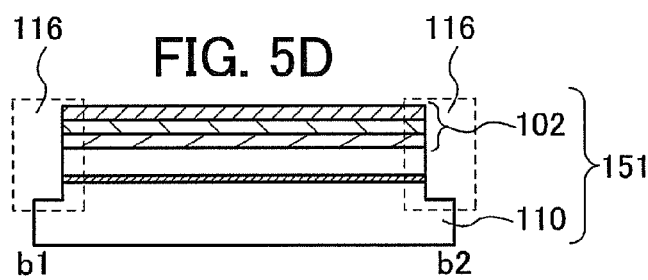
Figure 5E:
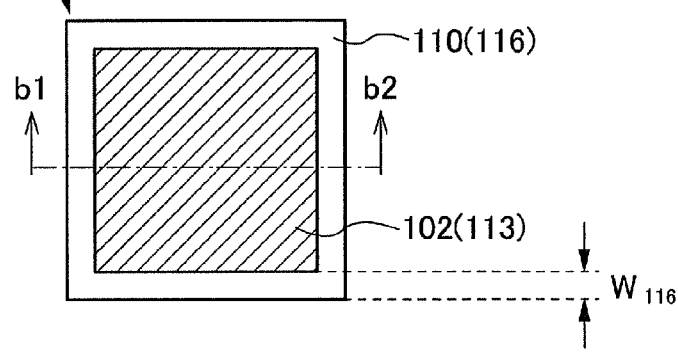

Next, the peripheral portion of the donor substrate 150 is partly removed to form a cut portion 116. The donor substrate 150 provided with the cut portion 116 is referred to as a "donor substrate 151." FIG. 5D is a cross-sectional view of the donor substrate 151 and FIG. 5E is a plan view thereof. FIG. 5D is a cross-sectional view taken along a section line b1-b2 of FIG. 5E.

The cut portion 116 is formed in order to make the distance between adjacent single crystal semiconductor layers 101 as short as possible in the semiconductor substrate 51. The width $W_{116}$ of the cut portion 116 can be, for example, 1 mm to 30 mm. In addition, the cut portion 116 is formed deeper than the damaged region 115 so that a layer which is separated from the single crystal semiconductor substrate 110 by division of the single crystal semiconductor substrate 110 along the damaged region 115 may remain over the base substrate 100. The cut portion 116 can be formed using etching treatment, laser processing treatment in which an object is sublimated by being irradiated with laser light, or the like.

Hereinafter, the substrate fixing treatment and the electromagnetic wave irradiation treatment are described with reference to FIGS. 6A to 6E and FIGS. 8 to 11. In this embodiment mode, the substrate fixing treatment and the electromagnetic wave irradiation treatment are each performed twice, whereby 25 single crystal semiconductor layers are fixed to the base substrate 100 in a matrix of five rows and five columns.

Figure 6A:
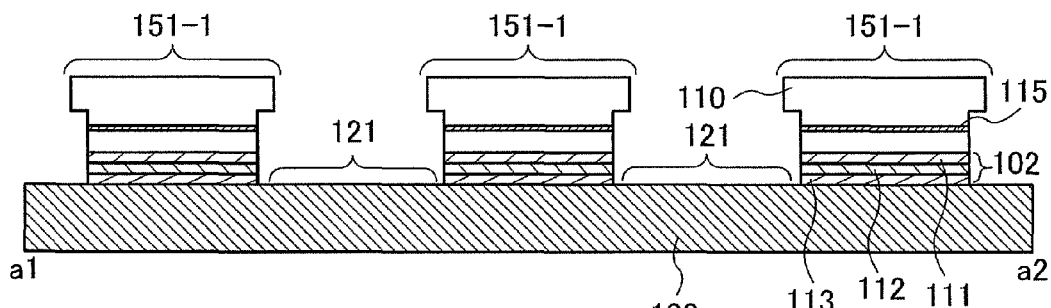
FIGS. 6A to 6E are cross-sectional views illustrating substrate fixing treatments and electromagnetic wave irradiation treatments (FIG. 6A is a cross-sectional view taken along a section line a1-a2 of FIG. 8.
Figure 8:
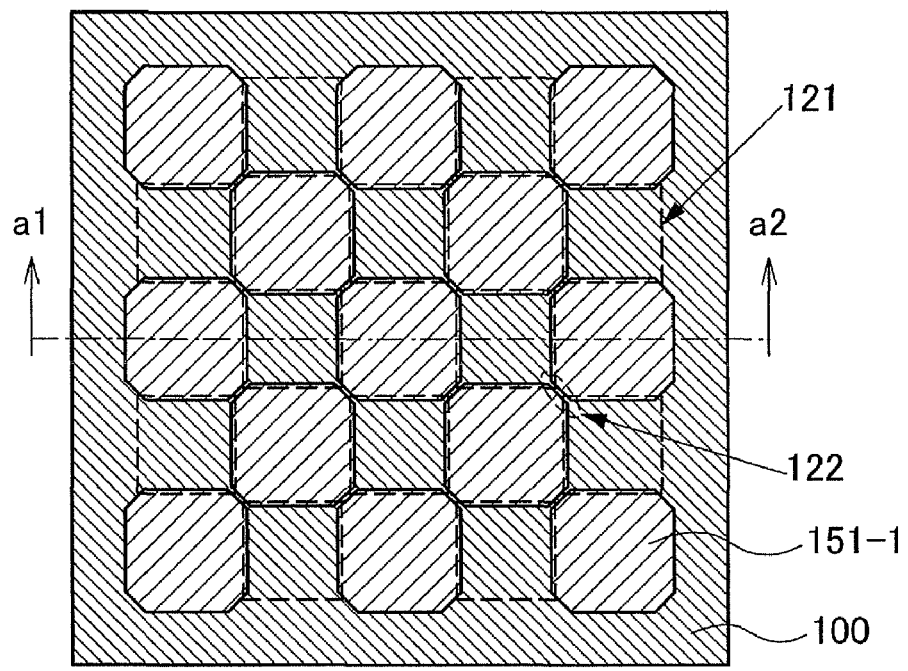
FIG. 8 is a plan view illustrating the first substrate fixing treatment.

FIG. 6A is a cross-sectional view illustrating the first substrate fixing treatment. FIG. 8 is a plan view thereof. FIG. 6A is a cross-sectional view taken along a section line a1-a2 of FIG. 8. Note that, for convenience of explanation, the donor substrates 151 which are fixed to the base substrate 100 through the first substrate fixing treatment are denoted by reference numeral "151-1," and the donor substrates 151 which are fixed through the second substrate fixing treatment are denoted by reference numeral "151-2."

As illustrated in FIG. 6A, surfaces of the donor substrates 151-1 (surfaces of the buffer layers 102) are disposed in contact with a surface of the base substrate 100. As bonding force for bonding between the surface of the base substrate 100 and the surfaces of the buffer layers 102, van der Waals force acts at the initial stage of bonding. When pressure is applied to the surfaces of the buffer layers 102 and the surface of the base substrate 100, covalent bond is formed between portions of the surfaces that are in contact with each other, and bond with stronger bonding force is formed.

For example, when pressure is applied to a part of the donor substrate 151-1 from the single crystal semiconductor substrate 110 side, the buffer layer 102 and the base substrate 100 start to bond to each other from the pressurized part, and the bonding portion is extended to the entire buffer layer 102. As a result, the donor substrate 151-1 is fixed to the base substrate 100. This substrate fixing treatment step can be performed at normal temperature (room temperature) without any heat treatment; therefore, a substrate having low heat resistance and having an allowable temperature limit of 700° C. or lower, such as a glass substrate, can be used as the base substrate 100.

In the first substrate fixing treatment, as illustrated in FIG. 8, 13 donor substrates 151-1 are arranged in such a way that they are not located next to each other in the same row and column. This is intended to leave spaces where the donor substrates 151-2 can be fixed in the second or later substrate fixing treatment next to the donor substrates 151-1. Regions 121 indicated by dotted lines are regions to which the donor substrates 151-2 are fixed in the second substrate fixing treatment. In this embodiment mode, 25 single crystal semiconductor layers are fixed to the base substrate 100 through the substrate fixing treatment and the electromagnetic wave irradiation treatment which are each performed twice; thus, the donor substrates 151-1 are arranged in a staggered manner from row to row.

Because the corners of each single crystal semiconductor substrate 110 are chamfered (see FIG. 4), corners of two donor substrates 151-1 can be disposed close to each other in a portion 122 (a portion 122 surrounded by a dotted line) in which the corners of the two donor substrates 151-1 are located next to each other. This allows the distance between adjacent single crystal semiconductor layers 101 to be small in the semiconductor substrate 51.

Figure 6B:
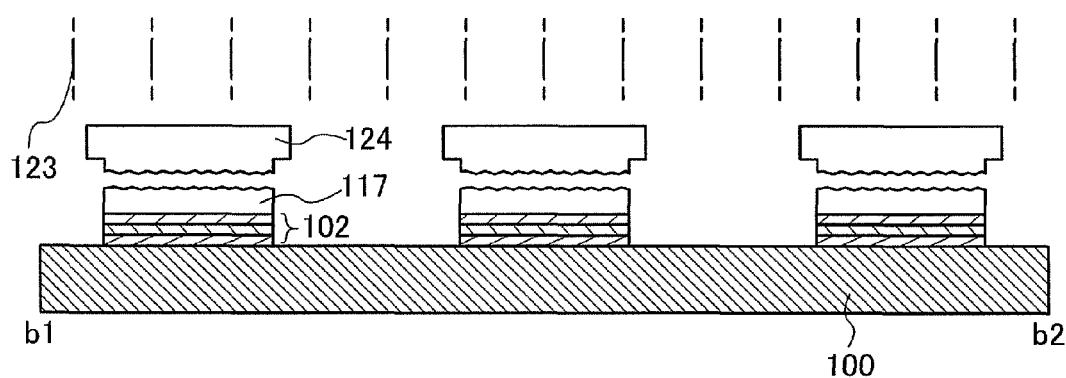
Figure 9:
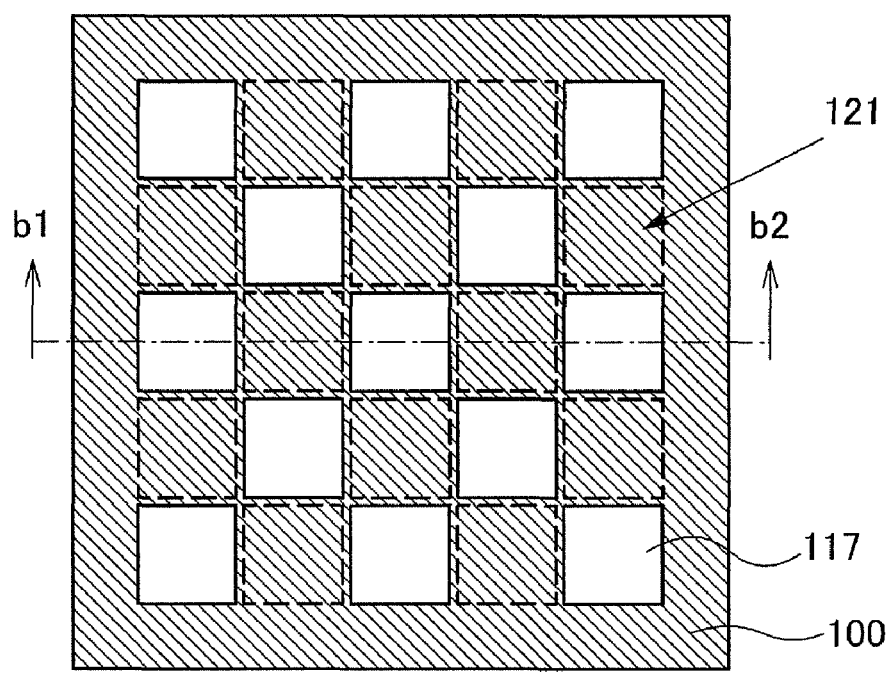
FIG. 9 is a plan view illustrating the first electromagnetic wave irradiation treatment.

Next, the first electromagnetic wave irradiation treatment is performed. This treatment is treatment for dividing the donor substrates 151-1 along the damaged regions 115. FIG. 6B is a cross-sectional view illustrating the first electromagnetic wave irradiation treatment and FIG. 9 is a plan view thereof. FIG. 6B is a cross-sectional view taken along a section line b1-b2 of FIG. 9.

As illustrated in FIG. 6B, when the donor substrates 151-1 are irradiated with electromagnetic waves 123 having a frequency of 300 MHz to 300 GHz, the single crystal semiconductor substrates 110 generate heat by the action of the electric field of the electromagnetic waves 123. Due to increase in temperature of the single crystal semiconductor substrates 110, the element or molecules added in formation of the damaged regions 115 cohere in microvoids that are formed in the damaged regions 115, whereby internal pressure increases. Due to increase in pressure, change occurs in the volume of the microvoids in the damaged regions 115 to generate cracks in the damaged regions 115. As a result, the single crystal semiconductor substrates 110 are cleaved along the damaged regions 115. Because the buffer layers 102 are bonded to the base substrate 100, single crystal semiconductor layers 117 which are separated from the donor substrates 151-1 (the single crystal semiconductor substrates 110) are fixed onto the base substrate 100. Note that single crystal semiconductor substrates 124 correspond to the single crystal semiconductor substrates 110 from which the single crystal semiconductor layers 117 have been separated.

This electromagnetic wave irradiation treatment can be performed using a microwave heating apparatus or a millimeter wave heating apparatus. A microwave heating apparatus is an apparatus which heats an object by microwave radiation, and a millimeter wave heating apparatus is an apparatus which heats an object by millimeter wave radiation. Irradiation with the electromagnetic waves 123 is performed in a short time, five minutes or shorter, and can be performed in the range of one minute to three minutes.

Figure 6C:
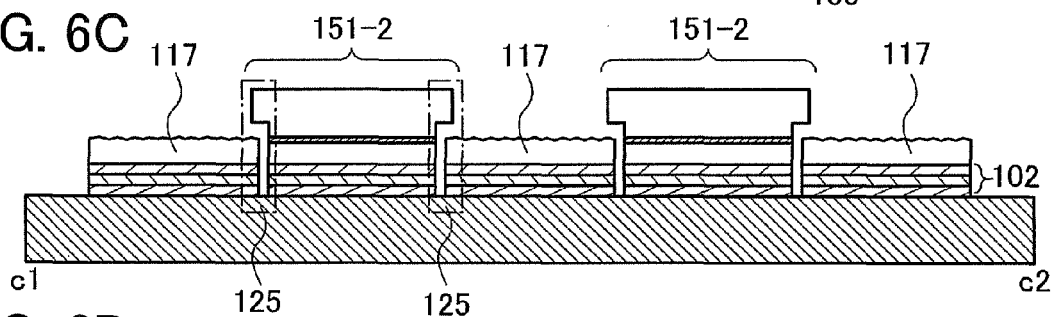
Figure 10:
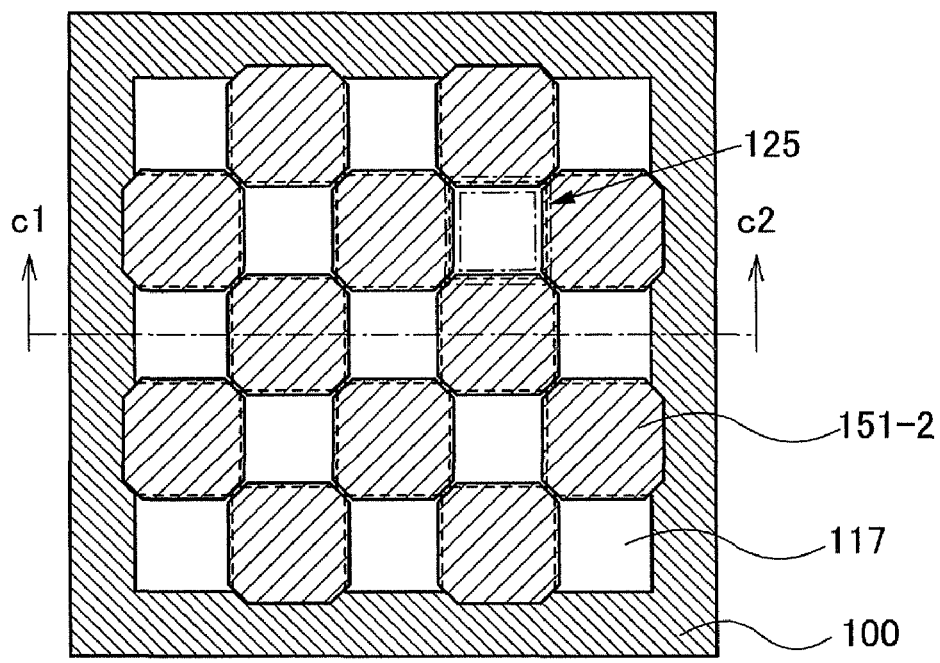
FIG. 10 is a plan view illustrating the second substrate fixing treatment.

After the first electromagnetic wave irradiation treatment is completed, the second substrate fixing treatment is performed. FIG. 6C is a cross-sectional view illustrating the second substrate fixing treatment. FIG. 10 is a plan view thereof. FIG. 6C is a cross-sectional view taken along a section line c1-c2 of FIG. 10. In the second substrate fixing treatment, the donor substrates 151-2 are fixed to the regions 121 of the base substrate 100. The second substrate fixing treatment is performed in a manner similar to the first substrate fixing treatment, whereby surfaces of the donor substrates 151-2 (surfaces of the buffer layers 102) and the surface of the base substrate 100 are bonded to each other.

As illustrated in portions 125 surrounded by dot-and-dash lines, the cut portions 116 are formed in the donor substrates 151-2. Accordingly, the donor substrates 151-2 can be fixed to the base substrate 100 in such a way that the peripheries of the donor substrates 151-2 overlap the single crystal semiconductor layers 117. As a result, single crystal semiconductor layers 117 that are separated from the donor substrates 151-2 can be located close to the single crystal semiconductor layers 117 that are separated from the donor substrates 151-1.

Note that, instead of the donor substrates 151-1, the donor substrates 150 which are not provided with the cut portions 116 may be used for the first substrate fixing treatment. In the second or later substrate fixing treatment, the donor substrates 151 each provided with the cut portion 116 are preferably used. The reason is that the distance between two single crystal semiconductor layers 117 can be made shorter by use of the donor substrates 151 provided with the cut portions 116 because there are cases where the donor substrates 151 are fixed next to the single crystal semiconductor layers 117 in the second or later substrate fixing treatment.

Figure 6D:
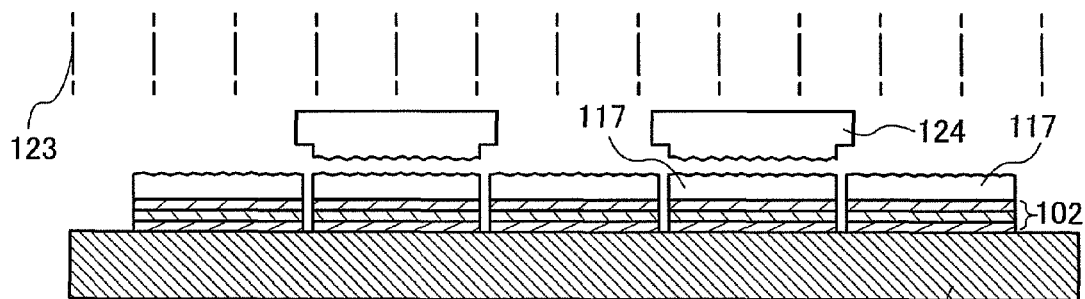

After the second substrate fixing treatment is completed, the second electromagnetic wave irradiation treatment is performed. FIG. 6D is a cross-sectional view illustrating the second electromagnetic wave irradiation treatment. The second electromagnetic wave irradiation treatment is performed in a manner similar to the first electromagnetic wave irradiation treatment, whereby the donor substrates 151-2 are irradiated with the electromagnetic waves 123 and the single crystal semiconductor substrates 110 are divided along the damaged regions 115.

Figure 6E:
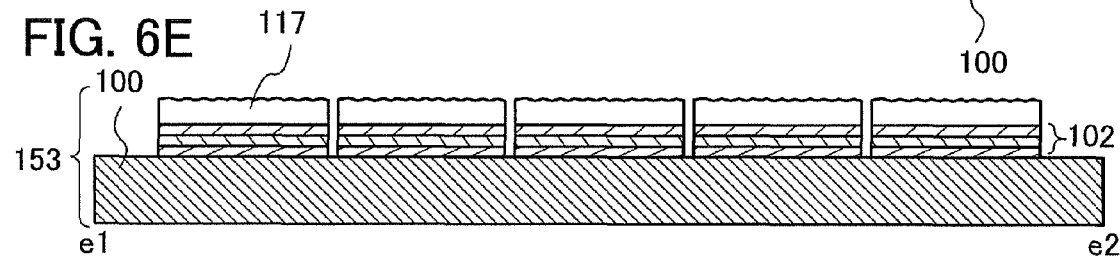
Figure 11:
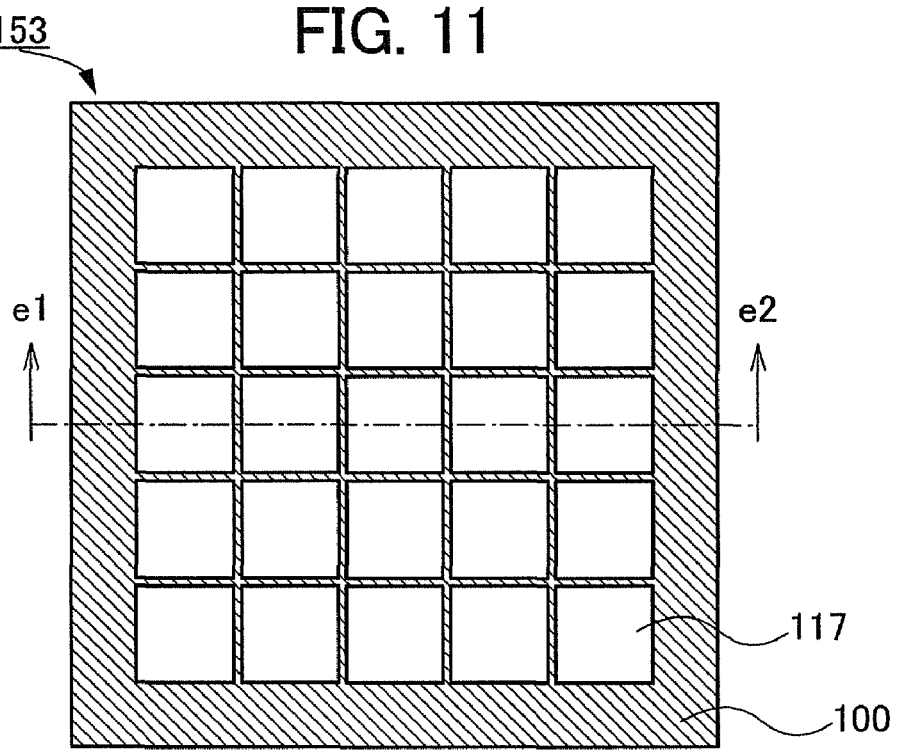
FIG. 11 is a plan view illustrating the second electromagnetic wave irradiation treatment.

By the substrate fixing treatment and the electromagnetic wave irradiation treatment repeated twice, a semiconductor substrate 153 is formed as illustrated in FIGS. 6E and 11, in which 25 single crystal semiconductor layers 117 are fixed in a matrix of five rows and five columns to the base substrate 100 with the buffer layers 102 interposed therebetween. FIG. 11 is a plan view of the semiconductor substrate 153. FIG. 6E is a cross-sectional view taken along a section line e1-e2 of FIG. 11.

Figure 7:
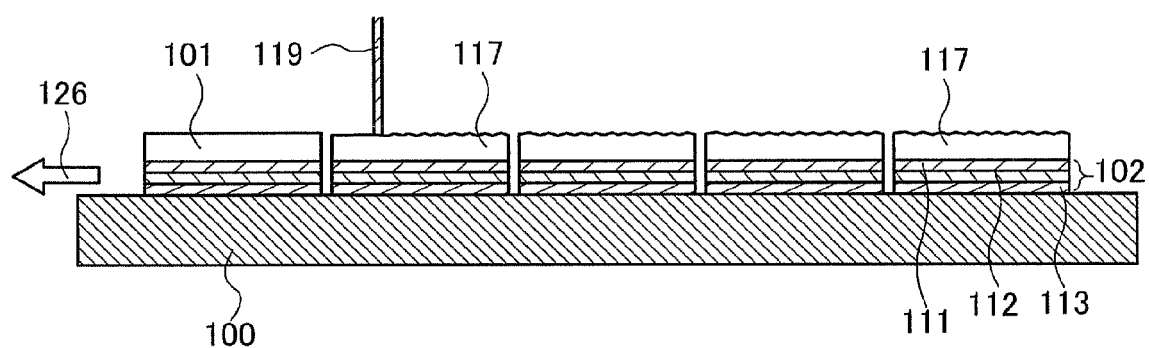
FIG. 7 is a cross-sectional view illustrating laser irradiation treatment.

In this embodiment mode, next, laser irradiation treatment is performed to irradiate the single crystal semiconductor layers 117 of the semiconductor substrate 153 with laser light. FIG. 7 is a cross-sectional view illustrating the laser irradiation treatment.

Through treatment such as formation of the damaged region 115 or division of the donor substrate 151, the crystallinity of the single crystal semiconductor layers 117 is lowered as compared to the original crystallinity of the single crystal semiconductor substrates 110. For example, crystal defects such as dislocation or crystal microdefects such as dangling bonds which have not been seen in the single crystal semiconductor substrates 110 before processing are produced in the single crystal semiconductor layers 117. In addition, the surfaces of the single crystal semiconductor layers 117 are separation faces from the single crystal semiconductor substrates 110 and thus planarity thereof is also lowered. Thus, in this embodiment mode, in order to recover the crystallinity of the single crystal semiconductor layers 117, the single crystal semiconductor layers 117 are melted and recrystallized. For this recrystallization, the single crystal semiconductor layers 117 are irradiated with laser light. In addition, in order to planarize the surfaces of the single crystal semiconductor layers 117, the single crystal semiconductor layers 117 are melted by being irradiated with laser light.

As illustrated in FIG. 7, the single crystal semiconductor layers 117 are scanned with laser light 119 such that the entire separation faces of the single crystal semiconductor layers 117 are irradiated with the laser light 119. The scanning with the laser light 119 is conducted, for example, by moving the base substrate 100 to which the single crystal semiconductor layers 117 are fixed, instead of moving the laser light 119. An arrow 126 indicates the moving direction of the base substrate 100.

When irradiated with the laser light 119, the single crystal semiconductor layer 117 absorbs the laser light 119, and the temperature of a portion irradiated with the laser light 119 is increased. When the temperature of this portion becomes equal to or higher than its melting point, the portion melts. After the irradiation with the laser light 119 is stopped, the temperature of the melted portion of the single crystal semiconductor layer 117 drops, and the melted portion is solidified and recrystallized with time. By scanning with the laser light 119, the entire surface of the single crystal semiconductor layer 117 is irradiated with the laser light 119, whereby a single crystal semiconductor layer 101 which has undergone re-single-crystallization can be formed.

By irradiation with the laser light 119, the crystallinity of the single crystal semiconductor layer 101 becomes higher than that of the single crystal semiconductor layer 117. This is because dangling bonds in the single crystal semiconductor layer 117, microdefects such as defects at the interface between the single crystal semiconductor layer 117 and the buffer layer, and the like can be repaired by melting of the single crystal semiconductor layer 117. Note that the crystallinity of each of the single crystal semiconductor layers 101 and 117 can be evaluated by measurement of an electron backscatter diffraction pattern (electron backscatter pattern (EBSP)), measurement of an X-ray diffraction pattern, observation using an optical microscope or an electron microscope, measurement of a Raman spectroscopy spectrum, or the like.

By irradiation with the laser light 119, a region irradiated with the laser light 119 in the single crystal semiconductor layer 117 is partially or completely melted. Note that a completely melted state of the single crystal semiconductor layer 117 means that the entire layer from its upper surface to lower surface is melted. In the semiconductor substrate 153, a completely melted state means that the single crystal semiconductor layer 117 is melted into a liquid state from its upper surface to the interface with the buffer layer 102. On the other hand, to partially melt the single crystal semiconductor layer 117 means melting the single crystal semiconductor layer 117 such that the depth of a melted portion is shallower than that of the interface with the buffer layer 102 (the thickness of the single crystal semiconductor layer 117). In other words, a partially melted state of the single crystal semiconductor layer 117 means a state in which the upper portion is melted into a liquid phase and the lower portion is not melted and remains as a solid-phase single crystal semiconductor.

A melted portion in the single crystal semiconductor layer 117 by irradiation with the laser light 119 is recrystallized by being solidified, and a single crystal semiconductor which has the same crystal orientation as a single crystal semiconductor which remains in a solid phase is formed in this portion. Therefore, in the case where a single crystal silicon wafer whose main surface is oriented along the (100) plane is used as the single crystal semiconductor substrate 110, a main surface of the single crystal semiconductor layer 117 is oriented along the (100) plane, and a main surface of the single crystal semiconductor layer 101 which is melted by the laser irradiation treatment and is recrystallized is oriented along the (100) plane.

By partial melting or complete melting of the single crystal semiconductor layer 117 through irradiation with the laser light 119, the single crystal semiconductor layer 101 having a flat surface can be formed. This is because a melted portion of the single crystal semiconductor layer 117 is liquid and thus changes its shape by the action of surface tension so as to minimize its surface area. That is, a liquid portion changes its shape so as to have no depressed and protruding portions, and this liquid portion is then solidified and recrystallized. Accordingly, the single crystal semiconductor layer 101 having a planarized surface can be formed. By planarization of the surface of the single crystal semiconductor layer 101, the thickness of a gate insulating film which is formed over the single crystal semiconductor layer 101 can be made small, approximately 5 nm to 50 nm. Accordingly, a transistor having low gate voltage and high on current can be formed.

When irradiated with the laser light 119, the single crystal semiconductor layer 117 may be at a room temperature without being heated, or the single crystal semiconductor layer 117 may be heated. The heating temperature can be a temperature equal to or lower than a strain point of the base substrate 100 and in the range of 200° C. to 650° C. By heating of the single crystal semiconductor layer 117 at the time of irradiation with the laser light 119, the energy of the laser light 119 needed to melt the single crystal semiconductor layer 117 can be reduced. If the energy is reduced, the width of the beam shape of the laser light 119 (the length in a scanning direction) can be increased. Accordingly, scanning speed can be increased and cycle time for processing of one semiconductor substrate 153 can be shortened.

Lasers can be classified into pulsed lasers, continuous wave lasers, and quasi-continuous wave lasers according to their emission modes. It is recommended to use a pulsed laser to melt the single crystal semiconductor layer 117 for re-single-crystallization. When a pulsed laser is used, a region which is irradiated with one pulse (one shot) of laser light is melted, solidified, and recrystallized by the time it is irradiated with the subsequent pulse. In other words, a region which is melted by being irradiated with one pulse is recrystallized and returns to a solid-phase state by the time it is irradiated with the subsequent pulse. Thus, the most stable state when a region which is melted with laser light emitted from a pulsed laser is solidified is a single crystal structure that is obtained through crystal growth from a single crystal which is not melted.

On the other hand, in the case of using a continuous wave laser, laser light irradiation is constant. Thus, by scanning with laser light, the interface between a melted region (a liquid-phase region) and a solid-phase region is moved in that direction. Therefore, when the melted region is solidified, uniform crystal growth is unlikely to occur; the orientation of crystal axes does not become uniform; and grain boundaries are likely to be generated. The same applies to quasi-continuous wave lasers.

As a pulsed laser, a laser having a repetition rate of less than 10 MHz, preferably, 10 kHz or less can be used. When the repetition rate is less than 10 MHz, a region can be melted and solidified with every shot of laser light before being irradiated with the subsequent shot. In addition, the pulse width of laser light which is emitted from a pulsed laser can be in the range from 10 nsec to 500 nsec.

Examples of the pulsed laser that is used for the laser irradiation treatment include excimer lasers such as a XeCl laser and a KrF laser and gas lasers such as an Ar laser and a Kr laser. Other examples that can be used are solid-state lasers such as a YAG laser, a $YVO_4$ laser, a YLF laser, a $YAlO_3$ laser, a $GdVO_4$ laser, a KGW laser, a KYW laser, and a $Y_2O_3$ laser. As laser light, the fundamental wave, a harmonic (such as a second harmonic, a third harmonic, or a fourth harmonic) of any of these lasers can be used. Some of these solid-state lasers can be either a continuous wave laser or a quasi-continuous wave laser even when using the same laser medium.

As a laser that emits the laser light 119, a laser whose emission wavelength is in the range from the ultraviolet region to the visible light region is selected. The wavelength of the laser light 119 is a wavelength that is absorbed by the single crystal semiconductor layer 117. The wavelength can be determined in consideration of the skin depth of the laser light 119, and the like. For example, the wavelength can be in the range of 250 nm to 1 µm and is preferably in the range of 300 nm to 700 nm.

The energy of the laser light 119 can be determined in consideration of the wavelength of the laser light 119, the skin depth of the laser light 119, the thickness of the single crystal semiconductor layer 117, and the like. When a pulsed laser with a wavelength of 300 nm to 400 nm is used, the energy density of the laser light 119 can be set, for example, in the range of 300 $mJ/cm^2$ to 800 $mJ/cm^2$.

Irradiation with the laser light 119 may be performed either in an air atmosphere without any control or in an inert gas atmosphere. Each of an air atmosphere and an inert gas atmosphere are effective for crystallinity recovery and planarization of the single crystal semiconductor layer 117. An inert gas atmosphere is more preferable than an air atmosphere. The reason is that an inert gas atmosphere such as nitrogen is more effective than an air atmosphere in improving planarity of the single crystal semiconductor layer 117. In addition, there are also advantages in that deformation, such as a crack, and change of layer properties are less likely to be generated in an inert gas atmosphere than in an air atmosphere, and the applicable energy range for the laser light 119 to reduce crystal defects and to achieve planarization is wider in an inert gas atmosphere than in an air atmosphere.

In order to perform irradiation with the laser light 119 in an inert gas atmosphere, irradiation with the laser light 119 may be performed in an airtight chamber. By supply of an inert gas into this chamber, irradiation with the laser light 119 can be performed in an inert gas atmosphere. When a chamber is not used, a surface of the single crystal semiconductor layer 117 is irradiated with the laser light 119 while an inert gas is blown onto the irradiated surface. Accordingly, irradiation with the laser light 119 in an inert gas atmosphere can be achieved.

An inert gas refers to a gas of molecules or atoms that do not form an oxide film by reacting with a surface of a single crystal semiconductor layer by laser light irradiation. Examples of inert gases include a nitrogen gas ($N_2$ gas), noble gases such as argon and xenon, and the like. The concentration of oxygen in an inert gas is preferably 30 ppm or less, more preferably, 10 ppm or less.

When the laser irradiation treatment is performed in an airtight chamber, the pressure inside the chamber is reduced to a vacuum. Accordingly, an effect similar to that produced by performing laser irradiation treatment in an inert gas atmosphere can be obtained. The pressure inside the chamber is preferably 12 Pa or less, more preferably, 4 Pa or less.

The laser light 119 is made to pass through an optical system so that the laser light 119 has a linear or rectangular beam shape on the irradiated surface. Accordingly, irradiation with the laser light 119 can be performed with high throughput.

Before the single crystal semiconductor layer 117 is irradiated with the laser light 119, an oxide film such as a natural oxide film, which is formed on the surface of the single crystal semiconductor layer 117, may be removed. This is because there are cases where a sufficient planarization effect cannot be obtained when the single crystal semiconductor layer 117 is irradiated with the laser light 119 in the presence of an oxide film on the surface of the single crystal semiconductor layer 117. The oxide film can be removed by treatment of the single crystal semiconductor layer 117 with a hydrofluoric acid. The treatment with a hydrofluoric acid is desirably performed until the surface of the single crystal semiconductor layer 117 becomes water repellent. When the single crystal semiconductor layer 117 has water repellency, it can be confirmed that the oxide film is removed from the single crystal semiconductor layer 117.

The irradiation treatment with the laser light 119 of FIG. 7 can be performed as follows. First, the single crystal semiconductor layers 117 are treated with a 100-fold diluted hydrofluoric acid for 110 seconds to remove the oxide film on the surface. Next, the base substrate 100 to which the single crystal semiconductors layers 117 are bonded (the semiconductor substrate 153) is placed on a stage of a laser irradiation apparatus. In the case where the single crystal semiconductor layers 117 are heated, the single crystal semiconductor layers 117 are heated to a temperature in the range of 200° C. to 650° C. with a heating unit such as a resistance heating apparatus which is provided in the stage. For example, the single crystal semiconductor layers 117 are heated to 500° C.

As a laser which emits the laser light 119, a XeCl excimer laser (with a wavelength of 308 nm, a pulse width of 25 nsec, and a repetition rate of 60 Hz) is used. Through an optical system, a section of the laser light 119 is formed into a linear shape. The single crystal semiconductor layer 117 is irradiated with the laser light 119 while the single crystal semiconductor layer 117 is scanned with the laser light 119. Scanning with the laser light 119 can be conducted by moving the stage of the laser irradiation apparatus, and the movement rate of the stage corresponds to the scanning rate of the laser light. The scanning rate of the laser light 119 is adjusted so that the same region of the single crystal semiconductor layer 117 is irradiated with 1 to 20 shots of the laser light 119. The number of shots of the laser light 119 is preferably greater than or equal to 1 and less than or equal to 11. As the number of shots is decreased, cycle time for the laser irradiation treatment can be shortened.

Before the single crystal semiconductor layers 117 are irradiated with the laser light 119, the single crystal semiconductor layers 117 may be etched. The damaged region 115 which remains on the separation face of the single crystal semiconductor layer 117 can be removed by this etching. By removal of the damaged region 115, a surface planarization effect and a crystallinity recovery effect produced by irradiation with the laser light 119 can be enhanced.

This etching can be performed by using a dry etching method or a wet etching method. Examples of etching gases that can be used in a dry etching method are as follows: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbr.: TMAH) solution.

In the case where this etching is performed, it is also preferable that an oxide film such as a natural oxide film, which is formed on the surface of the single crystal semiconductor layer 117 after the etching, be removed before the single crystal semiconductor layer 117 is irradiated with the laser light 119. The oxide film can be removed by treatment of the single crystal semiconductor layer 117 with a hydrofluoric acid.

By the laser irradiation treatment performed to the semiconductor substrate 153, the semiconductor substrate 51 is completed (see FIGS. 3A and 3B).

Note that after irradiation with the laser light 119, heat treatment can also be performed in which the single crystal semiconductor layer 101 is heated at a temperature at which the single crystal semiconductor layer 101 is not melted. For this heat treatment, a diffusion furnace, a heating furnace such as a resistance heating furnace, an RTA apparatus, or the like can be used. In order to repair defects of the single crystal semiconductor layer 101, the heating temperature for the single crystal semiconductor layer 101 is 400° C. or higher, but it is a temperature at which the single crystal semiconductor layer 101 is not melted and which is equal to or lower than the strain point of the base substrate 100. This heating temperature is preferably 500° C. or higher; for example, the heating temperature can be 500° C. to 700° C. It is more preferable that the single crystal semiconductor layer 101 be heated to 550° C. or higher.

The heat treatment can be performed in an inert gas atmosphere. An inert gas refers to a gas of molecules or atoms that do not form an oxide film by reacting with the surface of the single crystal semiconductor layer in this heating treatment. Examples of inert gases include a nitrogen gas ($N_2$ gas), noble gases such as argon and xenon, and the like. The concentration of oxygen in an inert gas atmosphere is preferably 30 ppm or less, more preferably, 10 ppm or less. In addition, when the heat treatment is carried out in an atmosphere under reduced pressure (vacuum), oxidation of a surface of the single crystal semiconductor layer can be prevented. The pressure is preferably $1 \times 10^{-3}$ Pa to $5 \times 10^{-3}$ Pa.

When this heat treatment is performed with a heating furnace, the heat treatment is performed in, for example, a nitrogen gas atmosphere. Then, after the single crystal semiconductor layer 101 is heated at a treatment temperature of 500° C. for one hour, the heating temperature is raised to 550° C. to 650° C., at which heating is performed for four hours. Alternatively, after the single crystal semiconductor layer 101 is heated at a treatment temperature of 500° C. for one hour, the heating temperature is raised to 600° C., at which heating is performed for four hours. When an RTA apparatus is used, heat treatment is performed in a nitrogen gas atmosphere at a treatment temperature of 600° C. to 700° C. for 0.5 minutes to 30 minutes.

One advantageous effect of the heat treatment after laser irradiation treatment is extension of lifetime of the single crystal semiconductor layer 101. The longer the lifetime is, the fewer the defects and impurities in semiconductor are. Thus, with the single crystal semiconductor layer 101 having long lifetime, a transistor with excellent electric characteristics and high reliability can be manufactured.

After irradiation with the laser light 119, the single crystal semiconductor layer 101 may be thinned by etching. The thickness of the single crystal semiconductor layer 101 can be determined in accordance with characteristics of an element to be formed with the single crystal semiconductor layer 101. For example, the thickness may be 5 nm to 70 nm. This thinning step is preferably performed before the heat treatment. This is because damage to the single crystal semiconductor layer 101 due to etching in the thinning step can be recovered through the heat treatment.

The etching for thinning the single crystal semiconductor layer 101 can be performed by a dry etching method or a wet etching method. Examples of etching gases that can be used in a dry etching method are as follows: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

By a manufacturing method of the present invention, the substrate fixing treatment, the electromagnetic wave irradiation treatment, and the laser irradiation treatment (see FIGS. 6A to 6E and FIG. 7) can be performed at a process temperature of 700° C. or lower; thus, a glass substrate having a strain point of 700° C. or lower can be used as the base substrate 100.

In addition, treatment for dividing the single crystal semiconductor substrate 110 is performed by irradiation with the electromagnetic waves 123 having a frequency of 300 MHz to 300 GHz; thus, the temperature of the base substrate 100 can be prevented from exceeding 400° C. Accordingly, in the treatment for dividing the single crystal semiconductor substrate 110, shrinkage of the glass substrate can be suppressed. This makes it possible to fix a plurality of single crystal semiconductor layers 101 to a substrate which is used as the base substrate 100 and which shrinks easily, such as a glass substrate, through a plurality of fixing treatments and dividing treatments of single crystal semiconductor substrates. In addition, it becomes possible to fix a plurality of single crystal semiconductor layers to a substrate which shrinks easily with high positioning accuracy.

Furthermore, in the present invention, with the electromagnetic wave irradiation treatment, the temperature of each of the base substrate 100 and the single crystal semiconductor substrate 110 can be prevented from exceeding 400° C. Thus, the single crystal semiconductor substrate 110 can be prevented from cracking during the treatment for dividing the single crystal semiconductor substrate 110, due to a difference in thermal expansion from the base substrate 100. Accordingly, a substrate of a different kind of material, such as a quartz substrate, whose coefficient of thermal expansion is significantly different (five times or more) from that of the single crystal semiconductor substrate 110 (specifically, a single crystal silicon substrate) can be used as the base substrate 100.

Note that a method for manufacturing a semiconductor substrate of this embodiment mode can be combined with a method for manufacturing a semiconductor substrate of another embodiment mode and a method for manufacturing a semiconductor device of another embodiment mode.

Embodiment Mode 3

Figure 12:
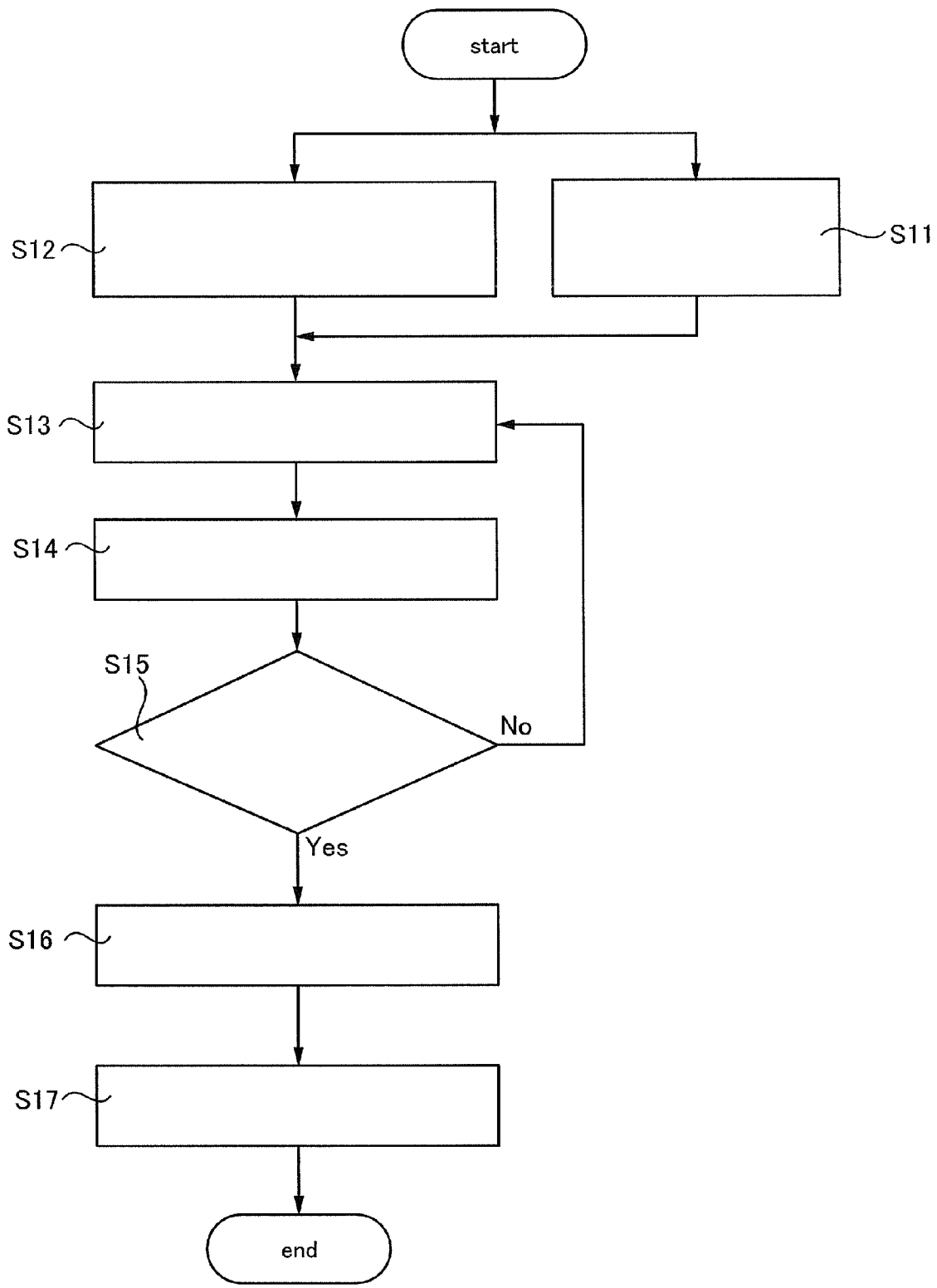
FIG. 12 is a flow chart of a method for manufacturing a semiconductor substrate.

In this embodiment mode, a method for manufacturing a semiconductor substrate is described. FIG. 12 is a flow chart of the method for manufacturing a semiconductor substrate of this embodiment mode. With the flow of FIG. 12, the semiconductor substrates 11 to 13 illustrated in FIGS. 1A to 1C can be manufactured.

In FIG. 12, Steps S11 to S15 are similar to Steps S1 to S5 of FIG. 2. A base substrate is prepared (Step S11), and a plurality of single crystal semiconductor substrates to be fixed to the base substrate is prepared (Step S12). In Step S12 of this embodiment mode, hydrogen ions are added to each single crystal semiconductor substrate, whereby a damaged region is formed. Next, substrate fixing treatment is performed (Step S13) to bond the base substrate prepared in Step S11 and one or more of the single crystal semiconductor substrates prepared in Step S12 to each other.

Next, the one or more of single crystal semiconductor substrates bonded to the base substrate through the substrate fixing treatment is irradiated with electromagnetic waves having a frequency of 300 MHz to 300 GHz, whereby the one or more of single crystal semiconductor substrates is divided along the damaged region (Step S14). Through this electromagnetic wave irradiation treatment, one or more of single crystal semiconductor layers is fixed to the base substrate. Step S13 and Step S14 are repeated (Step S15) until a predetermined number of single crystal semiconductor layers are fixed to the base substrate.

After a required number of single crystal semiconductor layers are fixed to the base substrate, heat treatment is performed (Step S16) before laser irradiation treatment. In this heat treatment, the single crystal semiconductor layers are heated at a temperature equal to or higher than 410° C. and lower than a melting point of the single crystal semiconductor layers.

In Step S12, hydrogen is added to the single crystal semiconductor substrates for formation of the damaged regions; thus, the plurality of single crystal semiconductor layers fixed to the base substrate contains hydrogen. One purpose of Step S16 is therefore to release a hydrogen gas from the single crystal semiconductor layers and to decrease hydrogen concentration thereof by heating the single crystal semiconductor layers at 410° C. or higher. In addition, through this heat treatment, bonding force in bonding portions formed through the substrate fixing treatment can be increased. The heat treatment is preferably performed at a temperature of 500° C. or higher, more preferably, 550° C. or higher.

Next, the plurality of single crystal semiconductor layers bonded to the base substrate is irradiated with laser light (Step S17). This laser irradiation treatment is treatment for recovery of crystallinity of the single crystal semiconductor layers bonded to the base substrate and for planarization of their surfaces.

When a damaged region is formed by addition of hydrogen to a single crystal semiconductor substrate, a single crystal semiconductor layer separated from the single crystal semiconductor substrate also contains a large amount of hydrogen. If hydrogen blows out of the single crystal semiconductor layer by irradiation of the single crystal semiconductor layer with laser light, crystallinity recovery and planarization cannot be achieved. If hydrogen concentration is higher than $1 \times 10^{21}$ atomic/cm$^3$, it is difficult to control energy density of laser light so as to achieve crystallinity recovery and planarization.

Thus, heat treatment at 410° C. or higher is performed before laser irradiation treatment to reduce hydrogen concentration of a single crystal semiconductor layer, whereby a hydrogen gas can be prevented from blowing out of the single crystal semiconductor layer due to laser light irradiation. This makes it easy to control irradiation energy of laser light needed for crystallinity recovery and planarization. In other words, when heat treatment is performed in advance, the applicable irradiation energy range for the laser irradiation treatment can be widened, and crystallinity recovery and planarization can be performed with high reproducibility through the laser light irradiation. In order to ensure reproducibility of the effect of the laser irradiation treatment, hydrogen concentration of a single crystal semiconductor layer is preferably made $1 \times 10^{21}$ atomic/cm$^3$ or less, more preferably, $7 \times 10^{20}$ atomic/cm$^3$ or less through the heat treatment in Step S16.

Through Steps S11 to S17, a semiconductor substrate in which a plurality of single crystal semiconductor layers with favorable crystallinity and planarity is fixed to a base substrate can be manufactured.

Figure 13A:
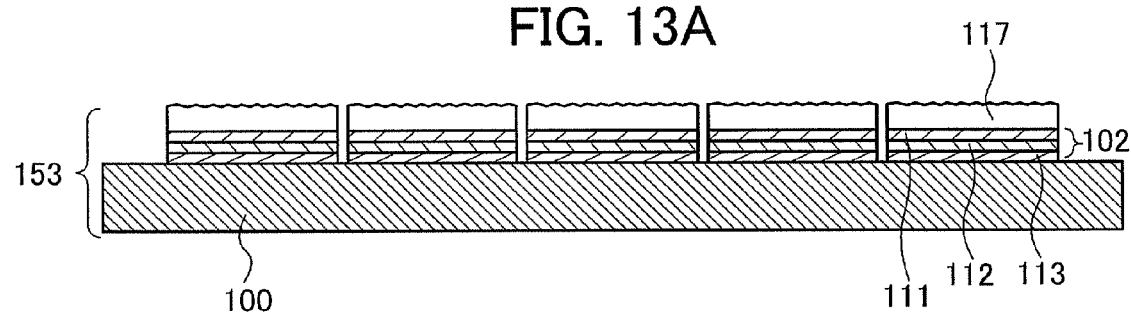
FIGS. 13A to 13C are cross-sectional views illustrating a method for manufacturing a semiconductor substrate.
Figure 13B:
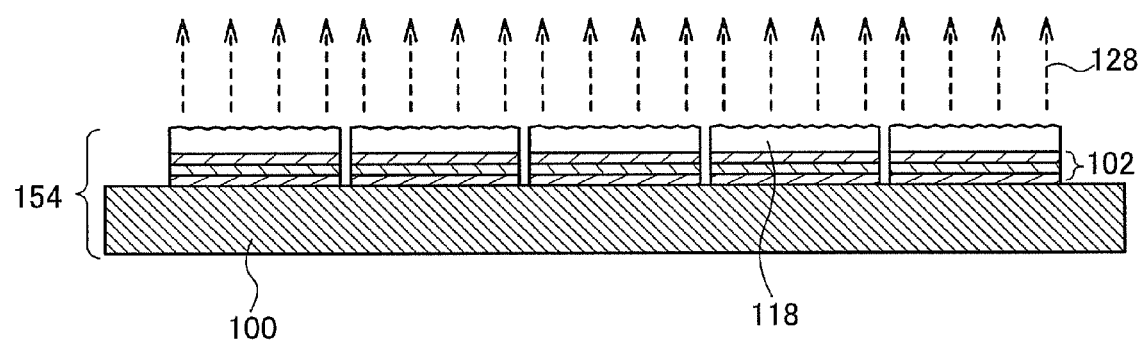
Figure 13C:
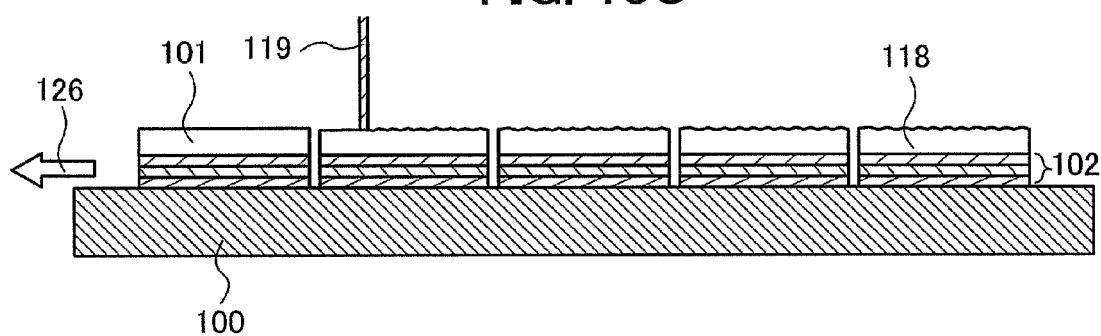

Next, each treatment in FIG. 12 is specifically described with reference to FIGS. 13A to 13C. In this embodiment mode, a method for manufacturing the semiconductor substrate 51 illustrated in FIGS. 3A and 3B is described as an example of a method for manufacturing a semiconductor substrate.

First, the semiconductor substrate 153 is formed through Steps S11 to S15 in accordance with the method for manufacturing the semiconductor substrate 51 described in Embodiment Mode 2 (see FIGS. 5A to 5E, FIGS. 6A to 6E, and FIGS. 8 to 11). FIG. 13A is a cross-sectional view of the semiconductor substrate 153.

Next, heat treatment is performed, thereby decreasing hydrogen concentration of the single crystal semiconductor layers 117. FIG. 13B is a cross-sectional view illustrating the heat treatment. In FIG. 13B, arrows conceptually represent that a hydrogen gas 128 is released into a gas phase from the single crystal semiconductor layers 117. The single crystal semiconductor layer 117 whose hydrogen concentration is decreased by the heat treatment is referred to as a "single crystal semiconductor layer 118," and the semiconductor substrate 153 after the heat treatment is referred to as a "semiconductor substrate 154."

For this heat treatment, a diffusion furnace, a heating furnace such as a resistance heating furnace, an RTA apparatus, or the like can be used. The single crystal semiconductor layer 117 is heated to 410° C. or higher. The temperature for the heat treatment is preferably 500° C. or higher, more preferably, 550° C. or higher. In addition, hydrogen concentration of the single crystal semiconductor layer 118 after the heat treatment is preferably $1\times10^{21}$ atomic/cm$^3$ or less. When this heat treatment is performed with a heating furnace, for example, after the semiconductor substrate 153 is heated at a treatment temperature of 500° C. for one hour, the heating temperature may be raised to 550° C., at which heating may be performed for four hours. This heat treatment can be performed not for the purpose of decreasing hydrogen concentration of the single crystal semiconductor layer 117 but for the purpose of increasing bonding force in the bonding portions formed through the substrate fixing treatment.

Next, the single crystal semiconductor layers 118 of the semiconductor substrate 154 are irradiated with laser light 119. FIG. 13C is a cross-sectional view illustrating laser irradiation treatment. The laser irradiation treatment of this embodiment mode can be performed in a manner similar to the laser irradiation treatment of FIG. 7. The single crystal semiconductor layers 118 are melted by being irradiated with the laser light 119, whereby single crystal semiconductor layers 101 which have undergone re-single-crystallization are formed. Through the aforementioned steps, the semiconductor substrate 51 is completed (see FIGS. 3A and 3B).

Note that the method for manufacturing a semiconductor substrate of this embodiment mode can be combined with a method for manufacturing a semiconductor substrate of another embodiment mode and a method for manufacturing a semiconductor device of another embodiment mode.

Embodiment Mode 4

In this embodiment mode, a method for manufacturing a semiconductor substrate having a stacked-layer structure similar to that of the semiconductor substrate 12 of FIG. 1B is described as an example of a method for manufacturing a semiconductor substrate.

Figure 14A:
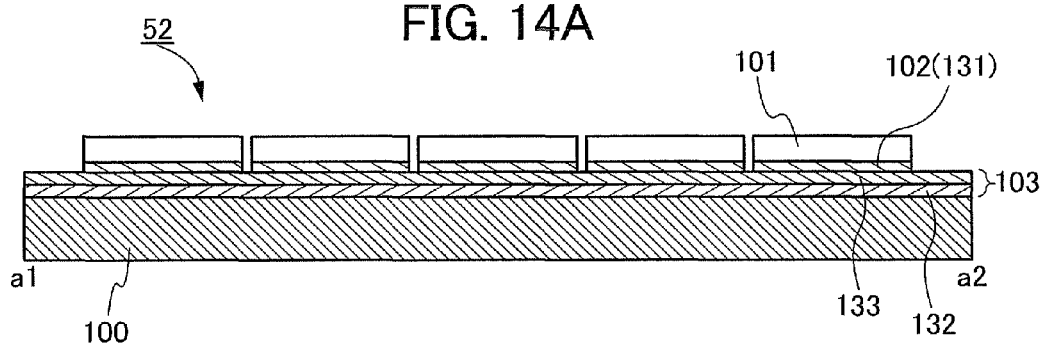
FIGS. 14A and 14B are a cross-sectional view of a semiconductor substrate and a plan view thereof, respectively.
Figure 14B:
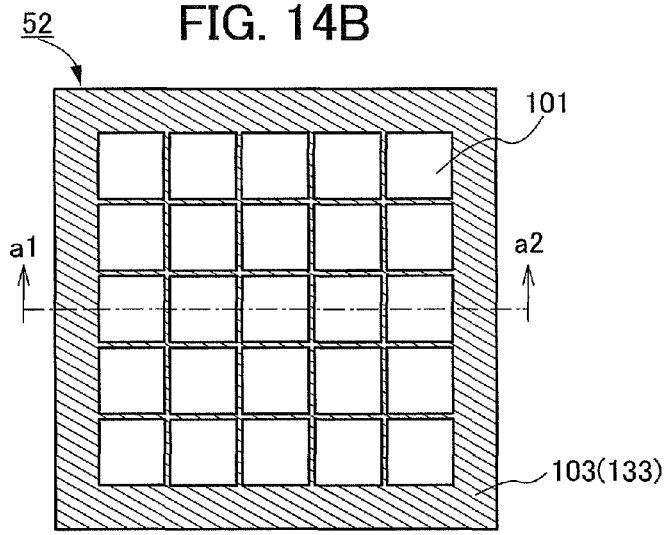

FIG. 14A is a cross-sectional view of a semiconductor substrate 52 manufactured by the method of this embodiment mode, and FIG. 14B is a plan view thereof. FIG. 14A is a cross-sectional view taken along a section line a1-a2 of FIG. 14B.

In the semiconductor substrate 52, as in the semiconductor substrate 12, a plurality of single crystal semiconductor layers 101 is provided over a base substrate 100 with buffer layers 102 and a buffer layer 103 interposed therebetween, and 25 single crystal semiconductor layers 101 are arranged in a matrix of five rows and five columns. In the semiconductor substrate 52, each of the single crystal semiconductor layers 101 is fixed to the base substrate 100 by bonding between the buffer layer 102 and the buffer layer 103. The buffer layer 102 is a layer formed over a single crystal semiconductor substrate (single crystal semiconductor layer 101). In this embodiment mode, the buffer layer 102 has a single-layer structure of an insulating layer 131. On the other hand, the buffer layer 103 is a layer formed over a surface of the base substrate 100. In this embodiment mode, the buffer layer 103 has a two-layer structure of an insulating layer 132 and an insulating layer 133.

A method for manufacturing the semiconductor substrate 52 is hereinafter described with reference to FIG. 15 and FIGS. 16A to 16E.

Figure 15:
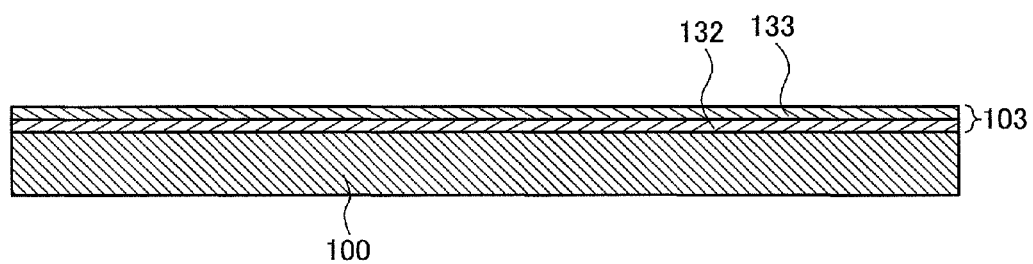
FIG. 15 is a cross-sectional view of a base substrate provided with a buffer layer.

The base substrate 100 over a surface of which the buffer layer 103 is formed is prepared. FIG. 15 is a cross-sectional view of the base substrate 100 with the buffer layer 103. In this embodiment mode, a stacked-layer film of the insulating layer 132 and the insulating layer 133 is formed as the buffer layer 103. Examples of combinations of the insulating layer 132 and the insulating layer 133 are as follows: a silicon nitride film and a silicon oxide film; a silicon nitride film and a silicon oxynitride film; a silicon nitride oxide film and a silicon oxide film; a silicon nitride oxide film and a silicon oxynitride film; and the like. These films can be formed in a manner similar to the buffer layer 102 of Embodiment Mode 2.

For example, in the case where the insulating layer 132 of silicon nitride oxide and the insulating layer 133 of silicon oxynitride are formed by a PECVD method, the base substrate 100 is carried into a chamber of a PECVD apparatus. Then, SiH$_4$, N$_2$O, NH$_3$, and H$_2$ are supplied to the chamber as a process gas for formation of the insulating layer 132, and plasma of this process gas is generated, whereby a silicon nitride oxide film is formed over the base substrate 100. Next, the gas introduced into the chamber is changed to a process gas for formation of the insulating layer 133. Here, SiH$_4$ and N$_2$O are used. Plasma of a mixed gas of these is generated, and a silicon oxynitride film is formed over the silicon nitride oxide film in succession. In the case where a PECVD apparatus having a plurality of chambers is used, the silicon nitride oxide film and the silicon oxynitride film can be formed in different chambers. Needless to say, by change of gases introduced into the chamber, a silicon nitride film can be formed as the insulating layer 132 and a silicon oxide film can be formed as the insulating layer 133.

When the insulating layer 132 and the insulating layer 133 are successively formed as described above, the buffer layer 103 can be formed over the surface of the base substrate 100 with high throughput. In addition, because the insulating layer 132 and the insulating layer 133 can be formed without being exposed to the atmosphere, the interface between the insulating layer 132 and the insulating layer 133 can be prevented from being contaminated by the atmosphere.

Next, a method for preparing a single crystal semiconductor substrate 110 provided with the buffer layer 102 and a damaged region 115 is described with reference to FIGS. 16A to 16E.

Figure 16A:
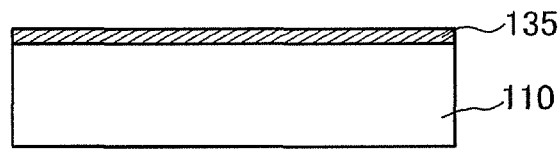
FIGS. 16A to 16D are cross-sectional views illustrating a method for providing a single crystal semiconductor substrate with a buffer layer and a damaged region and FIG. 16E is a plan view thereof.

First, the single crystal semiconductor substrate 110 is washed and cleaned. Then, a protective film 135 is formed over a surface of the single crystal semiconductor substrate 110 as illustrated in FIG. 16A. The protective film 135 is formed for purposes of preventing the single crystal semiconductor substrate 110 from being contaminated by an impurity such as a metal, preventing the surface of the single crystal semiconductor substrate 110 from being damaged by impact of ions with which the surface is irradiated, and the like. This protective film 135 can be formed by deposition of an insulating material such as silicon oxide, silicon nitride, silicon nitride oxide, or silicon oxynitride by a CVD method or the like. Alternatively, the protective film 135 can be formed by oxidation or nitridation of the single crystal semiconductor substrate 110. For example, in order to form the protective film 135 with an oxide film by oxidizing the single crystal semiconductor substrate 110, the protective film 135 can be formed by thermal oxidation treatment (dry oxidation treatment, steam oxidation treatment) or oxidation treatment with ozone-containing water. In the case of dry oxidation treatment, it is preferable to add a halogen-containing gas to an oxidizing atmosphere. As a halogen-containing gas, one kind or plural kinds of gases selected from HCl, HF, $NF_3$, HBr, $Cl_2$, $ClF_3$, $BCl_3$, $F_2$, $Br_2$, and the like can be used.

Figure 16B:
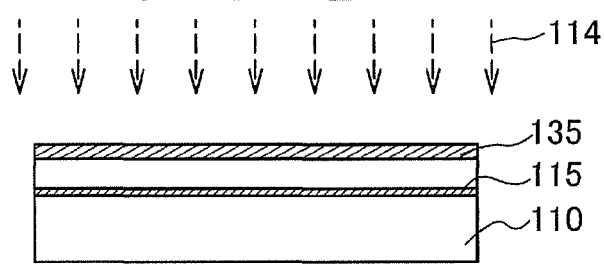

Next, as illustrated in FIG. 16B, through the protective film 135, the single crystal semiconductor substrate 110 is irradiated with ions 114, thereby forming the damaged region 115 in a region at a predetermined depth from the surface of the single crystal semiconductor substrate 110. This step can be conducted in a manner similar to the formation step of the damaged region 115 in Embodiment Mode 2 (see FIG. 5B).

Figure 16C:
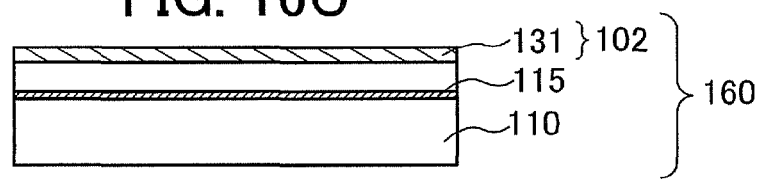

After the damaged region 115 is formed, the protective film 135 is removed. Then, as illustrated in FIG. 16C, the insulating layer 131 which is used to form the buffer layer 102 is formed over the upper surface of the single crystal semiconductor substrate 110. The single crystal semiconductor substrate 110 provided with the buffer layer 102 and the damaged region 115 is referred to as a "donor substrate 160."

The insulating layer 131 can be formed in a manner similar to the insulating layer 113 of Embodiment Mode 2. The insulating layer 131 can also be formed by oxidation treatment of the single crystal semiconductor substrate 110 in a manner similar to the insulating layer 111 of Embodiment Mode 2. Note that oxidation treatment is performed at a process temperature at which an element or molecules added for formation of the damaged region 115 is not released from the single crystal semiconductor substrate 110, and the heating temperature is preferably 350° C. or lower. As such low-temperature oxidation treatment, oxidation treatment with ozone-containing water, oxidation treatment with plasma treatment or high-density plasma treatment, or the like can be used.

Figure 16D:
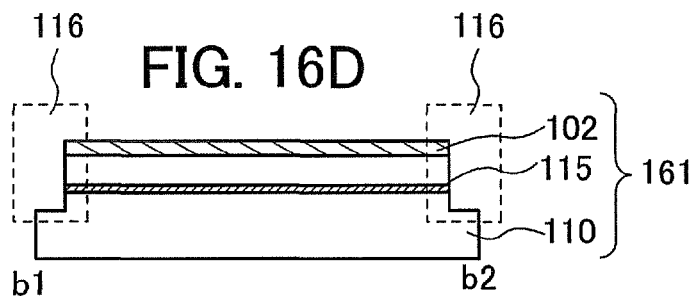
Figure 16E:
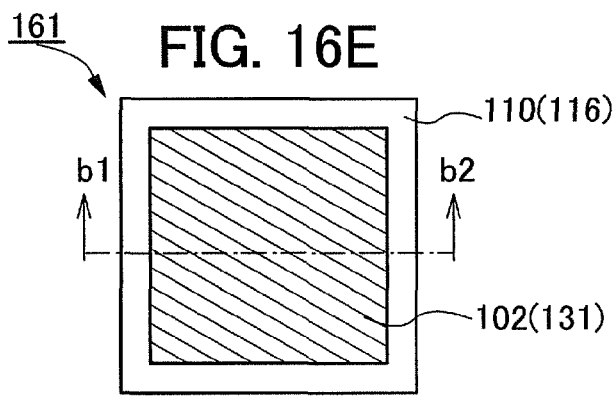

Next, the peripheral portion of the donor substrate 160 is partly removed to form a cut portion 116. The donor substrate 160 provided with the cut portion 116 is referred to as a "donor substrate 161." The cut portion 116 can be formed in a manner similar to Embodiment Mode 2. FIG. 16D is a cross-sectional view of the donor substrate 161 and FIG. 16E is a plan view thereof. FIG. 16D is a cross-sectional view taken along a section line b1-b2 of FIG. 16E.

Through the aforementioned steps, the base substrate 100 with the buffer layer 103 and the donor substrate 161 are prepared. The subsequent steps are performed in a manner similar to Embodiment Mode 2 or 3, whereby the semiconductor substrate 52 is completed (see FIGS. 14A and 14B).

Note that the method for manufacturing a semiconductor substrate of this embodiment mode can be combined with a method for manufacturing a semiconductor substrate and a method for manufacturing a semiconductor device which are described in another embodiment mode. For example, with the use of the donor substrate 161 instead of the donor substrate 151 in Embodiment Mode 2, the semiconductor substrate 51 including the buffer layer 102 having a single-layer structure can be manufactured. On the other hand, with the use of the donor substrate 151 in this embodiment mode instead of the donor substrate 161, the semiconductor substrate 52 including the buffer layer 102 having a three-layer structure can be manufactured.

Embodiment Mode 5

In this embodiment mode, a method for manufacturing a semiconductor substrate having a stacked-layer structure similar to that of the semiconductor substrate 13 of FIG. 1C is described as an example of a method for manufacturing a semiconductor substrate.

Figure 17A:
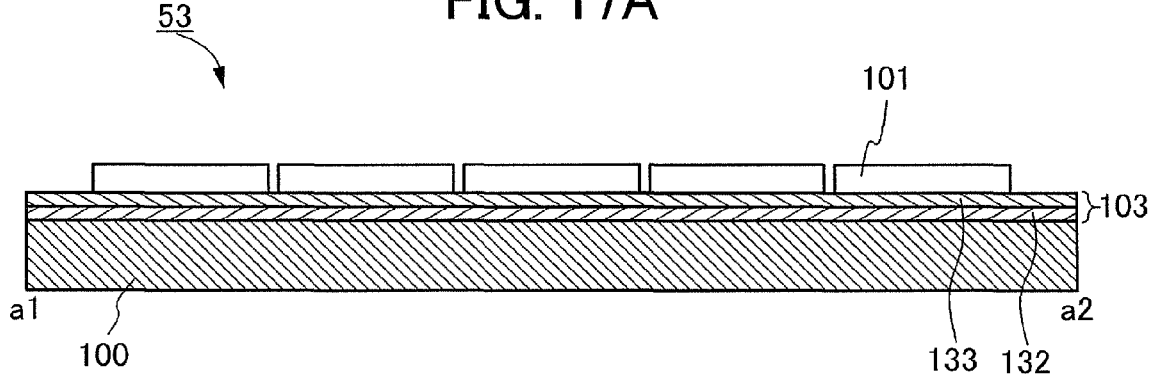
FIGS. 17A and 17B are a cross-sectional view of a semiconductor substrate and a plan view thereof, respectively.
Figure 17B:
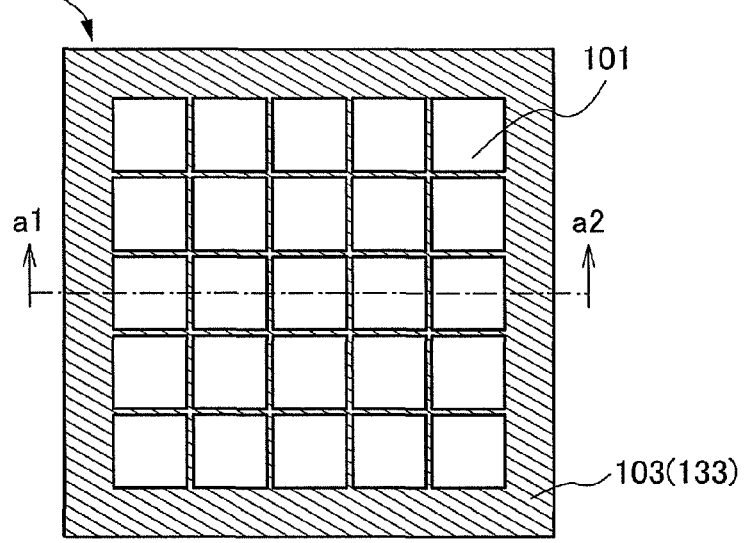

FIG. 17A is a cross-sectional view of a semiconductor substrate 53 manufactured by the method of this embodiment mode, and FIG. 17B is a plan view thereof. FIG. 17A is a cross-sectional view taken along a section line a1-a2 of FIG. 17B. In the semiconductor substrate 53, as in the semiconductor substrate 13, a plurality of single crystal semiconductor layers 101 is provided over a base substrate 100 with a buffer layer 103 interposed therebetween. In the semiconductor substrate 53, each single crystal semiconductor layer 101 is fixed to the base substrate 100 by bonding between the single crystal semiconductor layer 101 and the buffer layer 103. The buffer layer 103 is a layer formed over the base substrate 100. In this embodiment mode, the buffer layer 103 has a two-layer structure of an insulating layer 132 and an insulating layer 133, and 25 single crystal semiconductor layers 101 are arranged in a matrix of five rows and five columns. A method for manufacturing the semiconductor substrate 53 is hereinafter described.

First, the base substrate 100 provided with the buffer layer 103 and a plurality of single crystal semiconductor substrates 110 each provided with a damaged region 115 are prepared. As in Embodiment Mode 3, the buffer layer 103 is formed over the base substrate 100, whereby the base substrate 100 with the buffer layer 103 is prepared (see FIG. 15).

Figure 18A:
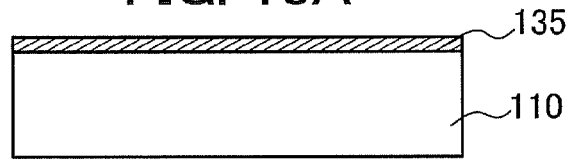
FIGS. 18A to 18D are cross-sectional views illustrating a method for providing a single crystal semiconductor substrate with a buffer layer and a damaged region and FIG. 18E is a plan view thereof.

Next, a method for preparing the single crystal semiconductor substrate 110 provided with the damaged region 115 is described with reference to FIGS. 18A to 18E. The step of manufacturing the donor substrate 161 in Embodiment Mode 4 applies mutatis mutandis to this preparing step. First, the single crystal semiconductor substrate 110 is washed and cleaned. Then, a protective film 135 is formed over a surface of the single crystal semiconductor substrate 110 as illustrated in FIG. 18A.

Figure 18B:
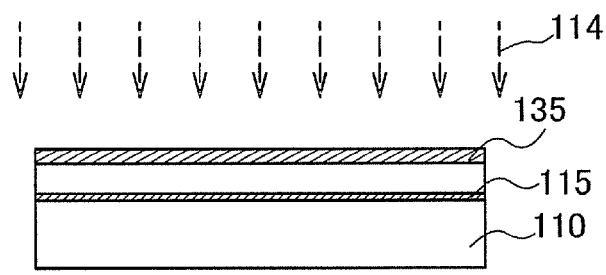

Next, as illustrated in FIG. 18B, through the protective film 135, the single crystal semiconductor substrate 110 is irradiated with ions 114, thereby forming the damaged region 115 in a region at a predetermined depth from the surface of the single crystal semiconductor substrate 110.

Figure 18C:
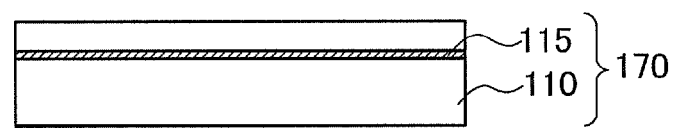

After the damaged region 115 is formed, the protective film 135 is removed (see FIG. 18C). The single crystal semiconductor substrate 110 provided with the damaged region 115 is referred to as a "donor substrate 170."

Figure 18D:
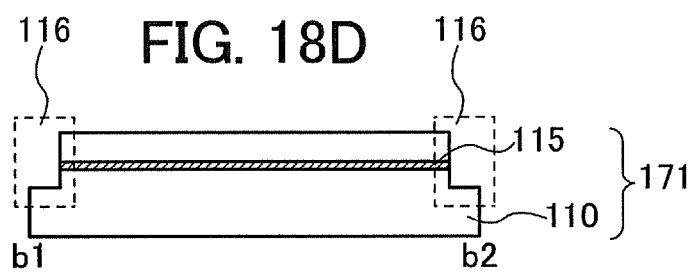
Figure 18E:
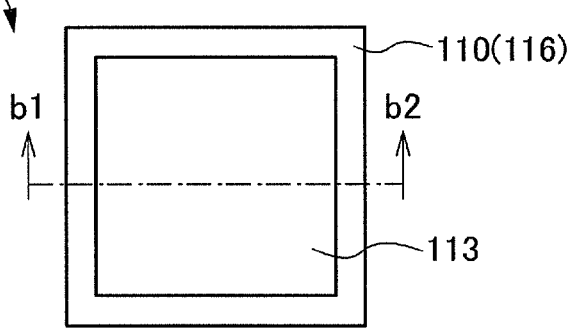

Next, the peripheral portion of the donor substrate 170 is partly removed to form a cut portion 116. The donor substrate 170 provided with the cut portion 116 is referred to as a "donor substrate 171." FIG. 18D is a cross-sectional view of the donor substrate 171, and FIG. 18E is a plan view thereof. FIG. 18D is a cross-sectional view taken along a section line b1-b2 of FIG. 18E.

Through the aforementioned steps, the base substrate 100 with the buffer layer 103 and the donor substrate 171 are prepared. The subsequent steps are performed in a manner similar to Embodiment Mode 2 or 3, whereby the semiconductor substrate 53 is completed (see FIGS. 17A and 17B).

Note that the method for manufacturing a semiconductor substrate of this embodiment mode can be combined with a method for manufacturing a semiconductor substrate and a method for manufacturing a semiconductor device which are described in another embodiment mode.

Embodiment Mode 6

In each of Embodiment Modes 2 to 5, a method for manufacturing a semiconductor substrate is described, by which one single crystal semiconductor layer is separated from one donor substrate and fixed to a base substrate. In this embodiment mode, a method for manufacturing a semiconductor substrate is described, by which a plurality of single crystal semiconductor layers is separated from one single crystal semiconductor substrate and fixed to a base substrate.

Figure 19A:
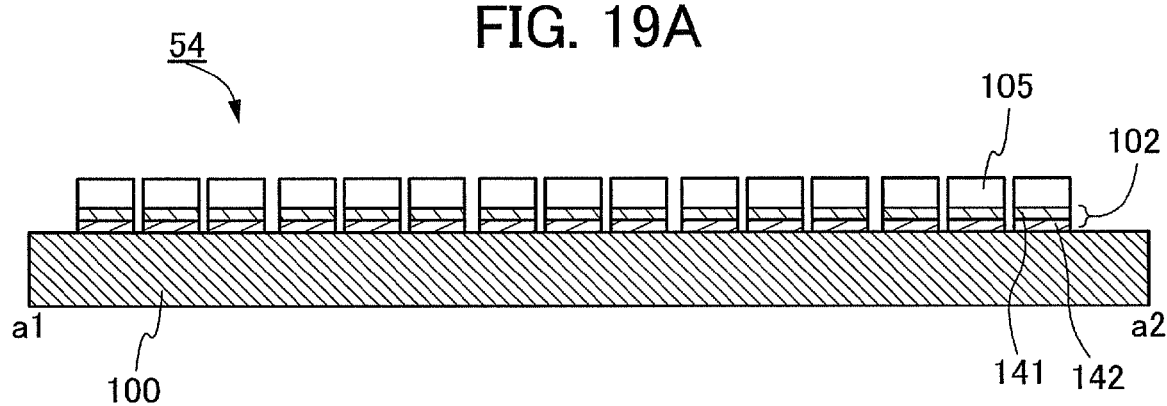
FIGS. 19A and 19B are a cross-sectional view of a semiconductor substrate and a plan view thereof, respectively.
Figure 19B:
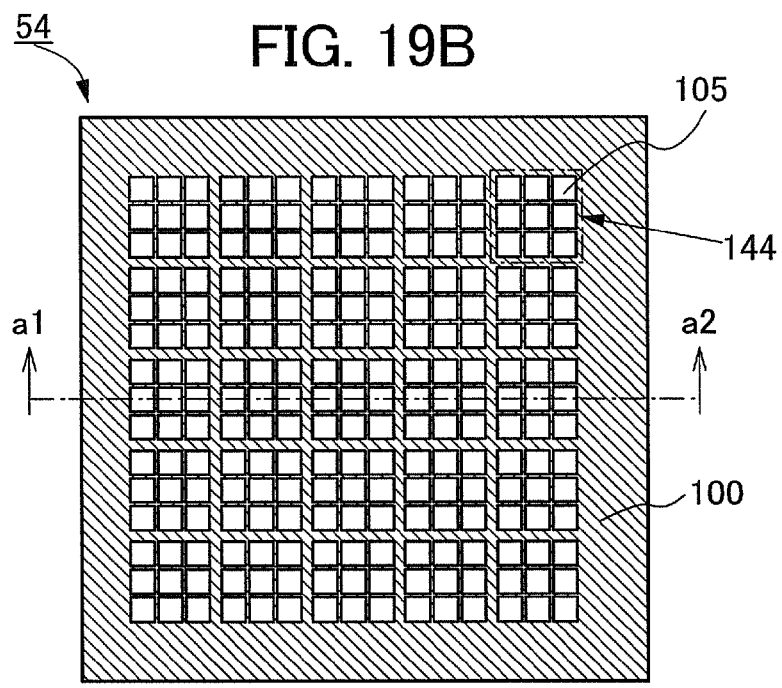

FIG. 19A is a cross-sectional view of a semiconductor substrate 54 manufactured by the method of this embodiment mode, and FIG. 19B is a plan view thereof. FIG. 19A is a cross-sectional view taken along a section line a1-a2 of FIG. 19B. In the semiconductor substrate 54, as in the semiconductor substrate 11, a plurality of single crystal semiconductor layers 105 is each provided over a base substrate 100 with a buffer layer 102 interposed therebetween. In the semiconductor substrate 54, each single crystal semiconductor layer 105 is fixed to the base substrate 100 by bonding between the base substrate 100 and the buffer layer 102. The buffer layer 102 has a two-layer structure of insulating layers 141 and 142. Nine single crystal semiconductor layers 105, which are arranged in a matrix of three rows and three columns in a region 144 surrounded by a dot-and-dash line of FIG. 19B, are layers separated from one single crystal semiconductor substrate 110.

A method for preparing the single crystal semiconductor substrate 110 provided with a damaged region 115 is hereinafter described with reference to FIGS. 20A to 20E. In this embodiment mode, the step of manufacturing the donor substrate 151 in Embodiment Mode 2 applies mutatis mutandis to this preparing step.

Figure 20A:
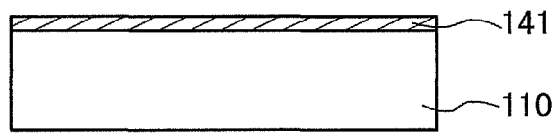
FIGS. 20A to 20D are cross-sectional views illustrating a method for providing a single crystal semiconductor substrate with a buffer layer and a damaged region and FIG. 20E is a plan view thereof.
Figure 20B:
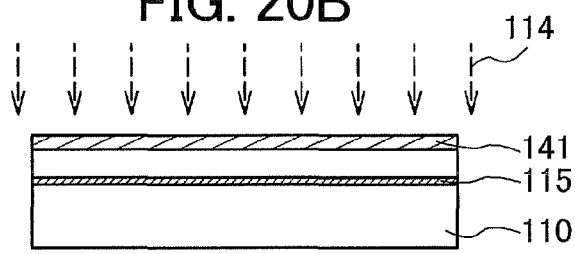

First, the single crystal semiconductor substrate 110 is cleaned, and the insulating layer 141 is formed over a surface of the single crystal semiconductor substrate 110 (see FIG. 20A). The insulating layer 141 can be formed in a manner similar to the insulating layer 111. As the insulating layer 141, a silicon oxide film or a silicon oxynitride film is preferable.

Next, the single crystal semiconductor substrate 110 is irradiated with ions 114 through the insulating layer 141, whereby the damaged region 115 is formed in a region at a predetermined depth from the surface of the single crystal semiconductor substrate 110.

Figure 20C:
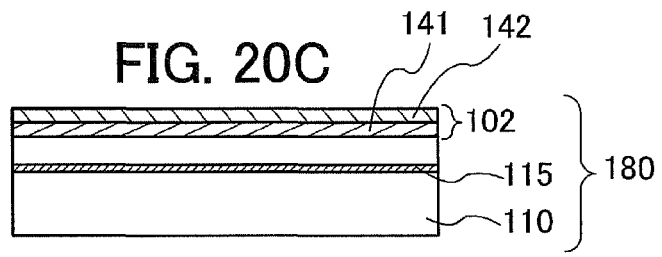

Next, the insulating layer 142 is formed over the insulating layer 141 (see FIG. 20C). The insulating layer 142 serves as a layer to be bonded to the base substrate 100 (as a bonding layer).

The insulating layer 142 can be formed in a manner similar to the insulating layer 113. For example, a silicon nitride film, a silicon nitride oxide film, a silicon oxide film, or a silicon oxynitride film can be formed by a CVD method. It is preferable that a silicon nitride film or a silicon nitride oxide film be formed as the insulating layer 142, whereby the insulating layer 142 can be made to function as a barrier layer. By a PECVD method, a silicon nitride film or a silicon nitride oxide film can be formed using a source gas including at least a silane gas, an ammonia gas, and a hydrogen gas. In the case where a silicon nitride oxide film is formed, a nitride oxide gas may be added to a source gas.

Through the aforementioned steps, the single crystal semiconductor substrate 110 provided with the buffer layer 102 having a two-layer structure and the damaged region 115 is prepared. This single crystal semiconductor substrate 110 is referred to as a "donor substrate 180."

Figure 20D:
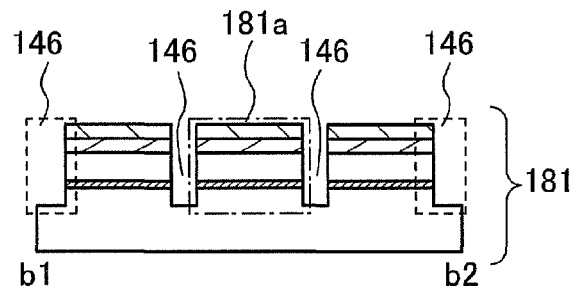
Figure 20E:
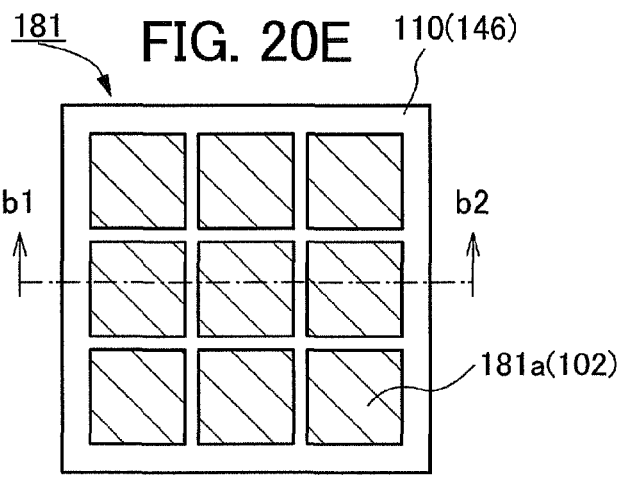

Next, a part of the donor substrate 180 is removed to form a cut portion 146. The donor substrate 180 provided with the cut portion 146 is referred to as a "donor substrate 181." FIG. 20D is a cross-sectional view of the donor substrate 181 provided with the cut portion 146, and FIG. 20E is a plan view thereof. FIG. 20D is a cross-sectional view taken along a section line b1-b2 of FIG. 20E. By formation of the cut portion 146, a plurality of projecting portions 181a (in this embodiment mode, nine projecting portions 181a) is formed in an upper portion of the donor substrate 181.

The cut portion 146 is formed as follows. The periphery of the donor substrate 180 is removed in order to make the distance between adjacent single crystal semiconductor layers 105 as short as possible in the semiconductor substrate 54. In addition, a groove is formed in the donor substrate 180 by partial removal of the donor substrate 180 in order to divide an upper portion of the donor substrate 180 into a plurality of regions. In this embodiment mode, a grid-like groove is formed in the donor substrate 181. In other words, an upper layer of the donor substrate 181 is divided by the cut portion 146 into a matrix of three rows and three columns as illustrated in FIGS. 20D and 20E. By formation of the cut portion 146 as described above, nine single crystal semiconductor layers 105 arranged in a matrix can be fixed to the base substrate 100 from one donor substrate 181.

In addition, the cut portion 146 is formed deeper than the damaged region 115 so that a portion above the damaged region 115 may be left over the base substrate 100 when the donor substrate 181 is divided along the damaged region 115. This allows the plurality of projecting portions 181a to be fixed to the base substrate 100 by division of the donor substrate 181.

The cut portion 146 can be formed by etching treatment, laser light processing treatment, or the like. Needless to say, the shape of the cut portion 146 for dividing the upper portion of the donor substrate 180 is not limited to that in this embodiment mode. The cut portion 146 may be formed in the donor substrate 180 in such a manner that the area of the single crystal semiconductor layer 105 fixed to the base substrate 100 is equal to or larger than that of a semiconductor layer needed to form a semiconductor element.

The subsequent steps are performed in a manner similar to Embodiment Mode 2 or 3, whereby the semiconductor substrate 54 is completed (see FIGS. 19A and 19B). Note that, although only the donor substrates 181 each provided with the cut portion 146 are used in this embodiment mode to manufacture the semiconductor substrate 54, some of the donor substrates 181 may each be provided with the cut portion 116 of FIG. 5D such that one single crystal semiconductor layer 105 is formed from one donor substrate 181.

The method for manufacturing a semiconductor substrate of this embodiment mode can be combined with a method for manufacturing a semiconductor substrate and a method for manufacturing a semiconductor device which are described in another embodiment mode. For example, a semiconductor substrate can be manufactured by fixture of the donor substrate 181 to the base substrate 100 with the buffer layer 103 of Embodiment Mode 4. Furthermore, a semiconductor substrate can be manufactured, in which the single crystal semiconductor layer 105 is fixed to the base substrate 100 with only the buffer layer 103 interposed therebetween as in Embodiment Mode 5. Moreover, the semiconductor substrate 51 and the semiconductor substrate 52 can be manufactured with the use of the donor substrates 181 of this embodiment mode.

Embodiment Mode 7

In this embodiment mode, a semiconductor device using a semiconductor substrate of the present invention and a manufacturing method thereof are described. As an example of a semiconductor device using a semiconductor substrate of the present invention, a transistor is described in this embodiment mode. By a combination of a plurality of transistors, various types of semiconductor devices are formed. A method for manufacturing a transistor is described with reference to cross-sectional views of FIGS. 21A to 21E, FIGS. 22A to 22C, and FIG. 23. Note that, in this embodiment mode, a method for manufacturing an n-channel transistor and a p-channel transistor at the same time is described.

Figure 21A:
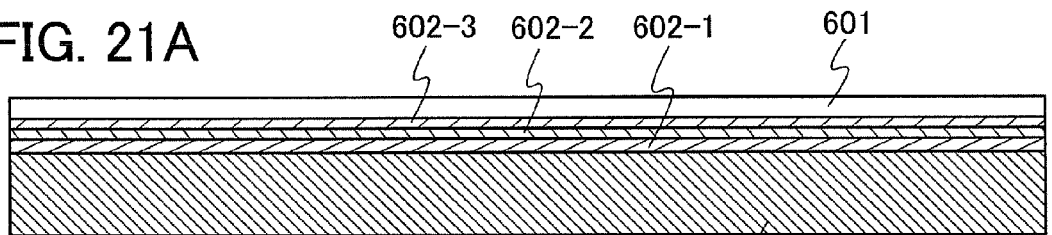
FIGS. 21A to 21E are cross-sectional views illustrating a method for manufacturing a semiconductor device.

A semiconductor substrate to which a single crystal semiconductor layer is bonded is prepared. In this embodiment mode, a transistor is manufactured using a semiconductor substrate having a stacked-layer structure similar to that of the semiconductor substrate 51 in FIGS. 3A and 3B. FIG. 21A is a partial cross-sectional view of a semiconductor substrate, in which a single crystal semiconductor layer 601 is fixed to a base substrate 600 with three insulating layers 602-1, 602-2, and 602-3 interposed therebetween. The insulating layers 602-1, 602-2, and 602-3 are layers which form a buffer layer. Although FIG. 21A illustrates only one single crystal semiconductor layer 601, a plurality of single crystal semiconductor layers 601 is provided over the base substrate 600 with the insulating layers 602-1, 602-2, and 602-3 interposed therebetween. A semiconductor substrate used to form a transistor is not limited to the semiconductor substrate 51, and a semiconductor substrate of the present invention can be used.

Figure 21B:
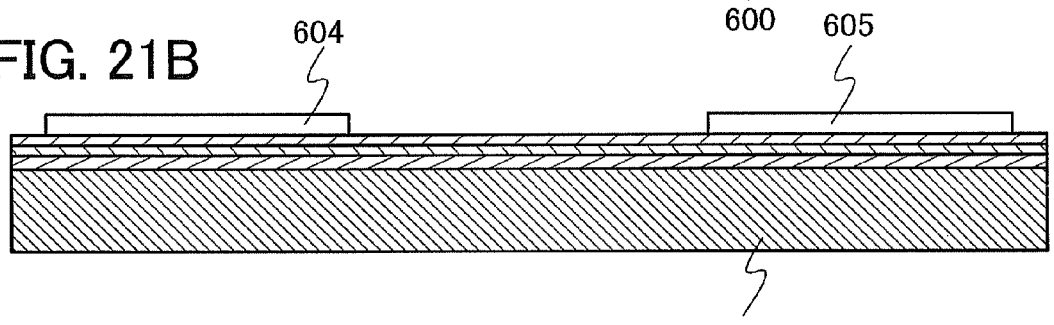

Next, as illustrated in FIG. 21B, the single crystal semiconductor layer 601 over the base substrate 600 is processed (patterned) into a desired shape by etching, so that a single crystal semiconductor layer 604 and a single crystal semiconductor layer 605 are formed. A p-channel transistor is formed using the single crystal semiconductor layer 604, and an n-channel transistor is formed using the single crystal semiconductor layer 605. Note that not all of the single crystal semiconductor layers 601 over the base substrate 600 are necessarily used for manufacture of transistors, and at least one of the single crystal semiconductor layers 601 may be used. Note also that at least one transistor is manufactured using one single crystal semiconductor layer 601.

In order to control threshold voltage, an impurity element serving as a donor or an acceptor may be added to the single crystal semiconductor layer 604 and the single crystal semiconductor layer 605. An impurity element serving as an acceptor is a p-type impurity element, such as boron, aluminum, or gallium. An impurity element serving as a donor is an n-type impurity element, such as phosphorus or arsenic. For example, in the case of adding boron as an acceptor element, boron may be added at a concentration of $5\times10^{16}$ cm$^{-3}$ to $1\times10^{17}$ cm$^{-3}$. The addition of the impurity element for controlling threshold voltage may be performed to the single crystal semiconductor layer 601 before processing by etching or to the single crystal semiconductor layer 604 and the single crystal semiconductor layer 605.

For example, taking as an example the case of using a weak p-type single crystal silicon substrate to form the single crystal semiconductor layer 601, an example of a method for adding such an impurity element is described. First, before etching the single crystal semiconductor layer 601, boron is added to the entire single crystal semiconductor layer 601. This addition of boron aims at adjusting the threshold voltage of a p-channel transistor. Using $B_2H_6$ as a dopant gas, boron is added at a concentration of $1\times10^{16}$/cm$^3$ to $1\times10^{17}$/cm$^3$. The concentration of boron is determined in consideration of the activation rate or the like. For example, the concentration of boron can be $6\times10^{16}$/cm$^3$. Next, the single crystal semiconductor layer 601 of the semiconductor substrate is etched to form the single crystal semiconductor layers 604 and 605. Then, boron is only added to the single crystal semiconductor layer 605. The second addition of boron aims at adjusting the threshold voltage of an n-channel transistor. Using $B_2H_6$ as a dopant gas, boron is added to the single crystal semiconductor layer 605 at a concentration of $1\times10^{16}$/cm$^3$ to $1\times10^{17}$/cm$^3$. For example, the concentration of boron can be $6\times10^{16}$/cm$^3$.

Figure 21C:
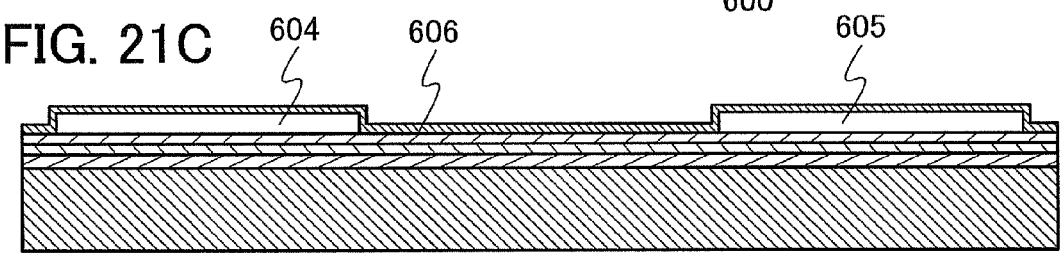

Then, as illustrated in FIG. 21C, an insulating layer 606 is formed to cover the single crystal semiconductor layers 604 and 605. The insulating layer 606 can be formed with a single layer or a stacked layer of two or more layers of a silicon oxide film, a silicon oxynitride film, a silicon nitride oxide film, a silicon nitride film, and/or the like by a PECVD method at a process temperature of 350° C. or lower. In addition, a film which forms the insulating layer 606 can be formed by oxidizing or nitriding surfaces of the single crystal semiconductor layers 604 and 605 by high-density plasma treatment. The high-density plasma treatment is performed using, for example, a mixed gas of a noble gas such as He, Ar, Kr, or Xe and a gas selected from oxygen, nitrogen oxide, ammonia, nitrogen, and the like. Hydrogen may be added to this mixed gas. When plasma excitation is performed with microwaves, high-density plasma with a low electron temperature can be generated. The surfaces of the single crystal semiconductor layers 604 and 605 are oxidized or nitrided with oxygen radicals (which may include OH radicals) or nitrogen radicals (which may include NH radicals) which are generated in such high-density plasma, whereby an insulating film is formed to a thickness of 1 nm to 20 nm, preferably 5 nm to 10 nm on the surfaces of the single crystal semiconductor layers 604 and 605.

Figure 21D:
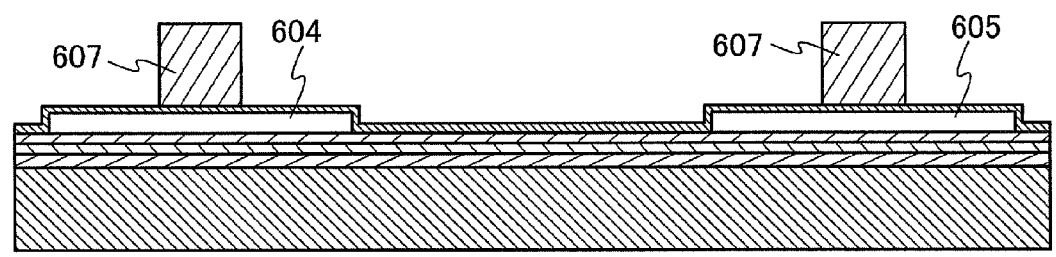

Then, a conductive film having a single-layer structure or a stacked-layer structure is formed over the insulating layer 606. This conductive film is processed (patterned) into a predetermined shape, thereby forming an electrode 607 over each of the single crystal semiconductor layers 604 and 605 with the insulating layer 606 interposed therebetween, as illustrated in FIG. 21D. The conductive film can be formed by a CVD method, a sputtering method, or the like. A film which forms the conductive film can be formed with a metal film of tantalum (Ta), tungsten (W), titanium (Ti), molybdenum (Mo), aluminum (Al), copper (Cu), chromium (Cr), niobium (Nb), or the like, an alloy film containing the above-mentioned metal as its main component, or a compound film of the above-mentioned metal. Furthermore, a semiconductor film of silicon or the like, which is doped with an impurity element imparting a conductivity type, such as phosphorus, may be used.

When the electrode 607 is formed with a conductive film having a two-layer structure, examples of combinations in the conductive film having a two-layer structure are as follows: a tantalum nitride film and a tungsten film; a tantalum film and a tungsten film; a tungsten nitride film and a tungsten film; a molybdenum nitride film and a molybdenum film; an aluminum film and a tantalum film; an aluminum film and a titanium film; and the like. Note that each former film is the first layer of the conductive film. A tungsten film or a tantalum nitride film is preferably used as the first layer of the conductive film because of its high heat resistance. When the electrode 607 is formed with a conductive film having a three-layer structure, a stacked-layer film of a molybdenum film, an aluminum film, and a molybdenum film may be formed.

As the etching treatment of the conductive film which forms the electrode 607, inductively coupled plasma (ICP) etching treatment can be employed. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate. The electrode 607 can be formed to have a tapered edge portion by appropriately controlling etching conditions (e.g., the amount of electric power applied to a coiled electrode, the amount of electric power applied to an electrode on the substrate side, or the electrode temperature on the substrate side).

Figure 21E:
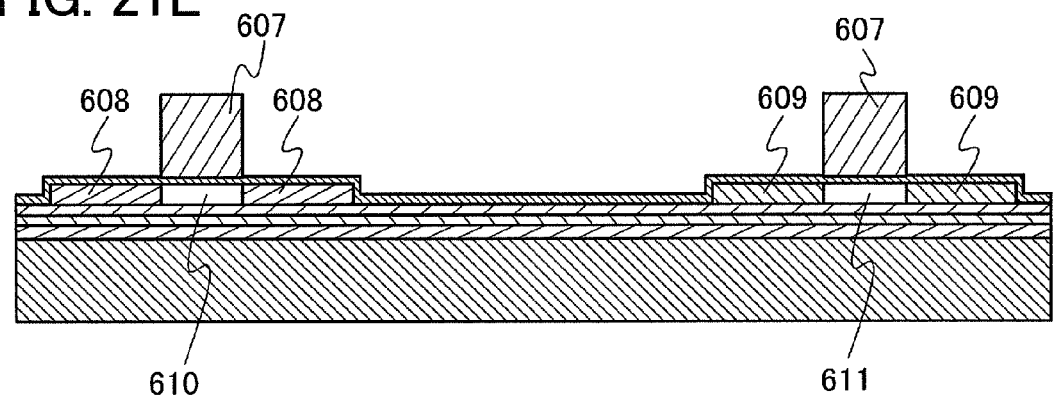

Next, as illustrated in FIG. 21E, an impurity element imparting one conductivity type is added to the single crystal semiconductor layers 604 and 605 with use of the electrodes 607 as masks. In this embodiment mode, an impurity element serving as an acceptor (e.g., boron) is added to the single crystal semiconductor layer 604, and an impurity element serving as a donor (e.g., phosphorus or arsenic) is added to the single crystal semiconductor layer 605. This step is a step for forming impurity regions serving as a source region and a drain region in the single crystal semiconductor layer 604 and forming impurity regions serving as high-resistance regions in the single crystal semiconductor layer 605. P-type high-concentration impurity regions 608 are formed in the single crystal semiconductor layer 604, and n-type low-concentration impurity regions 609 are formed in the single crystal semiconductor layer 605. The n-type low-concentration impurity regions 609 function as n-type high-resistance impurity regions. Regions overlapping with the electrodes 607 in the single crystal semiconductor layer 604 and the single crystal semiconductor layer 605 are a channel formation region 610 and a channel formation region 611, respectively.

When an impurity element imparting p-type conductivity is added to the single crystal semiconductor layer 604, the single crystal semiconductor layer 605 is covered with a mask or the like so that the impurity element imparting p-type conductivity is not added to the single crystal semiconductor layer 605. On the other hand, when an impurity element imparting n-type conductivity is added to the single crystal semiconductor layer 605, the single crystal semiconductor layer 604 is covered with a mask or the like so that the impurity element imparting n-type conductivity is not added to the single crystal semiconductor layer 604. Alternatively, after an impurity element imparting one of p-type and n-type conductivity is added to the single crystal semiconductor layers 604 and 605, an impurity element imparting desired conductivity may be selectively added to one of the single crystal semiconductor layers 604 and 605. For example, after adding an n-type impurity element to each of the single crystal semiconductor layers 604 and 605, a p-type impurity element may only be added to the single crystal semiconductor layer 604.

Figure 22A:
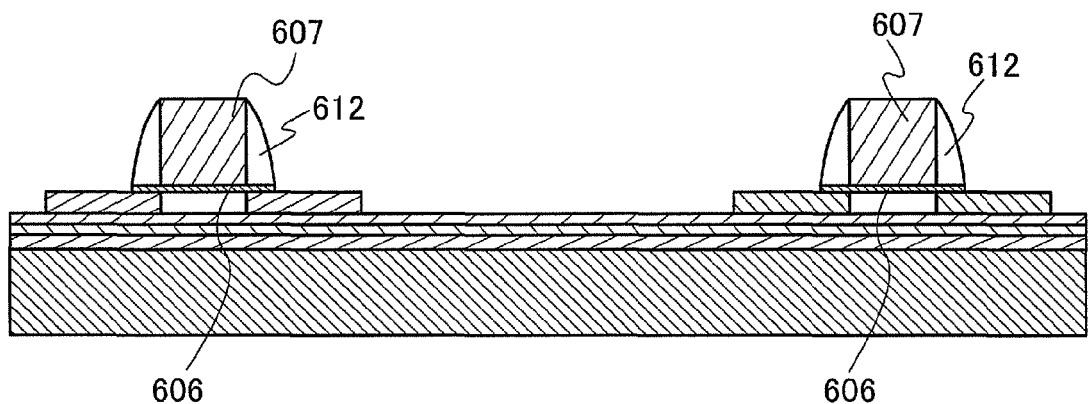
FIGS. 22A to 22C are cross-sectional views illustrating a method for manufacturing a semiconductor device.

Next, as illustrated in FIG. 22A, sidewalls 612 are formed on side surfaces of the electrodes 607. The sidewalls 612 can be formed in such a manner that an insulating film is formed so as to cover the insulating layer 606 and the electrodes 607, and this insulating film is partially removed by anisotropic etching in which etching proceeds mainly in a perpendicular direction. By anisotropic etching for forming the sidewalls 612, the insulating layer 606 is also etched and its portions overlapping with the electrodes 607 and the sidewalls 612 remain over the base substrate 600. The insulating film used to form the sidewalls 612 can be formed with a single layer or a stack of two or more layers of a film including an inorganic material, such as a silicon oxide film, a silicon oxynitride film, a silicon nitride oxide film, or a film including an organic material such as an organic resin by a PECVD method, a sputtering method, or the like. In this embodiment mode, a silicon oxide film is formed to a thickness of 100 nm by a PECVD method. As an etching gas for anisotropic etching treatment of the silicon oxide film, a mixed gas of $CHF_3$ and helium can be used.

Figure 22B:
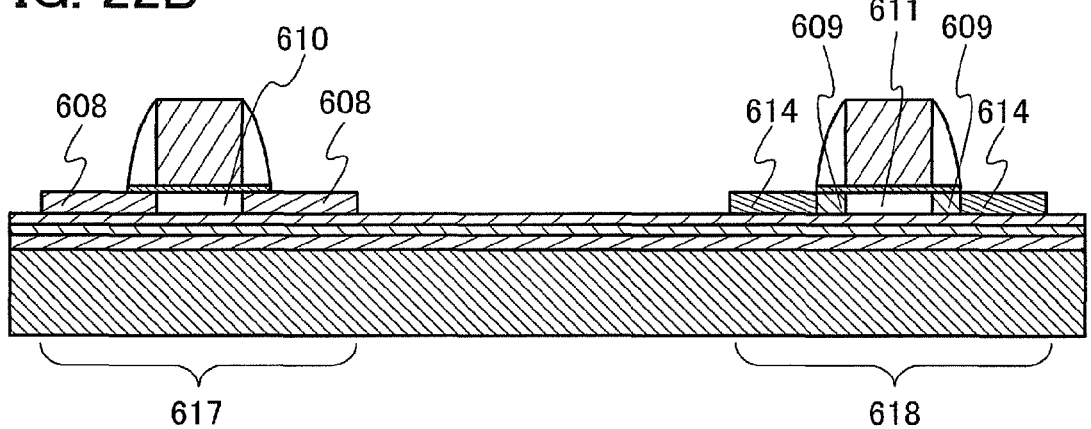

Then, as illustrated in FIG. 22B, an impurity element imparting n-type conductivity is added to the single crystal semiconductor layer 605 by using the electrode 607 and the sidewall 612 as masks. This step is a step for forming impurity regions serving as a source region and a drain region in the single crystal semiconductor layer 605. In this step, the impurity element imparting n-type conductivity is only added to the single crystal semiconductor layer 605 while the single crystal semiconductor layer 604 is covered with a mask or the like. The electrode 607 and the sidewall 612 serve as masks; accordingly, a pair of n-type high-concentration impurity regions 614 are formed in the single crystal semiconductor layer 605 in a self-aligned manner.

Next, the mask covering the single crystal semiconductor layer 604 is removed, and then heat treatment is performed to activate the impurity element imparting p-type conductivity that has been added to the single crystal semiconductor layer 604 and the impurity element imparting n-type conductivity that has been added to the single crystal semiconductor layer 605. Through a series of the steps illustrated in FIGS. 21A to 21E and FIGS. 22A and 22B, a p-channel transistor 617 and an n-channel transistor 618 are formed over the base substrate 600.

In order to reduce the resistance of the source region and the drain region, silicide layers may be formed by silicidation of the p-type high-concentration impurity regions 608 in the single crystal semiconductor layer 604 and the n-type high-concentration impurity regions 614 in the single crystal semiconductor layer 605. The silicidation can be performed by placing a metal in contact with the single crystal semiconductor layers 604 and 605 and causing reaction between the metal and silicon in the single crystal semiconductor layers through heat treatment; in this manner, a silicide compound is produced. As the metal, cobalt or nickel is preferable, or the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the single crystal semiconductor layers 604 and 605 are thin, the single crystal semiconductor layers 604 and 605 in these regions may be silicided to the bottoms. As the heat treatment for silicidation, a heating furnace, an RTA apparatus, or a laser irradiation apparatus can be used.

Figure 22C:
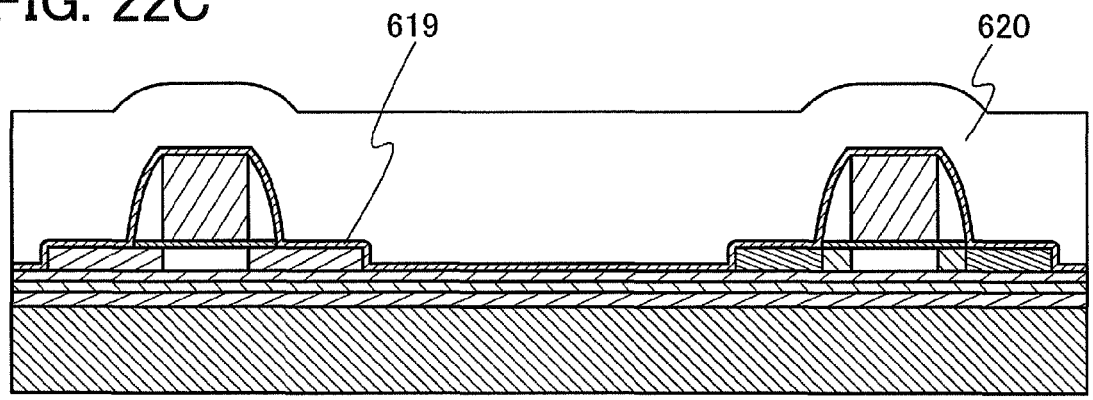

Next, as illustrated in FIG. 22C, an insulating film 619 is formed to cover the p-channel transistor 617 and the n-channel transistor 618. As the insulating film 619, an insulating film containing hydrogen is formed. In this embodiment mode, a hydrogen-containing silicon nitride oxide film with a thickness of about 600 nm is formed by a PECVD method using a source gas including monosilane, ammonia, and $N_2O$. The reason why the insulating film 619 is made to contain hydrogen is that hydrogen can be diffused from the insulating film 619 so that dangling bonds in the single crystal semiconductor layers 604 and 605 can be terminated. By formation of the insulating film 619 with silicon nitride oxide, a barrier layer is formed, which can prevent impurities such as an alkali metal and an alkaline earth metal (typically, sodium) from entering the p-channel transistor 617 and the n-channel transistor 618.

Next, an insulating film 620 having a single-layer structure or a stacked-layer structure is formed over the insulating film 619 so as to cover the p-channel transistor 617 and the n-channel transistor 618. As a film which forms the insulating film 620, a film of an organic material having heat resistance, such as polyimide, acrylic, benzocyclobutene, polyamide, or epoxy. Other than the above-mentioned film of an organic material, it is also possible to use a film of a low-dielectric-constant material (a low-k material), a siloxane resin, silicon oxide, silicon nitride, silicon nitride oxide, phosphosilicate glass (PSG), borophosphosilicate glass (BPSG), alumina, or the like. Note that the siloxane resin corresponds to a resin including a Si—O—Si bond formed using a siloxane-based material as a starting material. The siloxane resin may include as a substituent at least one of fluorine, an alkyl group, and an aryl group, as well as hydrogen. The insulating film 620 can be formed by any of the following methods and means depending on the material of the insulating layer 620: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, and the like.

Next, heat treatment at a temperature of about 400° C. to 450° C. (e.g., 410° C.) is performed in a nitrogen atmosphere for about one hour, so that hydrogen is diffused from the insulating film 619 and dangling bonds in the single crystal semiconductor layers 604 and 605 are terminated with hydrogen.

Next, contact holes are formed in the insulating film 619 and the insulating film 620 so that each of the p-type high-concentration impurity regions 608 and the n-type high-concentration impurity regions 614 is partially exposed. The contact holes can be formed by a dry etching method using a mixed gas of $CHF_3$ and He; however, the present invention is not limited to this example. Next, a conductive film having a single-layer structure or a stacked-layer structure is formed over the insulating film 620. This conductive film is etched, thereby forming conductive films 621 which are connected to the p-type high-concentration impurity regions 608 through the contact holes and conductive films 622 which are connected to the n-type high-concentration impurity regions 614, as illustrated in FIG. 23.

Figure 23:
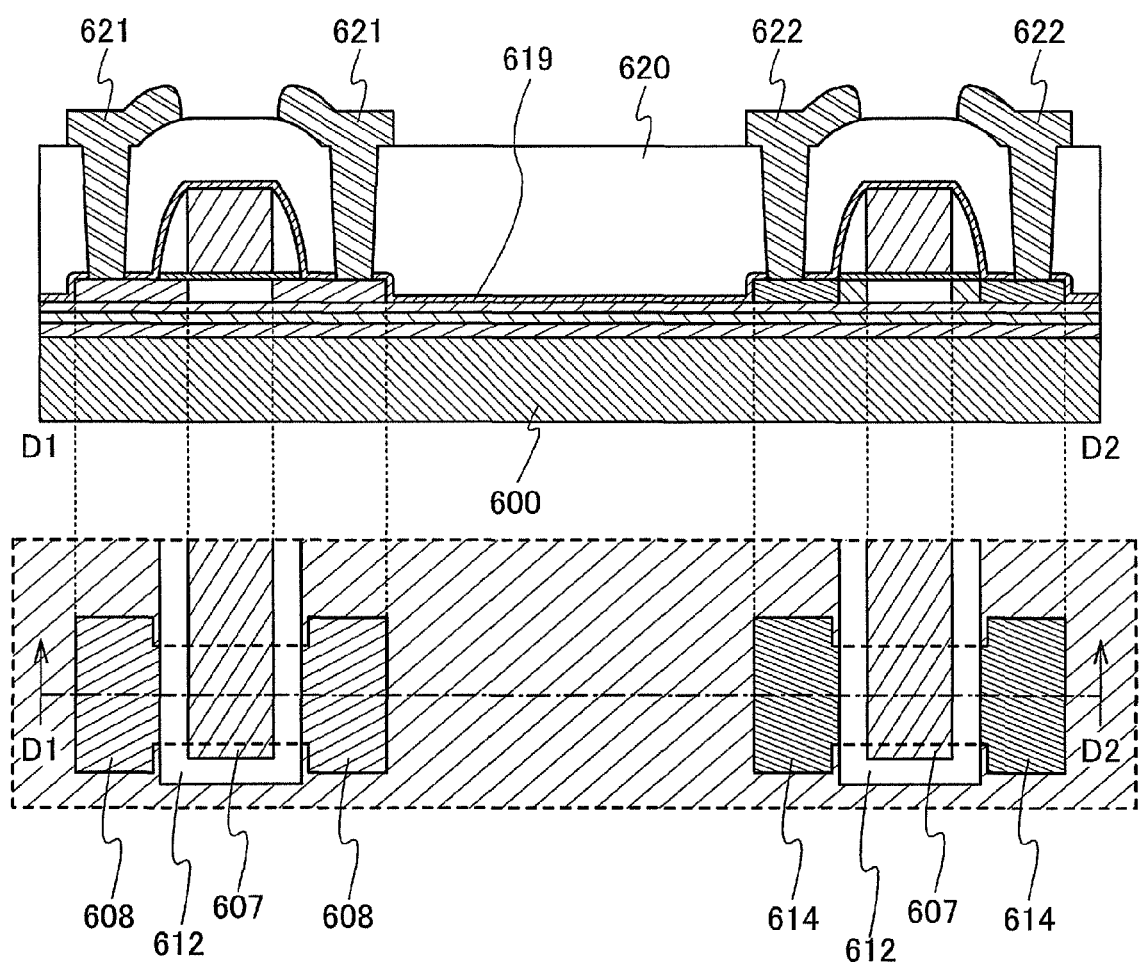
FIG. 23 is a cross-sectional view and a plan view illustrating a method for manufacturing a semiconductor device.

FIG. 23 includes both a plan view of the p-channel transistor 617 and the n-channel transistor 618 and a cross-sectional view taken along a section line D1-D2 of the plan view. Note that the conductive films 621 and 622, the insulating film 619, and the insulating film 620 are omitted in the plan view of FIG. 23.

The conductive film used to form the conductive films 621 and 622 can be formed by a CVD method, a sputtering method, or the like. This conductive film can be formed with a metal film of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), or the like, an alloy film containing the above-mentioned metal as its main component, or a compound film of the above-mentioned metal. A film containing aluminum as its main component is preferable as the conductive film used to form the conductive films 621 and 622 because of its low resistance. Another preferable low-resistance film is an aluminum film to which carbon, silicon, nickel, copper, or the like is added because hillock formation is less likely to occur than in a pure aluminum film.

When a film containing aluminum as its main component is used for the conductive films 621 and 622, hillock formation in aluminum can be prevented by formation of barrier films so as to sandwich the film containing aluminum as its main component. A conductive film used to form the barrier film may be a titanium film, a titanium nitride film, a molybdenum film, a molybdenum nitride film, or the like. For example, when the conductive films 621 and 622 have a stacked-layer structure, the conductive films 621 and 622 can have a five-layer structure in which a titanium film, a titanium nitride film, an aluminum silicon (Al—Si) film, a titanium film, and a titanium nitride film are stacked. In the case of this structure, a pure aluminum film may be used instead of an aluminum silicon film.

Although the case where each of the p-channel transistor 617 and the n-channel transistor 618 has the electrode 607 functioning as a gate is described in this embodiment mode, the present invention is not limited to this structure. The transistor manufactured in accordance with the present invention may be a transistor having a multi-gate structure in which a plurality of electrodes functioning as a gate is provided and electrically connected to one another.

A single crystal semiconductor layer included in the semiconductor substrate of the present invention is obtained by slicing a single crystal semiconductor substrate; thus, its orientation does not vary. Consequently, variation in electric characteristics such as threshold voltage and mobility among a plurality of transistors manufactured using the same semiconductor substrate in accordance with the present invention can be made little. Further, there are no crystal grain boundaries in the single crystal semiconductor layer, a leakage current resulting from a crystal grain boundary can be suppressed, and power saving of a semiconductor device can be realized. Accordingly, a highly reliable semiconductor device can be manufactured.

In the case of manufacturing a transistor from a polycrystalline semiconductor film that is obtained by laser crystallization, it has been necessary to determine a layout of the semiconductor layer of the transistor taking into consideration a laser beam scanning direction in order to obtain high mobility. However, in the case of using a semiconductor substrate of the present invention, there is no need for such layout determination, and there are fewer restrictions in designing a semiconductor device.

A variety of semiconductor devices can be formed by a combination of a plurality of transistors that are manufactured using a semiconductor substrate in accordance with the present invention. For example, a circuit having a CMOS structure can be formed by a complementary combination of an n-channel transistor and a p-channel transistor.

A semiconductor device such as a microprocessor can be manufactured by combination of a circuit having a CMOS structure with a wiring, another semiconductor element, or the like.

When a microprocessor is provided with an integrated circuit having a CMOS structure, not only an increase in processing speed of the microprocessor but also a reduction in power consumption thereof can be achieved.

Figure 24:
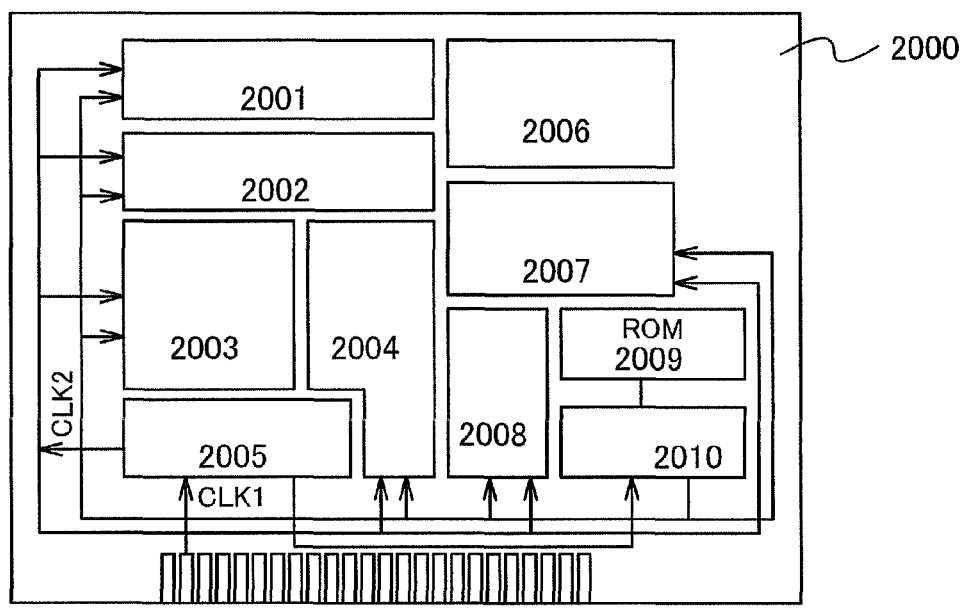
FIG. 24 is a block diagram illustrating an example of a structure of a microprocessor.

A microprocessor is described with reference to FIG. 24. FIG. 24 is a block diagram illustrating an example of a structure of a microprocessor 2000.

The microprocessor 2000 has an arithmetic logic unit (also referred to as an ALU) 2001, an ALU controller 2002, an instruction decoder 2003, an interrupt controller 2004, a timing controller 2005, a register 2006, a register controller 2007, a bus interface 2008, a read-only memory (ROM) 2009, and a memory interface 2010.

An instruction input to the microprocessor 2000 through the bus interface 2008 is input to the instruction decoder 2003, decoded therein, and then input to the ALU controller 2002, the interrupt controller 2004, the register controller 2007, and the timing controller 2005. The ALU controller 2002, the interrupt controller 2004, the register controller 2007, and the timing controller 2005 conduct various controls based on the decoded instruction.

The ALU controller 2002 generates signals for controlling the operation of the ALU 2001. The interrupt controller 2004 is a circuit which processes an interrupt request from an external input/output device or a peripheral circuit while the microprocessor 2000 is executing a program, and the interrupt controller 2004 processes an interrupt request based on its priority or a mask state. The register controller 2007 generates an address of the register 2006, and reads and writes data from and to the register 2006 in accordance with the state of the microprocessor 2000. The timing controller 2005 generates signals for controlling timing of operation of the ALU 2001, the ALU controller 2002, the instruction decoder 2003, the interrupt controller 2004, and the register controller 2007. For example, the timing controller 2005 is provided with an internal clock generator for generating an internal clock signal CLK2 based on a reference clock signal CLK1. As illustrated in FIG. 24, the internal clock signal CLK2 is input to other circuits.

Figure 25:
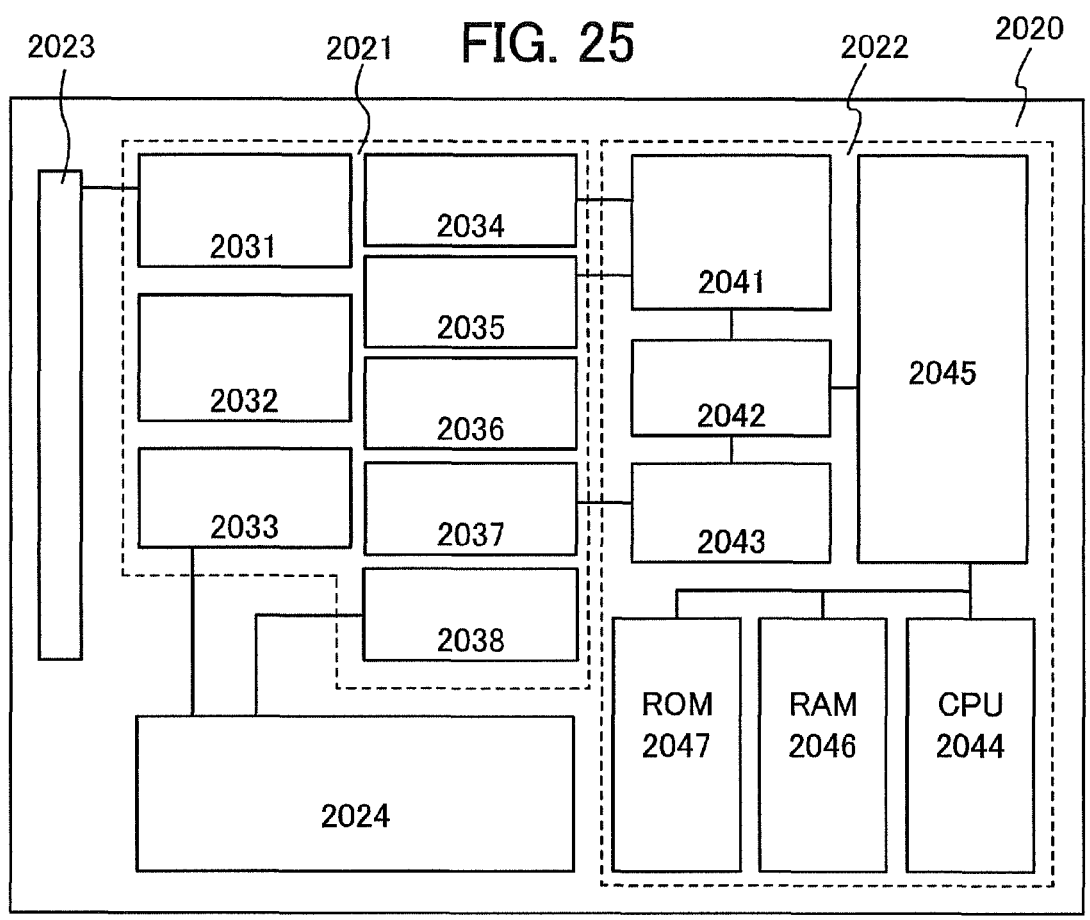
FIG. 25 is a block diagram illustrating an example of a structure of a semiconductor device with a wireless communication function.
Figure 26A:
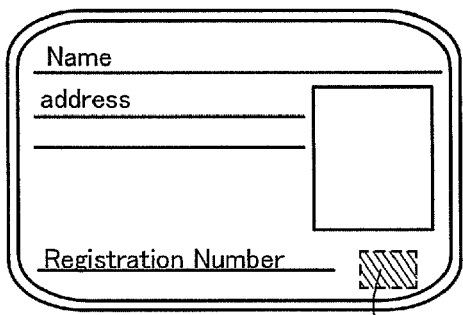
FIGS. 26A to 26F are external views of articles to which a semiconductor device with a wireless communication function is fixed.
Figure 26B:
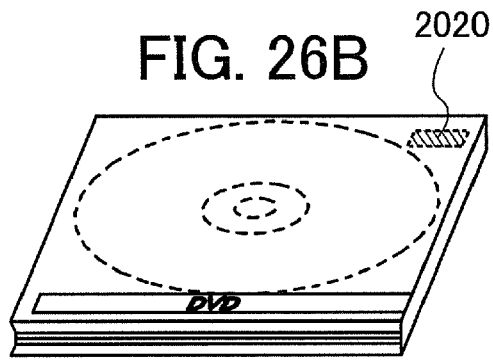
Figure 26C:
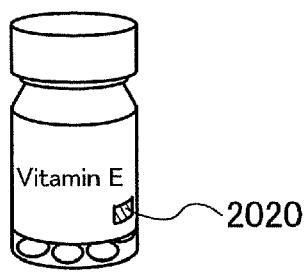
Figure 26D:
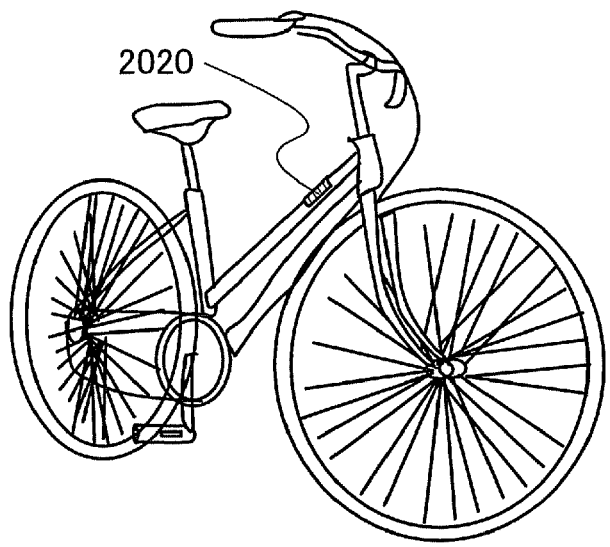
Figure 26E:
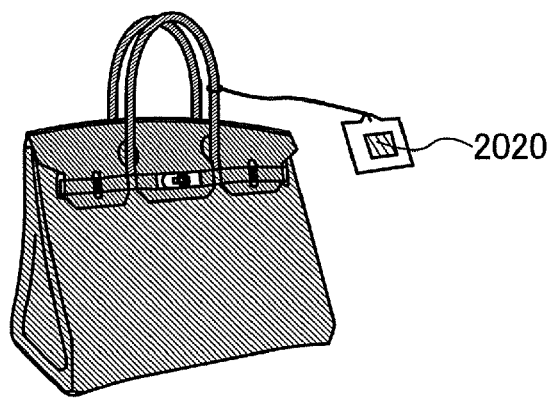
Figure 26F:
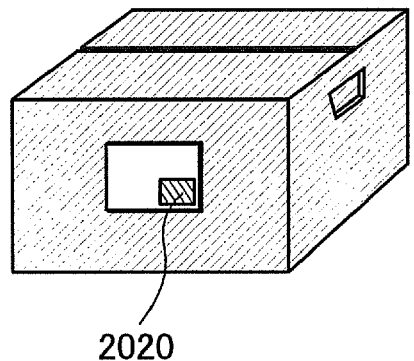

In addition, a semiconductor device having a function for contactless data transmission and reception as well as having an arithmetic function can be manufactured with a semiconductor substrate of the present invention. FIG. 25 is a block diagram illustrating an example of a structure of such a semiconductor device. A semiconductor device 2020 illustrated in FIG. 25 functions as an arithmetic processing unit that operates to transmit and receive signals to and from an external device by wireless communication.

As illustrated in FIG. 25, the semiconductor device 2020 has an analog circuit portion 2021, a digital circuit portion 2022, an antenna 2023, and a capacitor portion 2024. The analog circuit portion 2021 has a resonance circuit 2031 with a resonance capacitor, a constant voltage circuit 2032, a rectifier circuit 2033, a demodulator circuit 2034, a modulator circuit 2035, a reset circuit 2036, an oscillator circuit 2037, and a power supply control circuit 2038. The digital circuit portion 2022 has an RF interface 2041, a control register 2042, a clock controller 2043, a central processing unit (CPU) 2044, a CPU interface 2045, a random-access memory (RAM) 2046, and a read-only memory (ROM) 2047.

The operation of the semiconductor device 2020 is roughly as follows. The resonance circuit 2031 generates an induced electromotive force from a signal received by the antenna 2023. The induced electromotive force is stored in the capacitor portion 2024 through the rectifier circuit 2033. This capacitor portion 2024 is preferably formed using a capacitor such as a ceramic capacitor or an electric double layer capacitor. The capacitor portion 2024 does not need to be integrated with a substrate included in the semiconductor device 2020 and can alternatively be incorporated in the semiconductor device 2020 as a separate component.

The reset circuit 2036 generates a signal for resetting and initializing the digital circuit portion 2022. For example, the reset circuit 2036 generates a signal which rises after rise in the power supply voltage with delay as a reset signal. The oscillator circuit 2037 changes the frequency and duty ratio of a clock signal in response to a control signal generated by the constant voltage circuit 2032. The demodulator circuit 2034 is a circuit which demodulates a received signal, and the modulator circuit 2035 is a circuit which modulates data to be transmitted.

For example, the demodulator circuit 2034 is formed using a low-pass filter and binarizes a received amplitude shift keying (ASK) signal, which is a kind of amplitude-modulated signals, based on its amplitude. In order to vary the amplitude of transmission data by ASK and transmit the data, the modulator circuit 2035 changes the amplitude of a communication signal by changing a resonance point of the resonance circuit 2031.

The clock controller 2043 generates a control signal for changing the frequency and duty ratio of a clock signal in accordance with the power supply voltage or a consumption current of the CPU 2044. The power supply voltage is managed by the power supply control circuit 2038.

A signal input from the antenna 2023 to the semiconductor device 2020 is demodulated by the demodulator circuit 2034 and then decomposed into a control command, data, and the like by the RF interface 2041. The control command is stored in the control register 2042. The control command includes reading of data stored in the read-only memory 2047, writing of data to the random-access memory 2046, an arithmetic instruction to the CPU 2044, and the like.

The CPU 2044 accesses the read-only memory 2047, the random-access memory 2046, and the control register 2042 via the CPU interface 2045. The CPU interface 2045 has a function to generate an access signal for any of the read-only memory 2047, the random-access memory 2046, and the control register 2042 based on an address the CPU 2044 requests.

As an arithmetic method of the CPU 2044, a method may be employed in which the read-only memory 2047 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing may be conducted by a dedicated arithmetic circuit and the other part of the arithmetic processing may be conducted by the CPU 2044 using a program.

Next, applications of the semiconductor device 2020 of this embodiment mode are described. The semiconductor device 2020 illustrated in FIG. 25 has a function to conduct contactless wireless communication and can be used as a wireless IC chip. A wireless IC chip is used while being fixed to various objects.

With reference to FIGS. 26A to 26F, articles to each of which the semiconductor device 2020 is fixed are described. The semiconductor device 2020 is fixed to an article by being mounted on a printed board, attached to a surface of the article, or embedded in the article. When the semiconductor device 2020 is embedded in paper and this paper is used to manufacture bills, securities, bearer bonds, or certificates, an authentication function can be imparted to these pieces of paper, whereby forgery thereof can be prevented. In addition, the semiconductor device 2020 in this state may be embedded in paper or interposed between two plastic substrates, whereby an IC card can be formed.

Moreover, articles such as packaging containers (wrapping paper, bottles, and the like, see FIG. 26C), recording media (DVD software, videotapes, and the like, see FIG. 26B), vehicles (bicycles and the like, see FIG. 26D), personal belongings (bags, glasses, and the like), foods, plants, animals, human bodies, clothes, commodities, products like electronic devices, and tags for baggage (see FIGS. 26E and 26F) can each be provided with the semiconductor device 2020. When the semiconductor device 2020 is mounted on packaging containers, recoding media, personal belongings, foods, clothes, commodities, electronic devices, and the like, efficiency of an inspection system, a management system in a rental shop, or the like can be improved.

Moreover, the semiconductor device 2020 can be used for living creatures such as animals, fish, and human bodies. As described above, the semiconductor device 2020 can be used in a wide variety of applications and can be used for all sorts of objects.

For example, by application of the semiconductor device 2020 to a management and distribution system of objects, a highly functional system can be realized. For example, when the semiconductor device 2020 is mounted on a tag and information stored in this semiconductor device 2020 is read with a reader/writer which is provided beside a conveyor belt, information about manufacture process, distribution process, delivery destination, and the like are read and product inspection and package distribution can be performed with high efficiency. In addition, the semiconductor device 2020 may be provided with a display device so that information stored in the semiconductor device 2020, information received, and the like may be displayed on the display device. With such a structure, a user can check communication results of the semiconductor device 2020 by sight.

A semiconductor device of this embodiment mode and a manufacturing method thereof can be appropriately combined with another embodiment mode.

Embodiment Mode 8

In this embodiment mode, a method for manufacturing a transistor, which is different from that in Embodiment Mode 7, is described. In addition, in this embodiment mode, an active-matrix display device is described as an example of a structure of a semiconductor device. First, a structure of a display device of this embodiment mode is described with reference to FIGS. 27A to 27C. In this embodiment mode, an active-matrix display device is described as the display device.

Figure 27A:
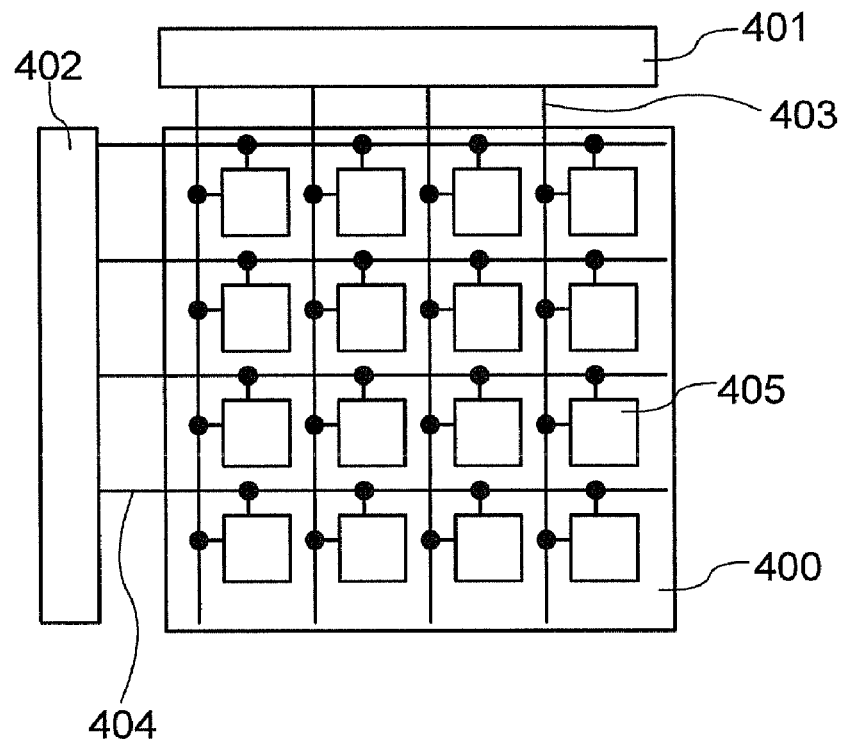
FIGS. 27A to 27C are a block diagram illustrating an example of a structure of an active-matrix display device, a circuit diagram illustrating an example of a structure of a pixel in a liquid crystal display device, and a circuit diagram illustrating an example of a structure of a pixel of an electroluminescent device, respectively.

FIG. 27A is a block diagram illustrating an example of a structure of the active-matrix display device of this embodiment mode. The active-matrix display device of this embodiment mode has a display portion 400, a signal line driver circuit 401, a scan line driver circuit 402, a plurality of signal lines 403 that is connected to the signal line driver circuit 401, and a plurality of scan lines 404 that is connected to the scan line driver circuit 402.

The plurality of signal lines 403 is arranged in a column direction, and the plurality of scan lines 404 is arranged in a row direction to intersect with the signal lines 403. In the display portion 400, a plurality of pixels 405 is arranged in a matrix corresponding to a matrix formed by the signal lines 403 and the scan lines 404. The pixels 405 are connected to the scan lines 404 and the signal lines 403. The pixels 405 each include a switching element and a display element. The switching element controls whether or not the pixel is selected depending on a signal which is input to the scan line 404. The grayscale of the display element is controlled depending on a video signal which is input from the signal line 403.

Figure 27B:
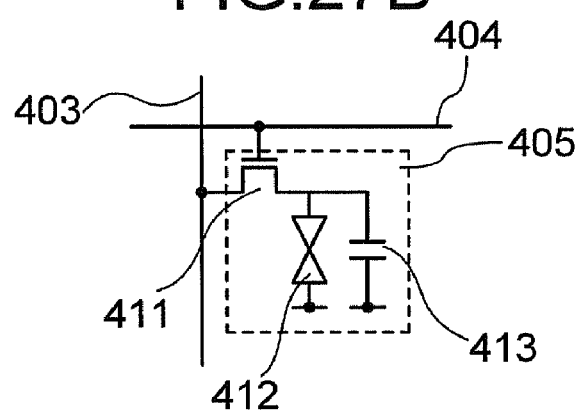

Examples of structures of the pixel 405 are described with reference to FIGS. 27B and 27C. FIG. 27B illustrates an example of a structure of the pixel 405 when the present invention is applied to an active-matrix liquid crystal display device. The pixel 405 has a switching transistor 411 as a switching element and has a liquid crystal element 412 as a display element. A gate of the switching transistor 411 is connected to the scan line 404; one of a source and a drain thereof is connected to the signal line 403; and the other is connected to the liquid crystal element 412.

The liquid crystal element 412 includes a pixel electrode, a counter electrode, and liquid crystal. The orientation of liquid crystal is controlled with an electric field which is generated with the pixel electrode and the counter electrode. The liquid crystal is encapsulated between two substrates. A storage capacitor 413 is an element used to retain the electric potential of the pixel electrode of the liquid crystal element 412 and is connected to the pixel electrode of the liquid crystal element 412.

Figure 27C:
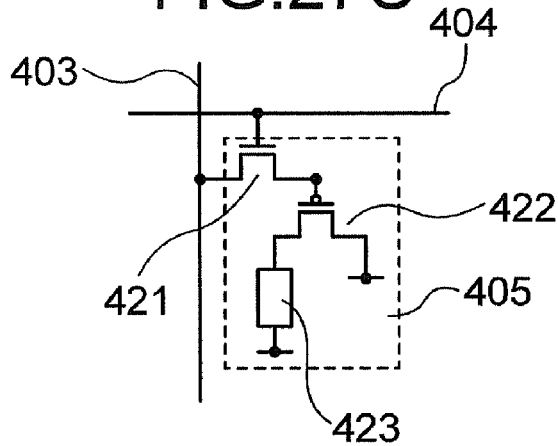

FIG. 27C illustrates an example of a structure of the pixel 405 when the present invention is applied to an active-matrix electroluminescent display device (hereinafter referred to as an "EL display device"). The pixel 405 has a selecting transistor 421 as a switching element and has a light-emitting element 423 as a display element. In addition, the pixel 405 has a display control transistor 422 a gate of which is connected to the selecting transistor 421. The light-emitting element 423 has a pair of electrodes and a light-emitting material which is interposed between the pair of electrodes.

Figure 28:
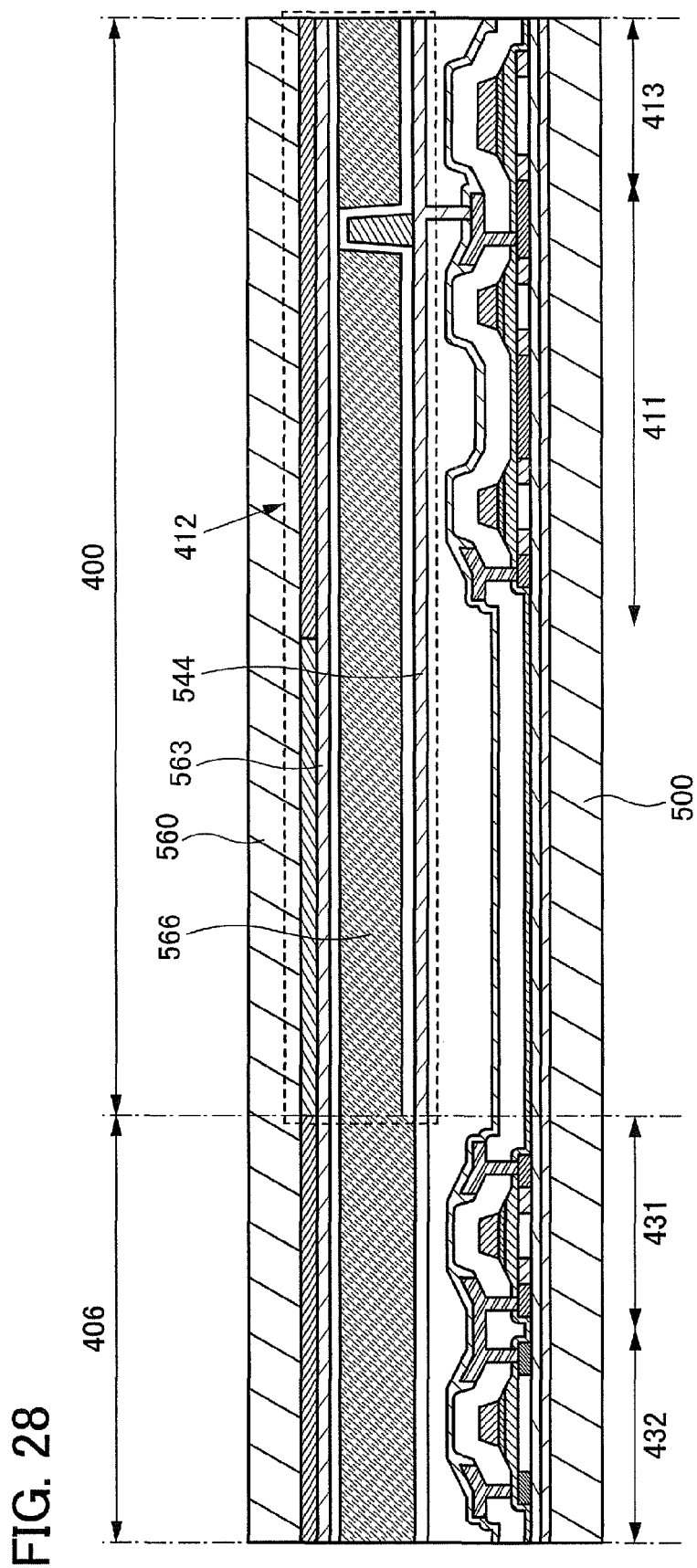
FIG. 28 is a cross-sectional view illustrating an example of a structure of an active-matrix liquid crystal display device.

Next, a method for manufacturing an active-matrix liquid crystal display device having the pixel circuit of FIG. 27B by using a semiconductor substrate having a single crystal semiconductor layer of the present invention is described. In this embodiment mode, the display portion 400 and the signal line driver circuit 401 and the scan line driver circuit 402 which control the display portion 400 are formed over the same semiconductor substrate. FIG. 28 is a cross-sectional view illustrating an example of a structure of the active-matrix liquid crystal display device of this embodiment mode. FIG. 28 illustrates a main portion of the active-matrix display device, in which the switching transistor 411, the liquid crystal element 412, and the storage capacitor 413 are illustrated as the display portion 400. In addition, an inverter circuit including an n-channel transistor (hereinafter referred to as an "n-type transistor") and a p-channel transistor (hereinafter referred to as a "p-type transistor") is illustrated as the signal line driver circuit 401 and the scan line driver circuit 402 (here, these circuits are collectively referred to as a "driver circuit 406").

A method for manufacturing a liquid crystal display device is hereinafter described with reference to FIGS. 29A to 29D, 30A to 30C, and 31A to 31C. FIGS. 29A to 29D, 30A to 30C, and 31A to 31C are cross-sectional views for illustrating the method for manufacturing a liquid crystal display device and are illustrated in a way similar to FIG. 28.

First, a semiconductor substrate is prepared. FIG. 29A is a partial cross-sectional view of a semiconductor substrate. As shown in FIG. 29A, a semiconductor substrate having the same stacked-layer structure as that of the semiconductor substrate 52 of FIGS. 14A and 14B is used in this embodiment mode. In addition, a glass substrate is used as a base substrate, and a single crystal silicon wafer is used for formation of a single crystal semiconductor layer. That is, a glass substrate 500 corresponds to the base substrate 100; an insulating layer 501, the insulating layer 132 which functions as a barrier layer; and an insulating layer 502, the insulating layer 133. A single crystal silicon layer 503 corresponds to the single crystal semiconductor layer 101. Although a plurality of single crystal silicon layers 503 is formed over the glass substrate 500, only one of the single crystal silicon layers 503 is illustrated in FIG. 29A. One or a plurality of display devices can be manufactured using one single crystal silicon layer 503. Alternatively, one display device can be manufactured using a plurality of single crystal silicon layers 503.

Note that a p-type impurity element (an impurity element serving as an acceptor) such as boron, aluminum, or gallium or an n-type impurity element (an impurity element serving as a donor) such as phosphorus or arsenic is preferably added to the single crystal silicon layer 503 in accordance with formation regions of an n-type transistor and a p-type transistor included in the liquid crystal display device.

Next, as illustrated in FIG. 29B, the single crystal silicon layer 503 is etched to form single crystal semiconductor layers 505 to 507 which are isolated in an island shape in accordance with arrangement of semiconductor elements.

Next, as illustrated in FIG. 29C, an insulating layer 510 is formed to cover the single crystal semiconductor layers 505 to 507. The insulating layer 510 is used to form a gate insulating film of a transistor and a dielectric of a capacitor. Then, a conductive film which is used to form an electrode and a wiring is formed over the insulating layer 510. In this embodiment mode, a conductive film having a two-layer structure of a conductive film 511 and a conductive film 512 is formed.

As the insulating layer 510, a film having a single-layer structure or a stacked-layer structure is formed using an insulating layer such as a silicon oxide layer, a silicon oxynitride layer, a silicon nitride layer, or a silicon nitride oxide layer by a CVD method, a sputtering method, an ALE method, or the like.

Note that the insulating layer 510 forms an interface with the single crystal semiconductor layers 505 to 507; thus, a layer in the insulating layer 510 in contact with these single crystal semiconductor layers 505 to 507 is preferably a silicon oxide layer or a silicon oxynitride layer. This is because, if a film in which the amount of nitrogen is larger than that of oxygen, such as a silicon nitride layer or a silicon nitride oxide layer, is formed, there might occur a problem in interface characteristics due to generation of a trap level.

The conductive films 511 and 512 used to form an electrode and a wiring can be formed with a metal film, an alloy film, or a metal compound film. Examples are as follows: metal films of tantalum, tantalum nitride, tungsten, titanium, molybdenum, aluminum, copper, chromium, niobium, and the like; films of alloys of these metal elements; and metal compound films thereof. These films can be formed by a CVD method or a sputtering method.

Examples of combinations of the conductive film 511 with the conductive film 512 are as follows: a tantalum nitride film and a tungsten film; a tungsten nitride film and a tungsten film; a molybdenum nitride film and a molybdenum film; and the like. Note that a stacked-layer film of a tantalum nitride film and a tungsten film is preferable because selectivity between these films is high. Here, a tantalum nitride film with a thickness of 20 nm to 100 nm is formed as the conductive film 511, and a tungsten film having a thickness of 100 nm to 400 nm is formed as the conductive film 512. Note that the conductive film used to form an electrode, a wiring, and the like may be a single-layer film or a stacked-layer film of three or more layers. In the case of a three-layer structure, a stacked-layer structure of a molybdenum layer, an aluminum layer, and a molybdenum layer may be employed.

Next, a resist mask is selectively formed over the conductive film 512. Then, conductive films 515 to 517 each having a two-layer structure are formed by two etching treatments (see FIG. 29D). The conductive film 515 constitutes a part of a capacitor line. The conductive film 516 is the scan line 404. The conductive film 517 is an output wiring for a CMOS inverter circuit.

In the first etching treatment, the conductive films 511 and 512 are etched, whereby stacked-layer films of the conductive films 511 and 512 which have a tapered cross section are formed over the single crystal semiconductor layers 505 to 507. By this etching, lower conductive films 515a to 517a of the conductive films 515 to 517 are formed. Next, while the resist mask is left remaining over the conductive film 512, the second etching treatment is performed. In this etching treatment, only the conductive films 512 are etched to have a smaller width than the conductive films 511, whereby upper conductive films 515b to 517b are formed. After the conductive films 515b to 517b are formed, the resist mask is removed.

Etching treatment for forming the conductive films 515 to 517 can be appropriately selected. In order to increase etching rate, a dry etching apparatus using a high-density plasma source by an electron cyclotron resonance (ECR) method, an inductively coupled plasma (ICP) method, or the like is preferably used.

Next, in order to form n-type low-concentration impurity regions 521 in the single crystal semiconductor layers 505 and 506, a donor impurity element such as phosphorus or arsenic is added by an ion doping method or an ion implantation method (see FIG. 30A). At this time, a resist mask 520 is formed so that the donor impurity element is prevented from being added to the single crystal semiconductor layer 507. The n-type low-concentration impurity regions 521 serve as high-resistance impurity regions.

The addition of a donor impurity element is performed using the upper conductive films 515b to 517b of the conductive films 515 to 517 as masks. That is, a donor impurity element is added in such a manner that the donor impurity element passes through the lower conductive films 515a to 517a. In each of the single crystal semiconductor layers 505 and 506, the n-type low-concentration impurity regions 521 are formed in a self-aligned manner. For example, in the case of adding phosphorus, in order to form high-resistance regions of n-type transistors (411, 431), phosphorus is added so as to be contained in the n-type low-concentration impurity regions 521 at a concentration of approximately $1\times10^{17}$ atoms/cm$^3$ to $5\times10^{18}$ atoms/cm$^3$. After the step of adding the donor impurity element is completed, the resist mask 520 is removed.

Next, source regions and drain regions of the n-type transistors (411, 431) are formed (see FIG. 30B). For this purpose, resist masks 522 are formed to cover the single crystal semiconductor layer 507 and part of the single crystal semiconductor layers 505 and 506. Then, a donor impurity element is added to the single crystal semiconductor layers 505 and 506 using the resist masks 522 as masks by an ion doping method or an ion implantation method, whereby n-type high-concentration impurity regions 523 are formed. Here, phosphorus is added to the single crystal semiconductor layers 505 and 506 to be contained in the n-type high-concentration impurity regions 523 at a concentration of $5\times10^{19}$ atoms/cm$^3$ to $5\times10^{20}$ atoms/cm$^3$. The n-type high-concentration impurity regions 523 function as the source regions and the drain regions of the n-type transistors (411, 431).

In the single crystal semiconductor layers 505 and 506, regions to which the donor impurity element is not added serve as channel formation regions 524 to 526. The two channel formation regions 524 are channel formation regions of the switching transistor 411, and the channel formation region 526 is a channel formation region of the n-type transistor 431. In the storage capacitor 413, the insulating layer 510 is a dielectric, and the conductive film 515 and the channel formation region 525 serve as a pair of electrodes. Moreover, the switching transistor 411 and the storage capacitor 413 are electrically connected to each other through one of the n-type high-concentration impurity regions 523 formed in the single crystal semiconductor layer 505.

Next, after the resist masks 522 are removed, a source region and a drain region of the p-type transistor 432 are formed (see FIG. 30C). For this purpose, resist masks 530 are formed to cover the single crystal semiconductor layers 505 and 506 and part of the single crystal semiconductor layer 507. Then, an acceptor impurity element is added to the single crystal semiconductor layer 507 using the resist masks 530 as masks by an ion doping method or an ion implantation method, whereby p-type high-concentration impurity regions 531 are formed. As the acceptor impurity element, boron, aluminum, gallium, or the like is used. Here, boron is added so that the concentration of boron in the p-type high-concentration impurity regions 531 is approximately $1\times10^{20}$ atoms/cm$^3$ to $5\times10^{21}$ atoms/cm$^3$. In the single crystal semiconductor layer 507, a region to which neither the donor impurity element nor the acceptor impurity element is added serves as a channel formation region 532.

After the resist masks 530 are removed, heat treatment is performed at a temperature equal to or higher than 500° C. and equal to or lower than the strain point of the glass substrate 500 to activate the donor impurity element and the acceptor impurity element added to the single crystal semiconductor layers 505 to 507.

Next, an insulating film 535 is formed over the entire surface of the glass substrate 500 (see FIG. 31A). The insulating film 535 may be a film having a single-layer structure or a stacked-layer structure formed of an inorganic material or an organic material. For example, as a film forming the insulating film 535, a silicon oxide film, a silicon oxynitride film, a silicon nitride film, a silicon nitride oxide film, or the like can be formed by a CVD method or a sputtering method. Moreover, a film such as a polyimide film, a polyamide film, a polyvinylphenol film, a benzocyclobutene film, an acrylic film, an epoxy film, a film formed of a siloxane material like a siloxane resin, or an oxazole resin film can be formed by an application method such as a spin coating method. For example, when the insulating film 535 has a two-layer structure, a silicon nitride oxide film with a thickness of 100 nm is formed as the first layer, and a silicon oxynitride film with a thickness of 900 nm is formed as the second layer.

After contact holes are formed in the insulating film 535, a conductive film having a single-layer structure or a stacked-layer structure is formed. As a film forming this conductive film, a metal film of aluminum, tungsten, titanium, tantalum, molybdenum, nickel, neodymium, or the like; an alloy film containing the above metal element; or a metal compound film of the above metal element can be used. For example, an aluminum alloy film containing titanium, an aluminum alloy film containing neodymium, or the like can be used. When the conductive film has a three-layer structure, a stacked-layer film in which an aluminum film or an aluminum alloy film as described above is interposed between titanium films can be formed, for example.

The conductive film is subjected to etching treatment, whereby conductive films 536 to 540 are formed (see FIG. 31A). The conductive film 536 is the signal line 403. The conductive film 537 is an electrode for electrically connecting the switching transistor 411 and the storage capacitor 413 to the liquid crystal element 412. The conductive film 538 is a source electrode of the n-type transistor 431. The conductive film 539 is a source electrode of the p-type transistor 432. The conductive film 540 is an output wiring of the CMOS inverter.

Next, a passivation film 542 and an insulating film 543 are formed over the entire surface of the glass substrate 500. Here, as the passivation film 542, a silicon nitride film with a thickness of 50 nm to 100 nm is formed by a PECVD method. The insulating film 543 can be formed in a manner similar to the insulating film 535 (see FIG. 31B).

Next, after a contact hole which reaches the conductive film 537 is formed in the passivation film 542 and the insulating film 543, a light-transmitting conductive film is formed over the insulating film 543. This conductive film is etched to form a pixel electrode 544 (see FIG. 31B).

The pixel electrode 544 is a light-transmitting electrode through which light from a backlight unit passes. Accordingly, as the conductive film used to form the pixel electrode 544, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

Then, a columnar spacer 545 is formed in the display portion 400. Next, an alignment film 546 is formed over the entire surface of the glass substrate 500. The spacer 545 can be formed using a photosensitive resin film. The alignment film 546 is formed as necessary. Further, the alignment film 546 is subjected to rubbing treatment as necessary.

Next, a method for manufacturing a counter substrate is described with reference to FIG. 31C. A color filter 561 and a black matrix (BM) 562 are formed over a glass substrate 560. In the display portion 400, the switching transistor 411 and the storage capacitor 413 are shielded from light by the BM 562. Moreover, the driver circuit 406 is also shielded from light by the BM 562.

A counter electrode 563 is formed with a light-transmitting conductive film over the color filter 561 and the BM 562. The conductive film forming the counter electrode 563 can be formed in a manner similar to the pixel electrode 544. Then, an alignment film 564 is formed over the entire surface of the glass substrate 560. The alignment film 564 is formed as necessary. Further, the alignment film 564 is subjected to rubbing treatment as necessary.

Next, a liquid crystal layer 566 is formed between the glass substrate 500 in FIG. 31B and the glass substrate 560 in FIG. 31C, whereby a liquid crystal display device (a liquid crystal module) is completed (see FIG. 28). The liquid crystal element 412 includes the pixel electrode 544, the counter electrode 563, and the liquid crystal layer 566.

There are roughly two methods for forming the liquid crystal layer 566. In one method, an uncured sealing material is formed over one surface of the glass substrate 500 or the glass substrate 560 except for an inlet, the glass substrate 500 and the glass substrate 560 are attached to each other, and the sealing material is cured. Then, a liquid crystal material is injected from the inlet, and after that, the inlet is sealed. In the other method, an uncured sealing material is formed over one surface of the glass substrate 500 or the glass substrate 560.

Then, a liquid crystal material is dropped onto the surface of the substrate over which the sealing material is formed, and after that, the other substrate is attached and the sealing material is cured. Through the above steps, an active-matrix liquid crystal display device is manufactured. Note that only the driver circuit 406 is formed over the glass substrate 500 together with the display portion 400 in this embodiment mode, but a circuit besides the driver circuit 406 can be formed using the single crystal silicon layer 503. Because an element can be formed using the single crystal semiconductor layer 503, a CPU included in an arithmetic circuit, an image processing circuit included in a display control circuit, or the like, for example, can be formed over the glass substrate 500.

Figure 32:
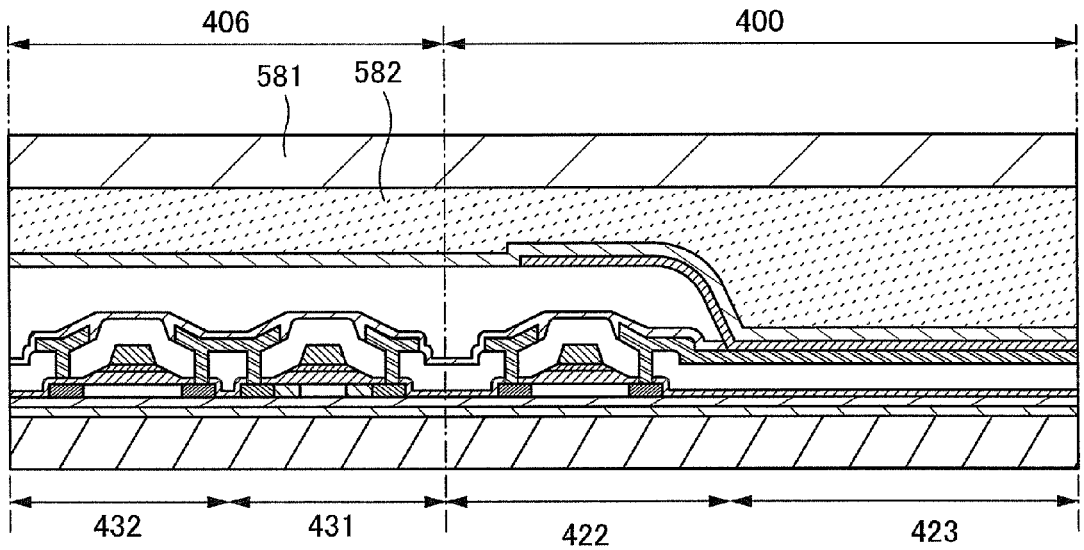
FIG. 32 is a cross-sectional view illustrating an example of a structure of an active-matrix EL display device.

Next, a method for manufacturing an active-matrix EL display device having the pixel circuit of FIG. 27C is described. FIG. 32 is a cross-sectional view illustrating an example of a structure of the active-matrix EL display device of this embodiment mode. FIG. 32 illustrates a main portion of the active-matrix EL display device, in which the display control transistor 422 and the light-emitting element 423 are illustrated as the display portion 400. In addition, an inverter circuit including the n-type transistor 431 and the p-type transistor 432 is illustrated as the driver circuit 406.

Figure 33A:
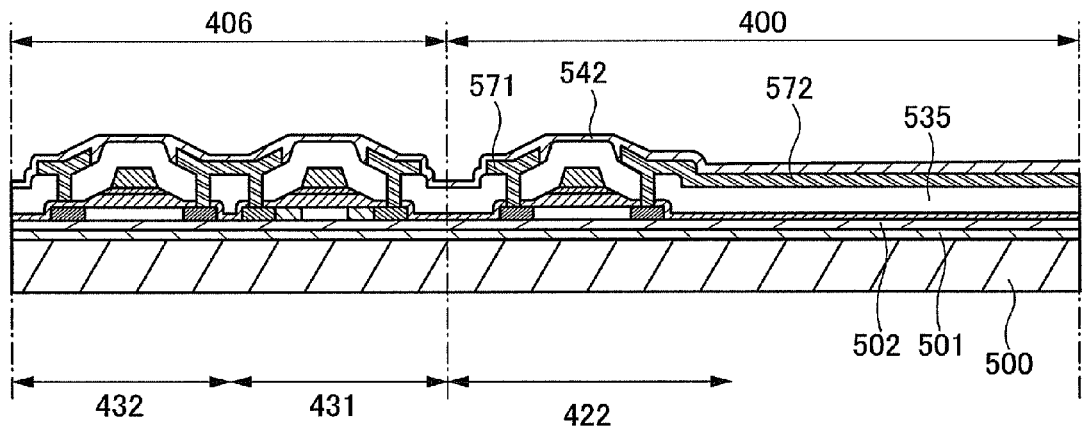
FIGS. 33A and 33B are cross-sectional views illustrating a method for manufacturing an active-matrix EL display device.
Figure 33B:
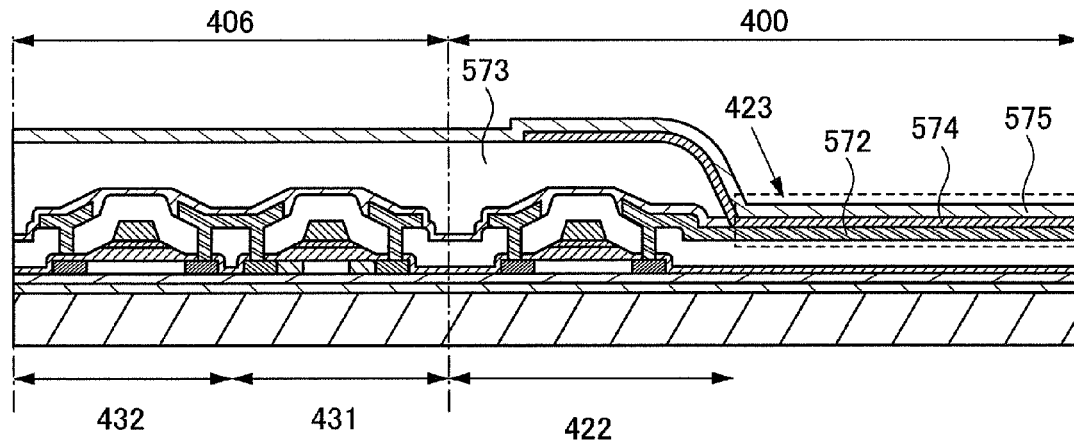

A method for manufacturing an EL display device is hereinafter described with reference to FIGS. 33A and 33B. FIGS. 33A and 33B are cross-sectional views for illustrating the method for manufacturing an EL display device and are illustrated in a way similar to FIG. 32.

First, a transistor and a capacitor of the display portion 400 and transistors, a capacitor, and the like of the driver circuit 406 are manufactured through the steps illustrated in FIGS. 29A to 29D, 30A to 30C, and 31A. The state at that time is illustrated in FIG. 33A. Note that, in the display control transistor 422, a conductive film 571 formed over the insulating film 535 is a power supply line for the light-emitting element. A conductive film 572 is a pixel electrode included in the light-emitting element 423 and functions as a reflective electrode.

Next, an opening portion through which a surface of the conductive film 572 is exposed is formed in the passivation film 542. An insulating film 573 is formed over the passivation film 542 to cover an end portion of the conductive film 572 (see FIG. 33B).

The insulating film 573 is preferably formed using a photosensitive resin. Examples of photosensitive resins include organic materials such as polyimide, polyamide, polyvinylphenol, benzocyclobutene, acrylic, and epoxy. The insulating film 573 functions as a partition film for separating an EL layer of the light-emitting element 423 from the other elements. Next, an EL layer 574 and a counter electrode 575 are formed over the conductive film 572. For the EL layer 574, at least a light-emitting layer is formed. Besides the light-emitting layer, a hole-injecting layer, a hole-transporting layer, an electron-transporting layer, or an electron-injecting layer can be formed as appropriate. The EL layer 574 can be formed by an application method such as an inkjet method or by an evaporation method.

The counter electrode 575 is a light-transmitting electrode. As a conductive film forming the counter electrode 575, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

Through the above steps, the light-emitting element 423 in which the EL layer 574 including at least the light-emitting layer is interposed between the conductive film 572 and the counter electrode 575 is formed (see FIG. 33B).

Next, a glass substrate 581 is fixed to an upper surface of the glass substrate 500 (see FIG. 32). In this embodiment mode, a resin 582 which is a solid is provided between the glass substrate 500 and the glass substrate 581. Instead of the resin 582, an inert gas may be encapsulated between the glass substrate 500 and the glass substrate 581 with a sealing material. Note that a protection film may be formed with a silicon nitride film or the like to cover the counter electrode 575.

Through the above steps, an EL display device is manufactured. Note that, in this embodiment mode, light from the light-emitting element 423 is reflected by the conductive film 572 and extracted from the glass substrate 581 to the outside through the counter electrode 575, whereas light may be extracted from the glass substrate 500 side. In this case, the conductive film 572 is formed with a light-transmitting conductive film, and the counter electrode 575 is formed as a reflective electrode.

A variety of electric devices can be manufactured using the display devices of this embodiment mode. Examples of electric devices are as follows: cameras such as video cameras and digital cameras; navigation systems; sound reproduction devices (such as car audio systems and audio components); computers; game machines; portable information terminals (such as mobile computers, cellular phones, portable game machines, and electronic book readers); image reproduction devices each provided with a storage medium (specifically, devices each provided with a display device that displays image data stored in a storage medium such as a digital versatile disc (DVD) or a hard disk); and the like. Specific modes of electric devices are described with reference to FIGS. 34A to 34H and FIGS. 35A to 35C.

Figure 34A:
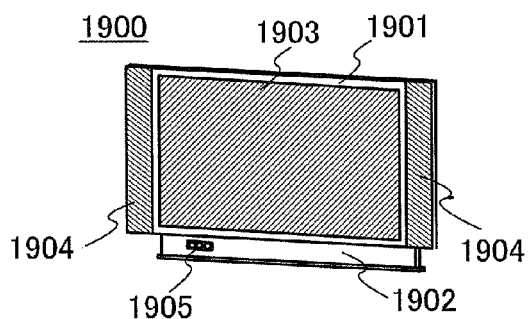
FIGS. 34A to 34H are external views each illustrating an example of a structure of an electronic device (FIG. 34A illustrates a television receiver.

FIG. 34A illustrates an external view of a television receiver 1900, which has a housing 1901 and a support 1902. The housing 1901 is provided with a display portion 1903, speaker portions 1904, video input terminals 1905, and the like. A semiconductor device of the present invention is used in the display portion 1903. With the present invention, the television receiver 1900 capable of displaying high-resolution images can be provided.

Figure 34B:
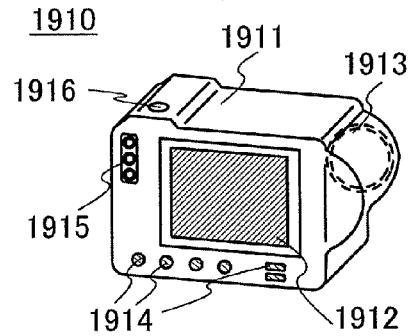

FIG. 34B illustrates an external view of a digital camera 1910. On the front side of a main body 1911, an image receiving portion 1913 is provided, and on the upper side of the main body 1911, a shutter button 1916 is provided. On the back side of the main body 1911, a display portion 1912, operation buttons 1914, and an external connection port 1915 are provided. A semiconductor device of the present invention is used in the display portion 1912. With the present invention, a digital camera having a display portion capable of displaying high-resolution images can be provided.

Figure 34C:
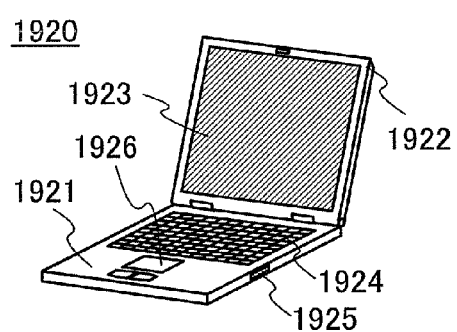

FIG. 34C illustrates an external view of a notebook personal computer 1920, which has a housing 1921 and a housing 1922. The housing 1921 is provided with a keyboard 1924, an external connection port 1925, and a pointing device 1926. The housing 1922 is provided with a display portion 1923. A semiconductor device of the present invention is used in the display portion 1923. With the present invention, a high-performance notebook personal computer can be provided at low cost.

Figure 34D:
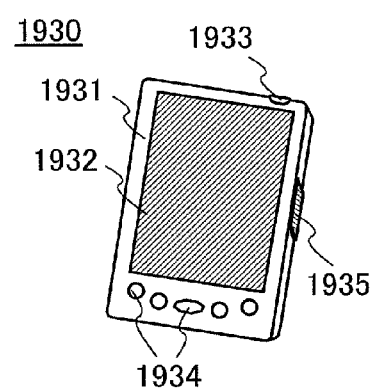

FIG. 34D illustrates an external view of a portable information terminal 1930. A housing 1931 is provided with a display portion 1932, a switch 1933, operation buttons 1934, an infrared port 1935, and the like. A semiconductor device of the present invention is used in the display portion 1932. With the present invention, a portable information terminal having a high-resolution display portion can be provided.

Figure 34E:
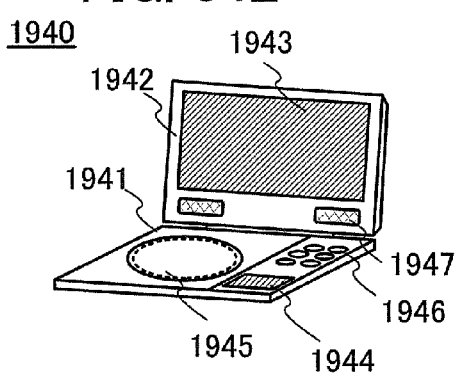

FIG. 34E illustrates an external view of a DVD reproduction device 1940 which is an example of image reproduction devices. The DVD reproduction device 1940 has a housing 1941 and a housing 1942. The housing 1941 is provided with a display portion 1944, a recording media reading portion 1945, operation buttons 1946, and the like. The housing 1942 is provided with speaker portions 1947, a display portion 1943, and the like. A semiconductor device of the present invention is used in each of the display portion 1943 and the display portion 1944. With the present invention, a DVD reproduction device having a high-resolution display portion can be provided.

Figure 34F:
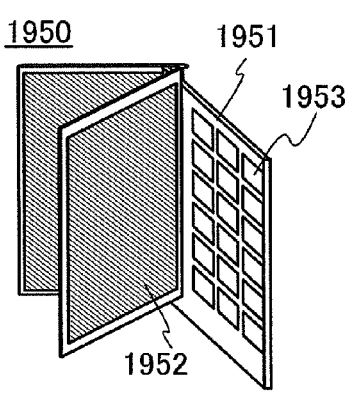

FIG. 34F illustrates an external view of an electronic book reader 1950. A housing 1951 is provided with operation buttons 1953 and a plurality of display portions 1952. A semiconductor device of the present invention is used in each of the display portions 1952. With the present invention, an electronic book reader having a high-resolution display portion can be provided.

Figure 34G:
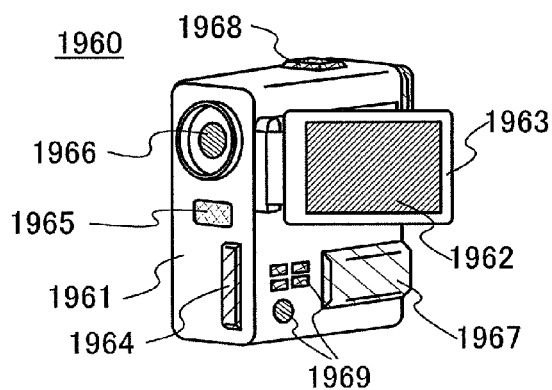

FIG. 34G illustrates an external view of a video camera 1960. A housing 1961 is provided with an external connection port 1964, a remote control receiving portion 1965, an image receiving portion 1966, a battery 1967, an audio input portion 1968, operation keys 1969, and the like. A housing 1961 is mounted with a housing 1963 having a display portion 1962. A semiconductor device of the present invention is used in the display portion 1962. With the present invention, a high-performance video camera can be provided at low cost.

Figure 34H:
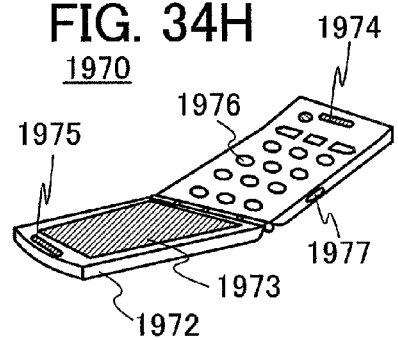

FIG. 34H illustrates an external view of a cellular phone 1970. A housing 1972 is provided with a display portion 1973, an audio input portion 1974, an audio output portion 1975, operation buttons 1976, an external connection port 1977, and the like. The housing 1972 has a built-in antenna and the like. A semiconductor device of the present invention is used in the display portion 1973. With the present invention, a cellular phone having a high-resolution display portion can be provided at low cost. Thus, when the cellular phone 1970 has a built-in receiver for high-definition television broadcasts, high-resolution images can be viewed with the cellular phone.

Figure 35A:
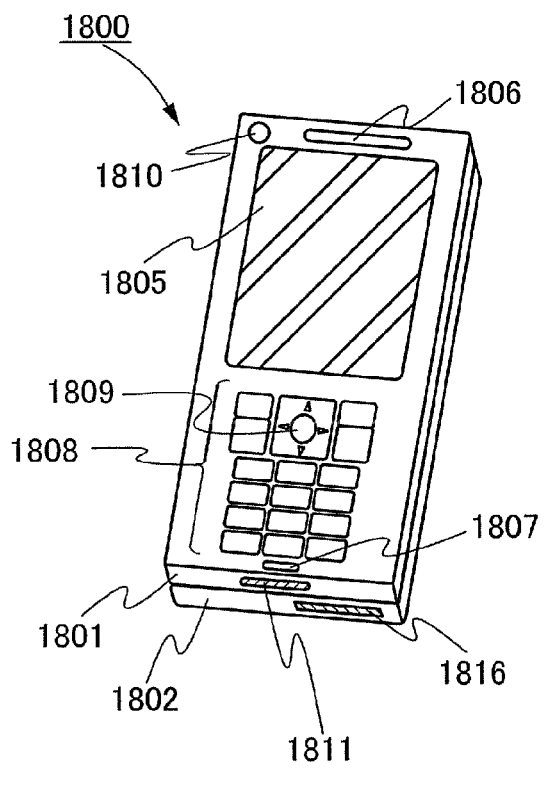
FIGS. 35A to 35C are external views illustrating an example of a structure of a cellular phone (FIG. 35A is a front view.
Figure 35B:
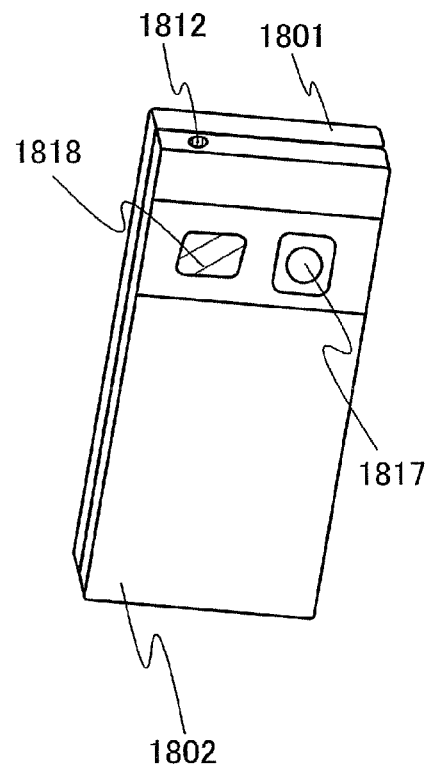
Figure 35C:
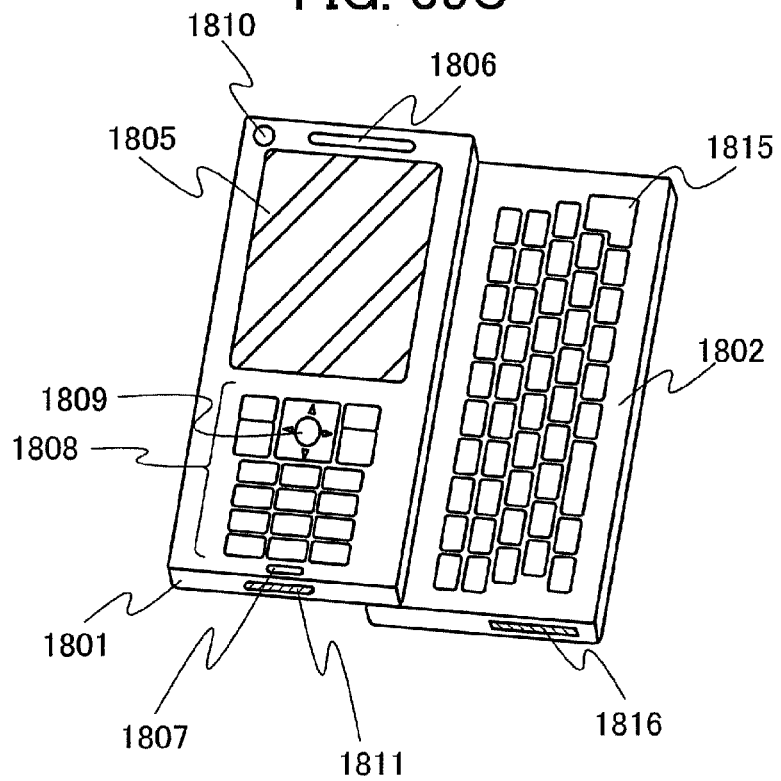

FIGS. 35A to 35C illustrate an example of a structure of a cellular phone 1800 to which the present invention is applied. FIG. 35A illustrates a front view; FIG. 35B, a rear view; and FIG. 35C, a development view. The cellular phone 1800 is a so-called smartphone that has both a function as a telephone and a function as a portable information terminal and incorporates a computer provided to conduct a variety of data processing besides voice calls. The cellular phone 1800 has a built-in camera, with which still images and moving images can be taken.

The cellular phone 1800 has two housings 1801 and 1802. The housing 1801 includes a display portion 1805, a speaker 1806, a microphone 1807, operation keys 1808, a pointing device 1809, a camera lens 1810, an external connection terminal 1811, an earphone terminal 1812, and the like. A semiconductor device of the present invention is used in the display portion 1805, which can display high-quality images. The housing 1802 includes a keyboard 1815, an external memory slot 1816, a camera lens 1817, a light 1818, and the like. In addition, an antenna is incorporated in the housing 1801. Further, in addition to the above components, the cellular phone 1800 may incorporate a contactless IC chip, a small size memory device, or the like. Furthermore, in addition to the above-described functions, the cellular phone 1800 may also have an infrared communication function, a television reception function, or the like.

The display portion 1805 changes the direction of display as appropriate depending on a use mode. Because the camera lens 1810 is provided in the same plane as the display portion 1805, the cellular phone can be used as a videophone. Still images and moving images can be taken with the camera lens 1817 and the light 1818 by using the display portion 1805 as a viewfinder. The speaker 1806 and the microphone 1807 can be used for operations such as video calls, sound recording, and playback without being limited to the voice call function. By operation with the operation keys 1808, operation of incoming and outgoing calls, simple information input for electronic mail or the like, scrolling of a screen, cursor motion, and the like are possible. Further, the housings 1801 and 1802 which are put together to be lapped with each other are developed by sliding as illustrated in FIG. 35C. In the developed state, the cellular phone 1800 can be used as a portable information terminal. In this state, smooth operation can be conducted using the keyboard 1815 or the pointing device 1809. The external connection terminal 1811 can be connected to an AC adaptor and various types of cables such as a USB cable, and charging and data communication with a personal computer or the like are possible. Moreover, a recording medium can be inserted into the external memory slot 1816 so that a large volume of data can be stored and can be moved.

Embodiment 1

Hereinafter, suppression of shrinkage of a glass substrate by division of a single crystal silicon wafer through electromagnetic wave irradiation treatment, and crystallinity improvement and planarization of a single crystal silicon layer through laser irradiation treatment are described. In addition, improvement in reproducibility of laser irradiation treatment by reduction in hydrogen concentration of a single crystal silicon layer through heat treatment performed before laser irradiation treatment is described.

In order to describe the above matters, a method for manufacturing a semiconductor substrate in which a single crystal silicon layer is fixed to a glass substrate by bonding of the glass substrate and a single crystal silicon wafer to each other is described in this embodiment. Note that, in this embodiment, substrate fixing treatment and electromagnetic wave irradiation treatment are performed once; thus, one single crystal silicon wafer is fixed to one glass substrate. With reference to FIGS. 36A, 36B-1 to 36B-3, and 36C to 36I, a method for manufacturing a semiconductor substrate of this embodiment is hereinafter described.

First, a base substrate and a single crystal semiconductor substrate are prepared. FIG. 36A is a cross-sectional view illustrating a step of preparing a base substrate. As the base substrate, a glass substrate 200 was used. The glass substrate 200 is a non-alkaline glass substrate (product name: AN100) with a thickness of 0.7 mm.

FIGS. 36B-1, 36B-2, and 36B-3 are cross-sectional views illustrating the steps of preparing a single crystal semiconductor substrate. As the single crystal semiconductor substrate, a single crystal silicon wafer 210 was used. The single crystal silicon wafer 210 is a square substrate having a size of 5 inches on each side. The conductivity type is a p type, and the resistivity is about 10 Ω·cm. In addition, the crystal orientation on its main surface is (100) and that on its side surface is <110>.

In this embodiment, a buffer layer is formed over the single crystal silicon wafer 210 with three insulating films. As the buffer layer, a silicon oxynitride film 201, a silicon nitride oxide film 202, and a silicon oxide film 203 were formed over a surface of the single crystal silicon wafer 210. The thickness of each film is as follows.

Silicon oxynitride film 201: 100 nm
Silicon nitride oxide film 202: 50 nm
Silicon oxide film 203: 50 nm After the single crystal silicon wafer 210 was cleaned, the silicon oxynitride film 201 with a thickness of 100 nm and the silicon nitride oxide film 202 with a thickness of 50 nm were formed over a surface of the single crystal silicon wafer 210 by a PECVD method (see FIG. 36B-1). The silicon oxynitride film 201 was formed under conditions where a process gas was $SiH_4$ and $N_2O$, its flow rate ratio was $SiH_4\backslash N_2O=4\backslash 800$, and the substrate temperature during the film formation step was 400° C. The silicon nitride oxide film 202 was formed under conditions where a process gas was $SiH_4$, $NH_3$, $N_2O$, and $H_2$, its flow rate ratio was $SiH_4\backslash NH_3\backslash N_2O\backslash H_2=10\backslash 100\backslash 20\backslash 400$, and the substrate temperature during the film formation step was 300° C.

Next, the single crystal silicon wafer 210 is irradiated with hydrogen ions 204 to form a damaged region 205 (see FIG. 36B-2). In this step, an ion doping apparatus was used, and a 100% hydrogen gas ($H_2$ gas) was used as a source gas for the hydrogen ions 204. The single crystal silicon wafer 210 was irradiated with ions in plasma produced by excitation of the hydrogen gas which were accelerated by an electric field without being subjected to mass separation, whereby a damaged region 205 was formed. By excitation of a hydrogen gas in the ion doping apparatus, three kinds of ion species, $H^+$, $H_2^+$, and $H_3^+$, were produced. The single crystal silicon wafer 210 was irradiated with these ion species.

Next, the silicon oxide film 203 with a thickness of 50 nm was formed over the silicon nitride oxide film 202 by a PECVD method (see FIG. 36B-3). A process gas used to form the silicon oxide film 203 was TEOS and $O_2$, and the temperature during the film formation step was 300° C. Here, the single crystal silicon wafer 210 provided with the films 201 to 203 and the damaged region 205 is referred to as a "donor substrate 211."

FIG. 36C is a cross-sectional view illustrating substrate fixing treatment. After the glass substrate 200 and the single crystal silicon wafer 210 provided with the films 201 to 203 were subjected to ultrasonic cleaning in pure water and were then cleaned with ozone-containing pure water, a surface of the glass substrate 200 and the silicon oxide film 203 formed over the surface of the single crystal silicon wafer 210 were disposed in contact with each other and bonded to each other (see FIG. 36C).

Next, in order to cleave the single crystal silicon wafer 210 (the donor substrate 211) along the damaged region 205, the single crystal silicon wafer 210 (the donor substrate 211) was irradiated with electromagnetic waves 206. FIG. 36D is a cross-sectional view illustrating electromagnetic wave irradiation treatment. A layer denoted by reference numeral 207 in FIG. 36D is a single crystal silicon layer 207 which is separated from the single crystal silicon wafer 210. Here, a semiconductor substrate which is manufactured through the steps to the electromagnetic wave irradiation treatment is referred to as a "semiconductor substrate x."

In this embodiment, two kinds of the electromagnetic waves 206 were used for irradiation. One kind is electromagnetic waves having a frequency of 2.45 GHz (with a wavelength of about 12 cm), and the other is electromagnetic waves having a frequency of 28 GHz (with a wavelength of about 1 mm). When the temperature of the single crystal silicon wafer 210 is raised to 300° C. to 350° C. by irradiation with the electromagnetic waves 206, cleavage of the single crystal silicon wafer 210 occurs along the damaged region 205. During irradiation with the electromagnetic waves 206, no intentional temperature control such as heating or cooling of the glass substrate 200 and the donor substrate 211 is performed.

Unless otherwise specified, the electromagnetic waves 206 used for irradiation in the electromagnetic wave irradiation treatment are hereinafter referred to as "microwaves" when having a frequency of 2.45 GHz and "millimeter waves" when having a frequency of 28 GHz.

Next, the semiconductor substrate x was subjected to laser irradiation treatment. Alternatively, the semiconductor substrate x was subjected to laser irradiation treatment after being subjected to heat treatment to reduce hydrogen contained in the single crystal silicon layer 207.

FIG. 36E is a cross-sectional view illustrating the heat treatment of the semiconductor substrate x. The heat treatment was performed in a heating furnace. First, the semiconductor substrate x was heated in a heating furnace at 500° C. for one hour and successively heated at 550° C. for four hours. FIG. 36E illustrates that a hydrogen gas 209 is released into a gas phase from the single crystal silicon layer 207 by heating of the single crystal silicon layer 207. Here, the semiconductor substrate x after the heat treatment is referred to as a "semiconductor substrate y" and the single crystal silicon layer 207 after the heat treatment is referred to as a "single crystal silicon layer 208."

The laser irradiation treatment of the semiconductor substrate x and that of the semiconductor substrate y were performed in a similar manner. FIGS. 36F and 36G are a cross-sectional view illustrating the laser irradiation treatment step of the semiconductor substrate x and that of the semiconductor substrate y, respectively.

The single crystal silicon layer 207 or the single crystal silicon layer 208 was melted and recrystallized by being irradiated with laser light 212. As a laser, a XeCl excimer laser which emits a beam having a wavelength of 308 nm was used. The pulse width of the laser light 212 is 25 nsec, and the repetition rate is 30 Hz. Through an optical system, the laser light 212 was collected such that it has a linear beam shape on an irradiation surface, and scanning with the laser light 212 was performed in a width direction (a short-axis direction of the beam shape). During laser irradiation, the semiconductor substrate x and the semiconductor substrate y were not heated and were at room temperature. In other words, no intentional temperature control of the semiconductor substrate x and the semiconductor substrate y was performed.

Note that, before the laser irradiation treatment was performed, the semiconductor substrate x and the semiconductor substrate y were cleaned with pure water, and the single crystal silicon layers 207 and 208 were treated with a 100-fold diluted hydrofluoric acid to remove natural oxide films that were formed on their surfaces.

Here, the semiconductor substrate x after the laser irradiation treatment is referred to as a "semiconductor substrate A" (see FIG. 36H) and the semiconductor substrate y after the laser irradiation treatment is referred to as a "semiconductor substrate B" (see FIG. 36I). In addition, the single crystal silicon layer 207 after the laser irradiation treatment is referred to as a "single crystal silicon layer 215" and the single crystal silicon layer 208 after the laser irradiation treatment is referred to as a "single crystal silicon layer 216."

The single crystal silicon layers of the semiconductor substrates manufactured by the method of this embodiment were subjected to Raman spectrum measurement, optical microscopic observation, and hydrogen concentration measurement. The results of measurement are described in the following embodiments.

Embodiment 2

In this embodiment, suppression of shrinkage of a glass substrate by division of a single crystal silicon wafer through electromagnetic wave irradiation treatment is described. In this embodiment, the shrinkage of a glass substrate 200 of a semiconductor substrate x-1 after electromagnetic wave irradiation treatment was measured.

Note that, in order to distinguish the semiconductor substrates (x, y, A, and B) that are manufactured under the same conditions from each other in the description of Embodiments 2 to 5, the semiconductor substrates are referred to as a "semiconductor substrate x-1" and the like with numbers such as "-1" after the letters that are used for distinction between the semiconductor substrates.

In order to measure the shrinkage caused by the substrate fixing treatment, the donor substrate 211 was provided with an alignment mark before being bonded to the glass substrate 200. The donor substrate 211 provided with the alignment mark was bonded to the glass substrate 200 and then subjected to the electromagnetic wave irradiation treatment, whereby the semiconductor substrate x-1 was manufactured. A shrinkage was calculated from a shift of the alignment marker of the semiconductor substrate x-1. In addition, as a comparative example, a semiconductor substrate z-1 was manufactured by division of the single crystal silicon wafer 210 through heat treatment at 600° C. in a heating furnace, and the shrinkage of the glass substrate 200 of the semiconductor substrate z-1 was also calculated.

Figure 37A:
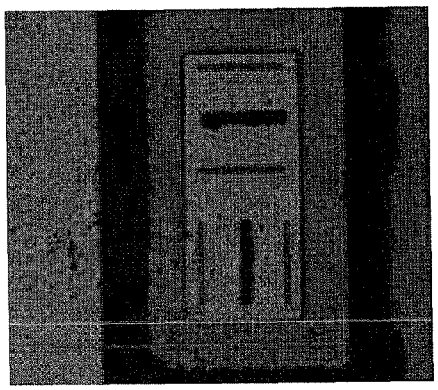
FIGS. 37A and 37B are optical photomicrographs of a single crystal silicon layer (FIG. 37A illustrates a semiconductor substrate after electromagnetic wave irradiation treatment.
Figure 37B:
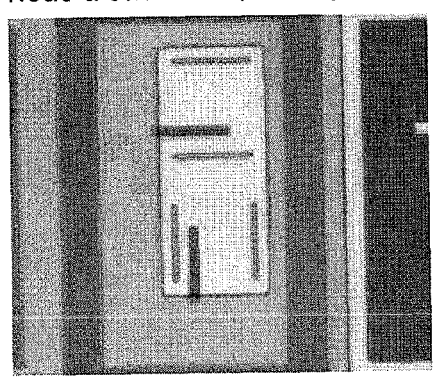
Figure 38A:
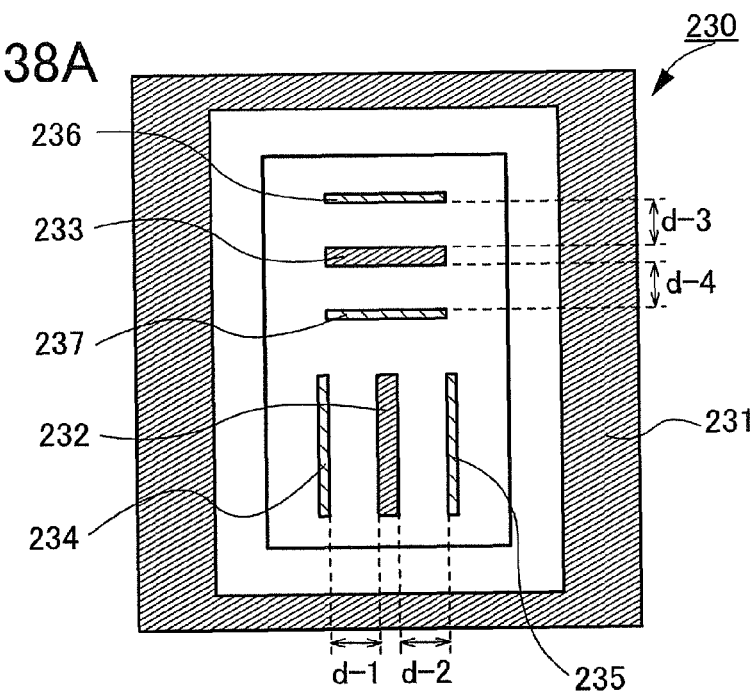
FIGS. 38A and 38B are diagrams each illustrating an alignment marker.
Figure 38B:
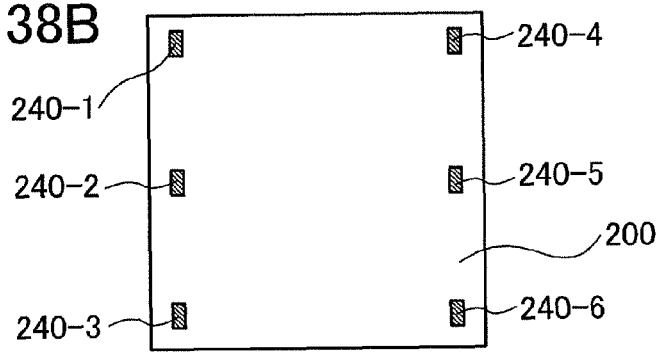

FIG. 37A is an optical photomicrograph of the semiconductor substrate x-1, and FIG. 37B is an optical photomicrograph of the semiconductor substrate z-1 of the comparative example. FIG. 38A is a plan view of an alignment mark 230 formed on each of the semiconductor substrates x-1 and z-1, and FIG. 38B is a plan view illustrating a position where the alignment mark 230 is formed.

Conditions of hydrogen ion doping for formation of the damaged region 205 of the semiconductor substrate x-1 were that the acceleration voltage was 50 kV and the dose was $3.5 \times 10^{16}$ ions/cm$^3$. As an ion doping apparatus, an apparatus in which a filament is used as a plasma discharge electrode was used. In the electromagnetic wave irradiation treatment, irradiation was performed with microwaves having a frequency of 2.45 GHz for three minutes. The power of microwaves was 900 W. The thickness of the single crystal silicon layer 207 of the semiconductor substrate x-1 was about 100 nm.

In the manufacturing process of the semiconductor substrate z-1 of the comparative example, the donor substrate 211 was manufactured under the same conditions as those for the semiconductor substrate x-1 and fixed to the glass substrate 200, while heat treatment at 600° C. with a low-pressure CVD apparatus (hereinafter referred to as an "LPCVD apparatus") was performed instead of the electromagnetic wave irradiation treatment to divide the single crystal silicon wafer 210. The atmosphere of a chamber of the LPCVD apparatus was a nitrogen atmosphere, and the glass substrate 200 to which the donor substrate 211 was bonded was placed in the chamber. First, the temperature was raised to 200° C., at which the donor substrate 211 was heated for two hours. Then, the heating temperature was raised to 600° C., at which the donor substrate 211 was heated for two hours. After that, the heating temperature was lowered to 400° C., at which the divided single crystal silicon wafer 210 and the glass substrate 200 to which the single crystal silicon layer was fixed (that is, the semiconductor substrate z-1) were taken out of the chamber.

The semiconductor substrate x-1 and the semiconductor substrate z-1 were each provided with the alignment mark 230 before the single crystal silicon wafer 210 was divided. The alignment mark 230 includes marks 231 to 237 which are formed on the upper surface of the glass substrate 200 (see FIG. 38A). The marks 231, 232, and 233 are formed of a resist, and the marks 234, 235, 236, and 237 are each formed with a stacked-layer film of the silicon oxynitride film 201, the silicon nitride oxide film 202, and the silicon oxide film 203. As illustrated in FIG. 38B, three alignment marks 230 are formed on one side of the glass substrate 200 and another three are formed on the opposite side. Regions 240-1 to 240-6 in FIG. 38B represent regions where the alignment marks 230 are formed.

The alignment marks 230 were formed as follows. After the donor substrate 211 was formed, the single crystal silicon wafer 210 was removed by etching from the region where the alignment mark 230 was to be formed. Then, the donor substrate 211 where the single crystal silicon wafer 210 was partly removed and the glass substrate 200 were bonded to each other (see FIG. 36C). In this situation, the single crystal silicon wafer 210 was not present in each of the regions 240-1 to 240-6 of the glass substrate 200, and the stacked-layer film of the silicon oxynitride film 201, the silicon nitride oxide film 202, and the silicon oxide film 203 was present. This stacked-layer film was etched, whereby the marks 234, 235, 236, and 237 illustrated in FIG. 38A were formed in each of the regions 240-1 to 240-6. In addition, the marks 231, 232, and 233 were formed of a resist in each of these regions 240-1 to 240-6 by a photolithography step. Through the above steps, the alignment mark 230 was formed in each of the regions 240-1 to 240-6.

As is clear from a comparison between FIG. 37A and FIG. 37B, there is little shift of the alignment mark 230 of the semiconductor substrate x-1 that is obtained by division of the single crystal silicon wafer 210 through the electromagnetic wave irradiation treatment. On the other hand, the alignment mark 230 of the semiconductor substrate z-1 subjected to the heat treatment at 600° C. is shifted longitudinally and laterally. Note that neither of the glass substrates 200 used in the semiconductor substrates x-1 and z-1 was subjected to heat treatment at a high temperature of 600° C. or higher for causing the glass substrate 200 to shrink in advance.

The shrinkage of the glass substrate 200 is calculated from distances (d-1, d-2, d-3, and d-4) between two marks of the alignment mark 230 (see FIG. 38A). In this embodiment, of each of the alignment marks 230 that were formed at the four corners (in the regions 240-1, 240-3, 240-4, and 240-6) of the glass substrate 200, the lateral shrinkage was calculated from the distances d-1 and d-2 and the longitudinal shrinkage was calculated from the distances d-3 and d-4.

The longitudinal and lateral shrinkages of the semiconductor substrate x-1 were each approximately 16 ppm. On the other hand, the longitudinal and lateral shrinkages of the semiconductor substrate z-1 were each 160 ppm or more. That is, by division of the single crystal silicon wafer 210 through the electromagnetic wave irradiation treatment instead of the heat treatment at 600° C. or higher, the shrinkage of the glass substrate 200 can be drastically reduced to $\frac{1}{10}$ or less.

Even if the substrate fixing treatment and the electromagnetic wave irradiation treatment are repeated, a glass substrate hardly shrinks through the electromagnetic wave irradiation treatment. Thus, a method for manufacturing a semiconductor substrate of the present invention allows a single crystal silicon wafer to be fixed to a glass substrate with high positioning accuracy even in the second or later substrate fixing treatment.

The reason why the shrinkage of the glass substrate 200 can be suppressed in the electromagnetic wave irradiation treatment is that the glass substrate 200 is not heated to 400° C. or higher. FIG. 39A is a graph showing changes in temperature of a single crystal silicon wafer when the single crystal silicon wafer is irradiated with microwaves having a frequency of 2.45 GHz, and FIG. 39B is a graph showing changes in temperature of the donor substrate 211 when the donor substrate 211 is irradiated with millimeter waves having a frequency of 28 GHz.

The temperatures in FIG. 39A were measured as follows. With a microwave irradiation apparatus, the single crystal silicon wafer was irradiated with microwaves for three minutes to ten minutes. Immediately after the irradiation with microwaves, a door of the apparatus was opened, and the temperature of the single crystal silicon wafer placed in the apparatus was measured with a radiation thermometer. The irradiation with microwaves was performed for 180 seconds (3 minutes), 300 seconds (5 minutes), 600 seconds (10 minutes), and 900 seconds (15 minutes). The powers of the microwaves were 300 W, 450 W, and 900 W.

As shown in FIG. 39A, it can be seen that the temperature of the single crystal silicon wafer does not reach or exceed 350° C. even when the single crystal silicon wafer is irradiated with microwaves for ten minutes or more. Thus, as can also be seen from the fact that the glass substrate 200 hardly absorbs microwaves, the temperature of the glass substrate 200 to which the donor substrate 211 (the single crystal silicon wafer) is bonded also does not exceed 350° C. due to microwave irradiation.

The temperatures in FIG. 39B were measured as follows. With the use of a millimeter wave heating apparatus (FMW-10-28 manufactured by Fujidempa Kogyo Co., Ltd.), the glass substrate 200 to which the donor substrate 211 was bonded was irradiated with millimeter waves having a frequency of 28 GHz (with a wavelength of about 1 mm). While millimeter wave irradiation was performed, changes in temperature of the single crystal silicon wafer 210 were measured with a thermocouple in the apparatus. FIG. 39B also shows changes in power of millimeter waves over time. In this temperature measurement, the maximum temperature was set to 350° C. and the power of millimeter waves was adjusted with a program of the apparatus so that the maximum temperature (350° C.) was maintained for two minutes. By irradiation with millimeter waves under this condition, the single crystal silicon wafer 210 was divided. From the fact that the glass substrate 200 hardly absorbs millimeter waves, it can be seen that the single crystal silicon wafer 210 can be divided by millimeter wave irradiation without heating of the glass substrate 200 to 400° C. or higher. Note that, when millimeter wave irradiation was performed with the maximum temperature of the single crystal silicon wafer 210 set to 300° C., the single crystal silicon wafer 210 was not divided.

As described above, with the use of electromagnetic waves of 300 MHz to 300 GHz for division of a single crystal semiconductor substrate, shrinkage of a glass substrate can be significantly suppressed as compared to conventional heat treatment with a heating furnace or an RTA apparatus (treatment for heating an object by radiation or heat conduction). In addition, the treatment time is very short, which is five minutes or less. Thus, the electromagnetic wave irradiation treatment is very useful dividing treatment for a method for manufacturing a semiconductor substrate in which one base substrate is subjected to a plurality of treatments for dividing single crystal semiconductor substrates.

Embodiment 3

In this embodiment, the crystallinity of a single crystal silicon layer 216 of a semiconductor substrate B-2 (see FIG. 36I) is evaluated. In order to evaluate crystallinity, Raman spectroscopy and optical microscopic observation were performed. In addition, in this embodiment, the influence of hydrogen concentration in a single crystal silicon layer subjected to laser irradiation treatment on the effect of the laser irradiation treatment is described.

First, a method for manufacturing the semiconductor substrate B-2 is described. Conditions of hydrogen ion doping for formation of the damaged region 205 were that the acceleration voltage was 45 kV and the dose was $3.5 \times 10^{16}$ ions/cm$^3$. As an ion doping apparatus, an apparatus which generates plasma discharge with high frequency waves was used. In the electromagnetic wave irradiation treatment, irradiation with microwaves (with a frequency of 2.45 GHz) was performed. The apparatus used is the microwave heating apparatus with which the temperatures in FIG. 39A were measured. With a power of 900 W, the single crystal silicon wafer 210 was divided by being irradiated with microwaves for two minutes, whereby a semiconductor substrate x-2 was manufactured (see FIG. 36D). The thickness of the single crystal silicon layer 207 of the semiconductor substrate x-2 was about 90 nm.

This semiconductor substrate x-2 was heat-treated in a heating furnace, whereby a semiconductor substrate y-2 was manufactured (see FIG. 36E). In the heating furnace, the semiconductor substrate was heated at 500° C. for one hour and further at 550° C. for four hours. The single crystal silicon layer 208 of this semiconductor substrate y-2 was irradiated with excimer laser light, whereby the semiconductor substrate B-2 was manufactured. Conditions of the laser irradiation treatment were as follows.

As a laser, a XeCl excimer laser which emits a beam having a wavelength of 308 nm was used. The pulse width of laser light was 25 nanoseconds, and the repetition rate was 30 Hz. The scanning rate was 1.0 mm/sec. This scanning rate is a condition under which one region is irradiated with about ten shots of pulses with a laser beam pulse overlap percentage of 90%. In order to obtain a nitrogen gas atmosphere, laser light irradiation was performed while a nitrogen gas was blown onto a surface irradiated with laser light.

In this embodiment, a semiconductor substrate β-2 was manufactured as a comparative example. The semiconductor substrate β-2 is a substrate manufactured under the same conditions as those for the semiconductor substrate B-2 except that the heat treatment before the laser irradiation treatment is not performed. That is, a substrate manufactured by subjecting the semiconductor substrate x-2 to the laser irradiation treatment is the semiconductor substrate β-2.

With the irradiation energy density of laser light varying in the laser irradiation treatment, the effect of the laser irradiation treatment on the semiconductor substrates B-2 and β-2 was checked. The irradiation energy densities of laser light are as follows.

497 mJ/cm$^2$
521 mJ/cm$^2$
544 mJ/cm$^2$
568 mJ/cm$^2$
592 mJ/cm$^2$
616 mJ/cm$^2$
639 mJ/cm$^2$ 661 mJ/cm$^2$
683 mJ/cm$^2$
704 mJ/cm$^2$

Figure 40A:
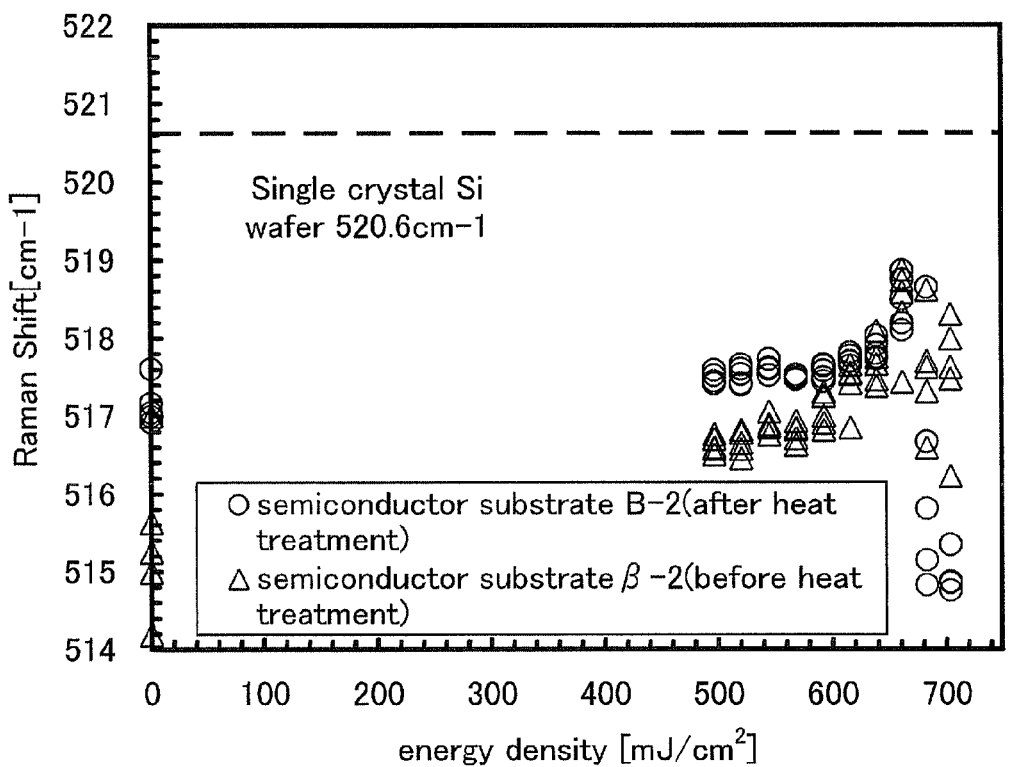
FIGS. 40A and 40B illustrate results of Raman spectroscopy of a single crystal silicon layer of a semiconductor substrate.
Figure 40B:
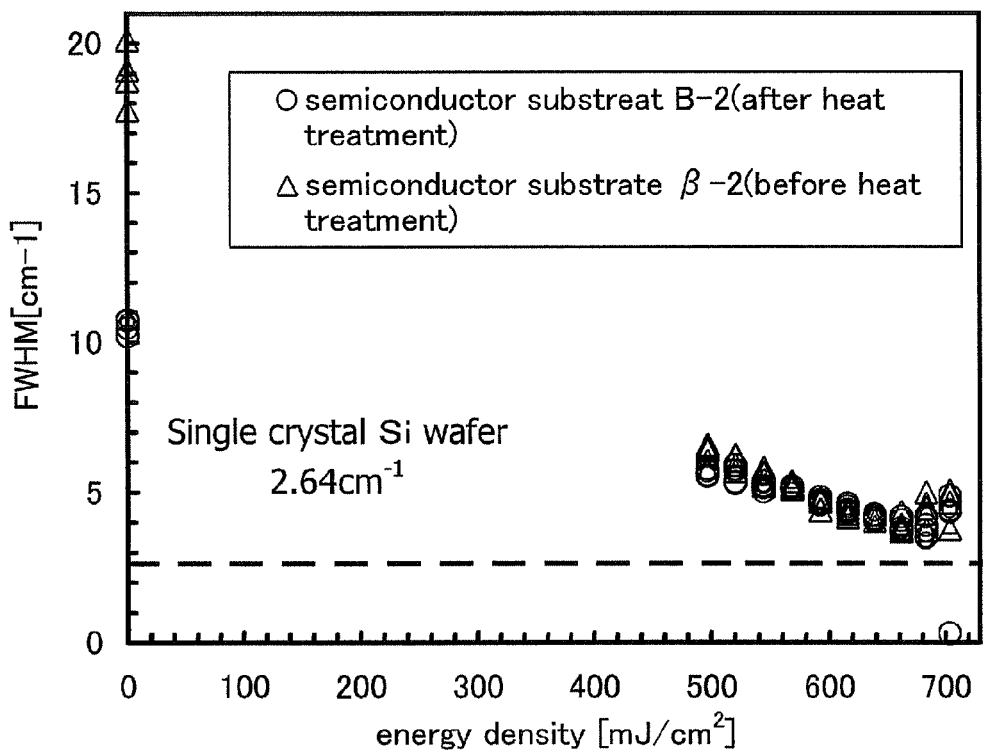

FIGS. 40A and 40B show the results of Raman spectroscopy of single crystal silicon layers in the semiconductor substrates B-2 and β-2. FIG. 40A is a graph of Raman shift, and FIG. 40B is a graph of full width at half maximum (FWHM) of Raman spectrum. The horizontal axis of the graph represents irradiation energy density of laser light, and data at an energy density of 0 mJ/cm$^2$ is data of the single crystal silicon layers before the laser irradiation treatment. The Raman spectrum was measured at five points in each single crystal silicon layer irradiated with laser light having the same irradiation energy density.

FIG. 41 shows optical photomicrographs, which are dark field images, of the single crystal silicon layers of the semiconductor substrates B-2 and β-2. The observation magnification is 100 times. The values added to the photographs are irradiation energy densities of laser light.

The peak wavenumber (also referred to as a peak value) of Raman shift shown in FIG. 40A is a value determined by the mode of vibration occurring in a crystal lattice and is a specific value depending on the kind of crystal. The Raman shift of single crystal silicon without any internal stress is 520.6 cm$^{-1}$. If the Raman shift of silicon is closer to this wavenumber, it can be determined that the crystal structure is closer to that of a single crystal and the crystallinity is higher. Thus, the Raman shift can be used as an index for evaluation of crystallinity.

A smaller FWHM shown in FIG. 40B indicates that a crystal state is more uniform with less variation. The FWHM of the single crystal silicon wafer used is 2.64 cm$^{-1}$. If the FWHM of a single crystal silicon layer is closer to this value, it can be determined that the crystallinity is more uniform like that of a single crystal silicon wafer. Thus, the FWHM can be used as an index for evaluation of crystallinity.

It can be seen from the graphs of FIGS. 40A and 40B (the results of Raman spectroscopy) that the crystallinity of a single crystal silicon layer can be improved and recovered by laser irradiation treatment to the same or substantially the same degree as that of a single crystal silicon wafer before processing. It can also be seen from the results of Raman spectroscopy that the crystallinity of the single crystal silicon layer of the semiconductor substrate B-2 which has been subjected to the heat treatment can be recovered at a lower energy density than that of the semiconductor substrate β-2.

In addition, it can be seen from a comparison of data between the semiconductor substrate B-2 and the semiconductor substrate β-2 obtained when the energy density is 0 mJ/cm$^2$ that the crystallinity of a single crystal silicon layer is improved through heat treatment. By improvement of crystallinity of a single crystal silicon layer through heat treatment at 500° C. or higher before laser irradiation treatment, the irradiation energy of laser light needed for laser irradiation treatment can be reduced. Thus, such heat treatment is preferably performed.

The optical photomicrographs in FIG. 41 are dark field images of the single crystal silicon layers which were measured by Raman spectrometry as in FIGS. 40A and 40B. Dark field observation is a method in which a sample is irradiated with light from an oblique direction and scattered light and diffracted light from the sample are observed. In the case where a sample has a planar surface, scattering and diffraction of irradiation light do not occur; accordingly, the observed image is black. For the semiconductor substrate B-2, the irradiation energy density is 521 mJ/cm$^2$ to 661 mJ/cm$^2$, and the dark field image of the single crystal silicon layer is black in a color photograph. This means that a single crystal silicon layer can be planarized by being irradiated with laser light. Note that the irradiation energy density of laser light has a threshold for achievement of planarization, which is because the single crystal silicon layer needs to be melted.

On the other hand, there are no black dark field images of the semiconductor substrate β-2. This results from the presence of a large amount of hydrogen in the single crystal silicon layer of the semiconductor substrate x-2 before the laser irradiation treatment because the semiconductor substrate β-2 is not subjected to heat treatment. When hydrogen blows out of a single crystal silicon layer due to laser light irradiation, a surface of the single crystal silicon layer cannot be planarized. That is, crystallinity improvement and planarization with high reproducibility through laser irradiation treatment are affected by hydrogen concentration of a single crystal silicon layer.

The hydrogen concentrations in the single crystal silicon layers (207, 208) of the semiconductor substrates x-2 and y-2 before the laser irradiation treatment were measured. In addition, the hydrogen concentrations in the single crystal silicon layers of the semiconductor substrates B-2 and β-2 after the laser irradiation treatment were measured. The hydrogen concentrations were measured by secondary ion mass spectrometry (SIMS).

Figure 42:
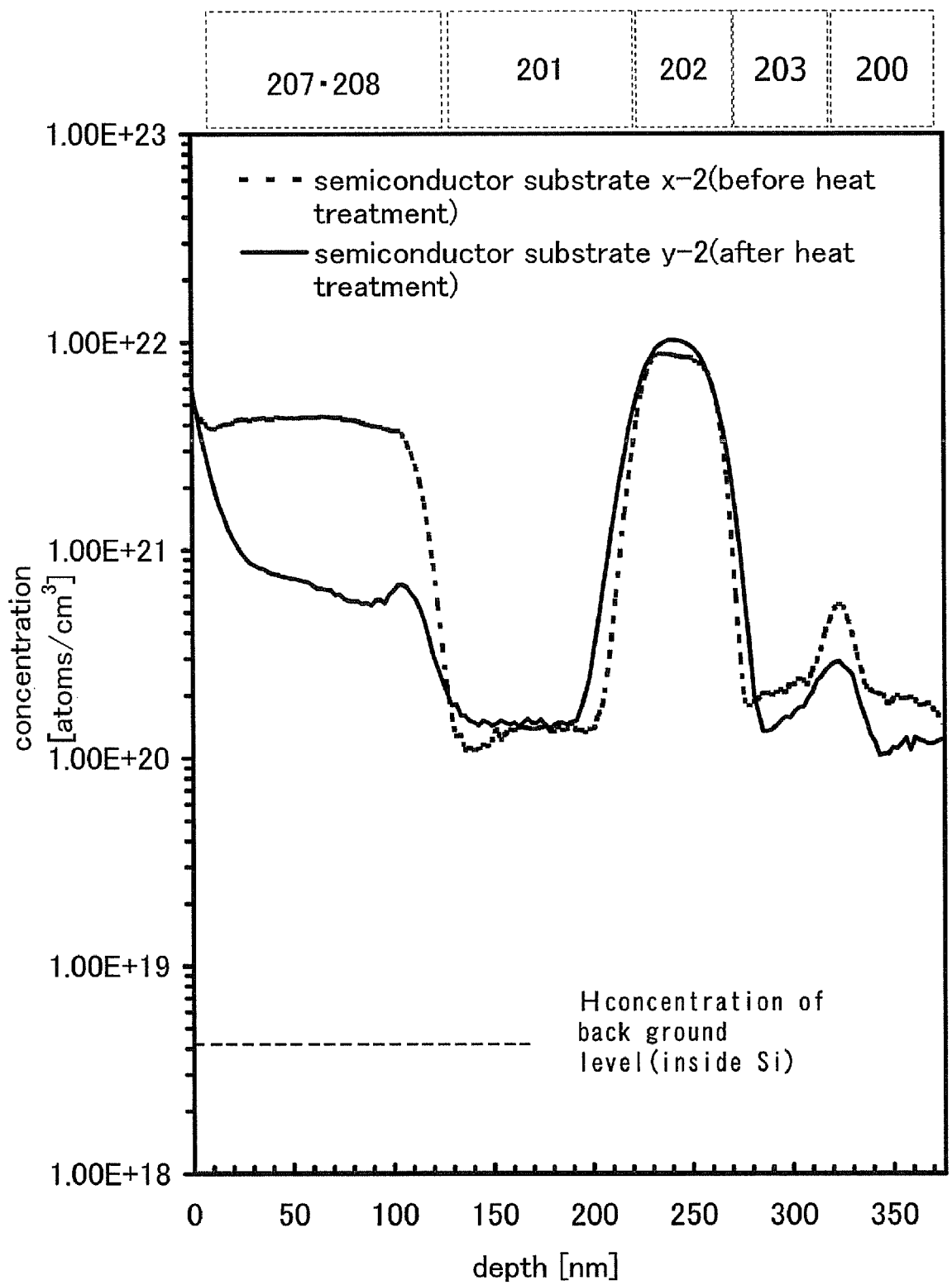
FIG. 42 is a hydrogen concentration SIMS profile in the depth direction of a semiconductor substrate before laser irradiation treatment.
Figure 43:
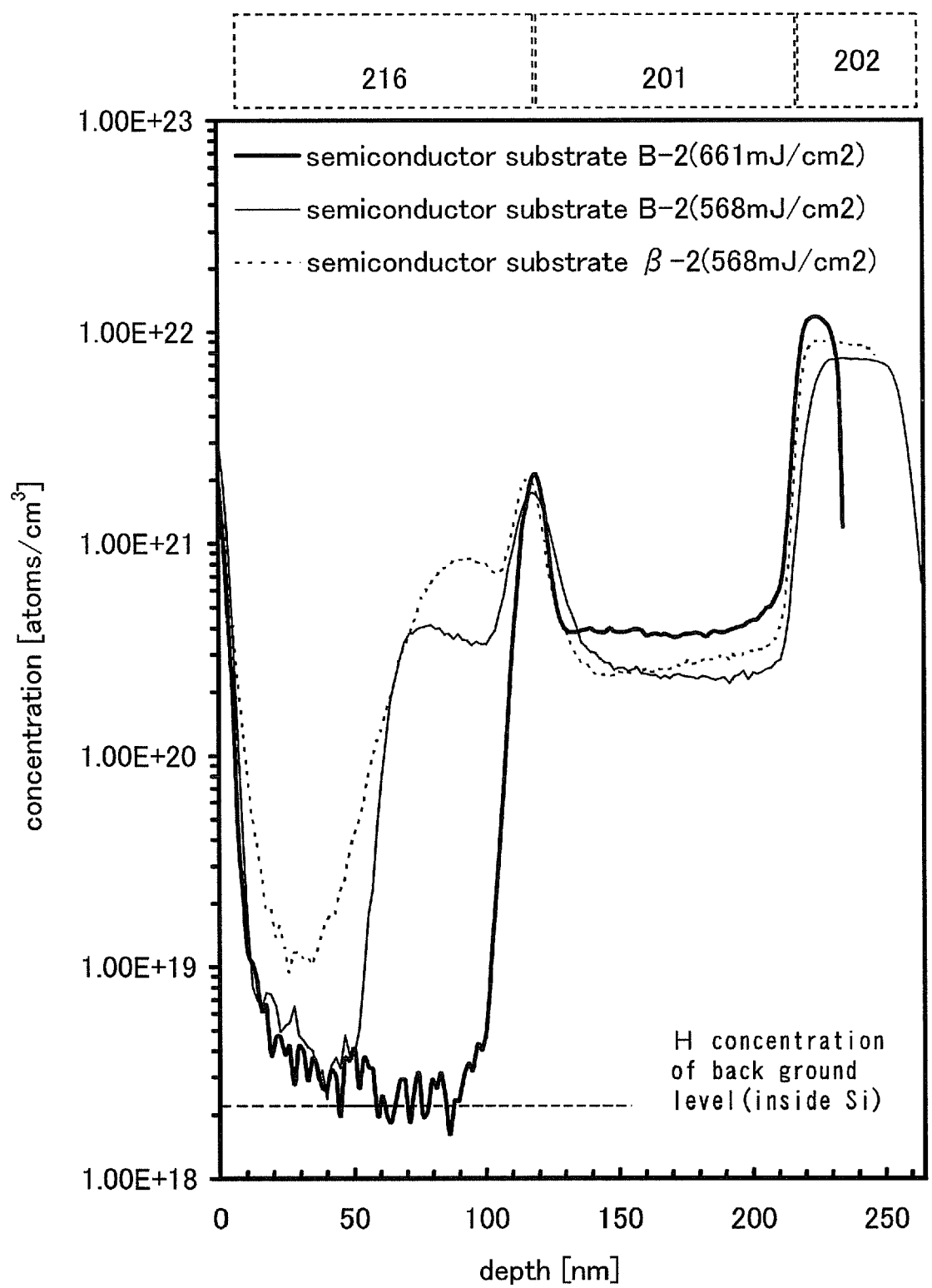
FIG. 43 is a hydrogen concentration SIMS profile in the depth direction of a semiconductor substrate after laser irradiation treatment.

FIG. 42 is a hydrogen concentration profile in the depth direction of the semiconductor substrates x-2 and y-2. FIG. 43 is a hydrogen concentration profile in the depth direction of the semiconductor substrates B-2 and β-2. FIG. 43 shows the results of measurement of the semiconductor substrates B-2 which are irradiated with laser light having energy densities of 568 mJ/cm$^2$ and 661 mJ/cm$^2$ and those of the semiconductor substrate β-2 which is irradiated with laser light having an energy density of 568 mJ/cm$^2$. Note that, in the graphs of FIGS. 42 and 43, the values of hydrogen concentrations are valid only within the single crystal silicon layers.

The semiconductor substrate x-2 is a semiconductor substrate which has not been subjected to heat treatment, and the semiconductor substrate β-2 is obtained by subjecting the semiconductor substrate x-2 to laser irradiation treatment. The semiconductor substrate y-2 is a semiconductor substrate which has been subjected to heat treatment, and the semiconductor substrate B-2 is obtained by subjecting the semiconductor substrate y-2 to laser irradiation treatment. With reference to FIG. 42, the hydrogen concentration (the minimum value) of the single crystal silicon layer 207 of the semiconductor substrate x-2 before heat treatment is about $4 \times 10^{21}$ atoms/cm$^3$, and through heat treatment, the hydrogen concentration of the single crystal silicon layer 208 of the semiconductor substrate y-2 is decreased to about $5 \times 10^{20}$ atoms/cm$^3$.

Accordingly, FIGS. 41 and 42 show that it is difficult to achieve planarization of a single crystal silicon layer through laser irradiation treatment when the hydrogen concentration of the single crystal silicon layer is $4 \times 10^{21}$ atoms/cm$^3$ or more and that it is possible to achieve crystallinity recovery and planarization of a single crystal silicon layer through laser light irradiation when the hydrogen concentration is about $5 \times 10^{20}$ atoms/cm$^3$.

FIG. 43 shows that hydrogen in the single crystal silicon layer is decreased when each of the semiconductor substrates x-2 and y-2 is subjected to laser irradiation treatment. It also shows that the higher the irradiation energy is, the lower the hydrogen concentration becomes. In the semiconductor substrate B-2 which has been subjected to the heat treatment, the minimum value of the hydrogen concentration in the single crystal silicon layer 216 is the lower detection limit. On the other hand, the minimum value of the hydrogen concentration in the single crystal silicon layer of the semiconductor substrate β-2 is about $1\times10^{19}$ atoms/cm$^3$.

It can be seen from the results of crystallinity evaluation in FIGS. 40 and 41 and the results of measurement of hydrogen concentrations in FIGS. 42 and 43 that a single crystal silicon layer preferably has a hydrogen concentration of $1\times10^{21}$ atoms/cm$^3$ or less in order to perform laser irradiation treatment. Thus, by subjecting a semiconductor substrate to heat treatment at 410° C. or higher before laser irradiation treatment to decrease hydrogen concentration in a single crystal silicon layer thereof, crystallinity improvement and planarization can be performed through laser irradiation treatment with high reproducibility. The temperature of this heat treatment is preferably 500° C. or higher, more preferably, 550° C. or higher. This is because as the temperature increases, treatment time can be shortened and crystallinity of a single crystal silicon layer can be improved more.

Embodiment 4

In this embodiment, the crystallinity of the single crystal silicon layer 215 of a semiconductor substrate A-1 is evaluated. For this evaluation, optical microscopic observation was performed. First, a method for manufacturing the semiconductor substrate A-1 is described.

Conditions of hydrogen ion doping for formation of the damaged region 205 were that the acceleration voltage was 50 kV and the dose was $2.2\times10^{16}$ ions/cm$^3$. As an ion doping apparatus, an apparatus in which a filament was used as a plasma discharge electrode was used. In the electromagnetic wave irradiation treatment, irradiation with millimeter waves (with a frequency of 28 GHz) was performed. The irradiation with millimeter waves was performed in a manner similar to the temperature measurement of FIG. 39B. The power of millimeter waves was controlled such that the single crystal silicon wafer 210 was heated at a temperature of 350° C. for two minutes.

The laser irradiation treatment was performed under the same conditions as those for the semiconductor substrate B-2. The semiconductor substrate A-1 of this embodiment was not subjected to heat treatment before the laser irradiation treatment (see FIG. 36H). The irradiation energy densities of laser light are as follows.

574 mJ/cm$^2$
591 mJ/cm$^2$
607 mJ/cm$^2$
623 mJ/cm$^2$
639 mJ/cm$^2$
656 mJ/cm$^2$
672 mJ/cm$^2$
688 mJ/cm$^2$
704 mJ/cm$^2$

Figure 44:
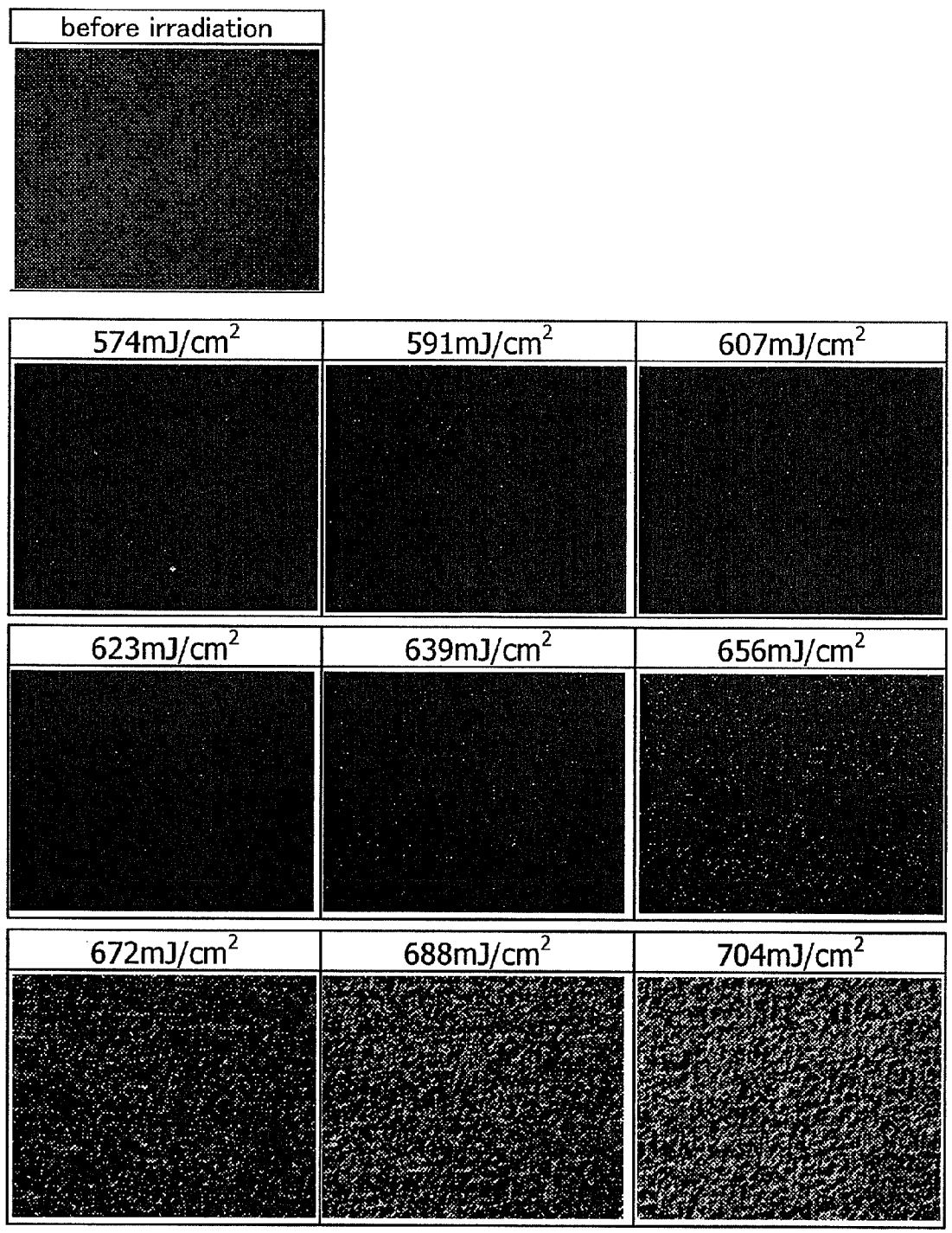
FIG. 44 shows optical photomicrographs (dark field images) of single crystal silicon layers of semiconductor substrates.

FIG. 44 shows optical photomicrographs, which are dark field images, of the single crystal silicon layer 215 of the semiconductor substrate A-1. The observation magnification is 100 times. The values added to the photographs are irradiation energy densities of laser light. The thickness of the single crystal silicon layer 215 of the semiconductor substrate A-1 was about 90 nm. When the irradiation energy density is 623 mJ/cm$^2$ or less, planarization and crystallinity recovery are achieved through the laser irradiation treatment. The photographs of FIG. 44 show that, under the conditions for hydrogen doping of this embodiment, crystallinity improvement and planarization of a single crystal silicon layer can be achieved through laser irradiation treatment even if heat treatment is not performed before the laser irradiation treatment.

Figure 45:
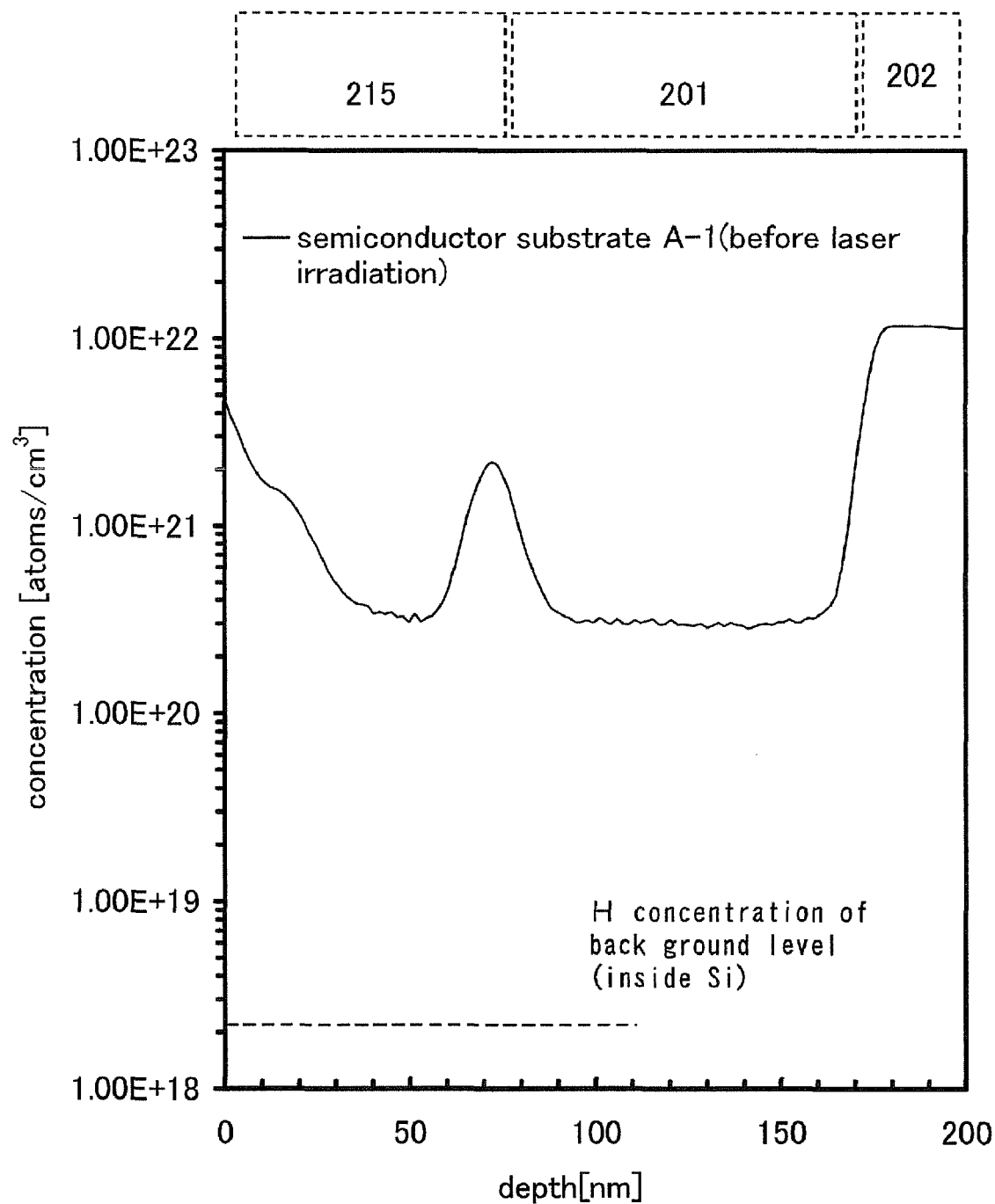
FIG. 45 is a hydrogen concentration SIMS profile in the depth direction of a semiconductor substrate after laser irradiation treatment.

FIG. 45 is a hydrogen concentration profile in the depth direction of the semiconductor substrate A-1 before the laser irradiation treatment. The hydrogen concentration was measured by SIMS. The hydrogen concentration of the single crystal silicon layer 215 of the semiconductor substrate A-1 is $1\times10^{21}$ atoms/cm$^3$ or less, about $2\times10^{20}$ atoms/cm$^3$. Note that, in FIG. 45, the values of hydrogen concentration are valid only within the single crystal silicon layer 215.

Embodiment 5

In this embodiment, the crystallinity of a semiconductor substrate B-3 is evaluated. For this evaluation, optical microscopic observation was performed. First, a method for manufacturing the semiconductor substrate B-3 is described.

Conditions of hydrogen ion doping for formation of the damaged region 205 were that the acceleration voltage was 40 kV and the dose was $2.2\times10^{16}$ ions/cm$^3$. As an ion doping apparatus, an apparatus which generates plasma discharge with high frequency waves was used. In the electromagnetic wave irradiation treatment, irradiation with millimeter waves was performed under the same conditions as those for the semiconductor substrate A-1. The heat treatment and the laser irradiation treatment were performed under the same conditions as those for the semiconductor substrate B-2. The irradiation energy densities of laser light are as follows.

565 mJ/cm$^2$
579 mJ/cm$^2$
594 mJ/cm$^2$
609 mJ/cm$^2$
623 mJ/cm$^2$

In this embodiment, a semiconductor substrate β-3 was manufactured as a comparative example. The semiconductor substrate β-3 is a substrate formed without any heat treatment performed before the laser irradiation treatment and was manufactured under the same conditions as those for the semiconductor substrate B-3 except for the heat treatment step. Note that, in the laser irradiation treatment of the semiconductor substrate β-3, the irradiation energy densities of laser light differ from those for the semiconductor substrate B-3 and are as follows.

574 mJ/cm$^2$
591 mJ/cm$^2$
607 mJ/cm$^2$
623 mJ/cm$^2$

FIG. 46 shows optical photomicrographs, which are dark field images, of the single crystal silicon layers of the semiconductor substrates B-3 and β-3. The observation magnification is 100 times. The values added to the photographs are irradiation energy densities of laser light. Note that the thickness of each of the single crystal silicon layers of the semiconductor substrates B-3 and β-3 is about 85 nm. It can be seen that planarization and crystallinity recovery of the single crystal silicon layer of the semiconductor substrate B-3 which has been subjected to the heat treatment are achieved through irradiation with laser light having an irradiation energy density of 565 mJ/cm$^2$ to 594 mJ/cm$^2$. The semiconductor substrate β-3 which has not been subjected to the heat treatment is not fully planarized through laser light irradiation. The photographs of FIG. 46 show that, under the conditions for hydrogen doping of this embodiment, the hydrogen concentration in a single crystal silicon layer is preferably decreased through heat treatment before laser irradiation treatment.

Figure 47:
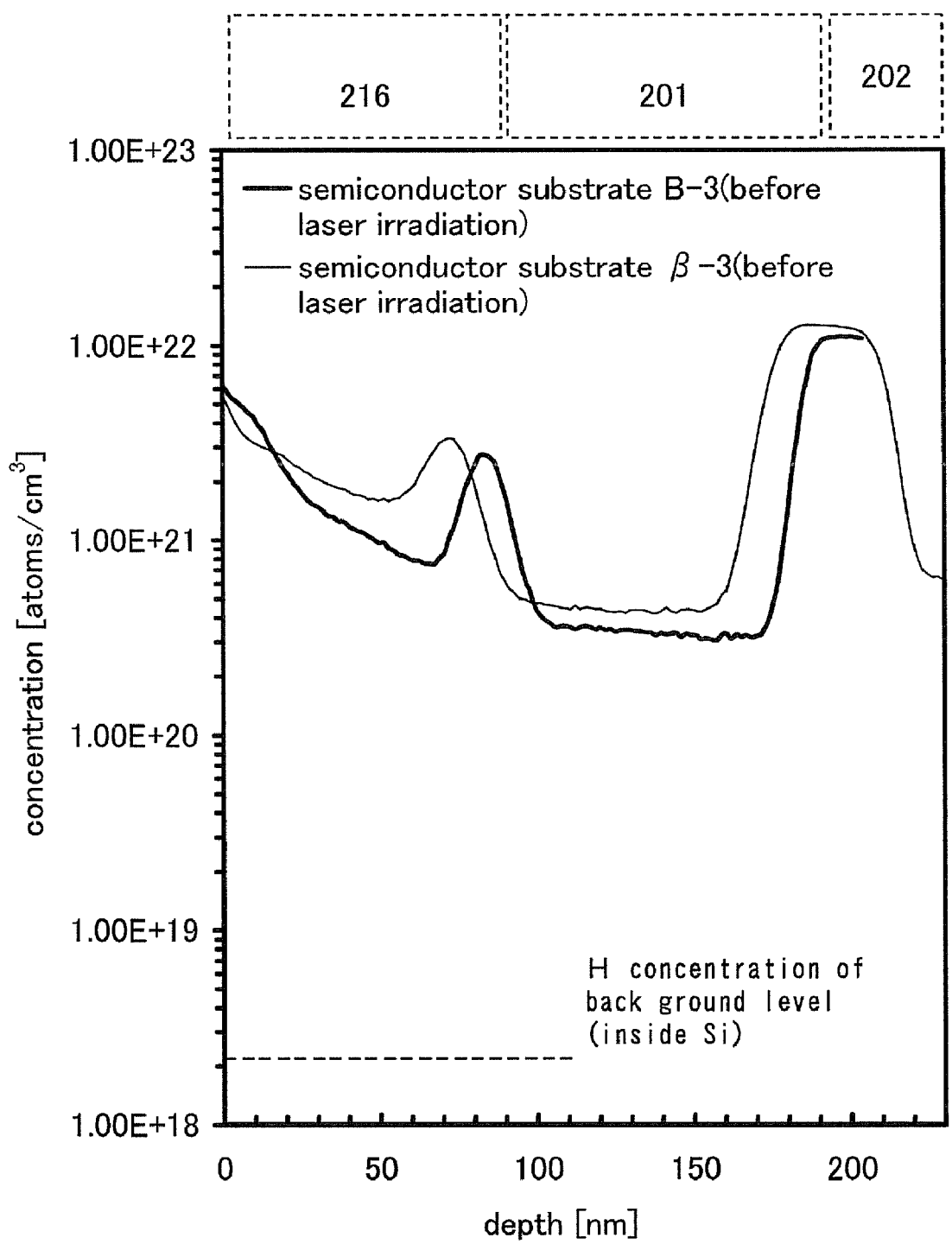
FIG. 47 is a hydrogen concentration SIMS profile in the depth direction of a semiconductor substrate after laser irradiation treatment.

FIG. 47 is a hydrogen concentration profile in the depth direction of the semiconductor substrates B-3 and β-3 before laser irradiation treatment. The hydrogen concentrations were measured by SIMS. The hydrogen concentration of the single crystal silicon layer of the semiconductor substrate β-3 is $1×10^{21}$ atoms/cm$^3$ or higher. On the other hand, the hydrogen concentration in the single crystal silicon layer 216 of the semiconductor substrate B-3 is about $8×10^{20}$ atoms/cm$^3$ or higher. Note that, in FIG. 47, the values of the hydrogen concentration are valid only within the single crystal silicon layer 216.

This application is based on Japanese Patent Application serial no. 2007-336454 filed with Japan Patent Office on Dec. 27, 2007, the entire contents of which are hereby incorporated by reference.

What is claimed is:

1. A method for manufacturing a semiconductor substrate, comprising the steps of:
    forming a buffer layer on each of a plurality of single crystal semiconductor substrates;
    forming a damaged region in a region at a depth from a surface of single crystal semiconductor substrate, the damaged region being formed by irradiating each of the plurality of single crystal semiconductor substrates with accelerated ions;
    performing a substrate fixing treatment to fix one or more of the plurality of single crystal semiconductor substrates to a base substrate by bonding a surface of the buffer layer and a surface of the base substrate;
    performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz; and
    performing the substrate fixing treatment and the electromagnetic wave irradiation treatment twice or more to form a semiconductor substrate where a plurality of single crystal semiconductor layers is fixed to the base substrate.

2. The method for manufacturing a semiconductor substrate according to claim 1, further comprising the step of performing a laser irradiation treatment to melt the plurality of single crystal semiconductor layers by irradiating each of the plurality of single crystal semiconductor layers with laser light after performing the substrate fixing treatment and the electromagnetic wave irradiation treatment twice or more to form the semiconductor substrate.

3. The method for manufacturing a semiconductor substrate according to claim 1, further comprising the step of:
    dividing an upper portion of at least one of the plurality of single crystal semiconductor substrates into a plurality of protruding portions each including the buffer layer on a surface by partly removing the buffer layer and the at least one of the plurality of single crystal semiconductor substrates after preparing the plurality of single crystal semiconductor substrates each including the buffer layer and the damaged region,
    wherein the at least one of the plurality of single crystal semiconductor substrates including the plurality of protruding portions is fixed to the base substrate in the substrate fixing treatment.

4. The method for manufacturing a semiconductor substrate according to claim 1, wherein the buffer layer includes a barrier layer for preventing sodium from entering the plurality of single crystal semiconductor layers fixed to the semiconductor substrate.

5. The method for manufacturing a semiconductor substrate according to claim 1, wherein the base substrate is a glass substrate.

6. The method for manufacturing a semiconductor substrate according to claim 1, further comprising a treatment for forming the damage region in each of the plurality of single crystal semiconductor substrates,
    wherein the treatment for forming the damaged region comprising exciting a hydrogen gas to generate plasma including $H_3^+$ and irradiating each of the plurality of single crystal semiconductor substrates with accelerated ions of all ions species included in the plasma.

7. The method for manufacturing a semiconductor substrate according to claim 1, wherein the electromagnetic wave irradiation treatment is performed without any intentional heating and cooling of the one or more of the plurality of single crystal semiconductor substrates.

8. A method for manufacturing a semiconductor device, wherein a plurality of transistors is manufactured by using at least one of the plurality of single crystal semiconductor layers fixed to the semiconductor substrate manufactured by the method according to claim 1.

9. A method for manufacturing a semiconductor substrate, comprising the steps of:
    forming a first buffer layer on each of a plurality of single crystal semiconductor substrates;
    forming a damaged region in a region at a depth from a surface of single crystal semiconductor substrate, the damaged region being formed by irradiating each of the plurality of single crystal semiconductor substrates with accelerated ions;
    forming a second buffer layer on a surface of a base substrate;
    performing a substrate fixing treatment to fix one or more of the plurality of single crystal semiconductor substrates to the base substrate by bonding a surface of the first buffer layer and a surface of the second buffer layer;
    performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz; and
    performing the substrate fixing treatment and the electromagnetic wave irradiation treatment twice or more to form a semiconductor substrate where a plurality of single crystal semiconductor layers is fixed to the base substrate.

10. The method for manufacturing a semiconductor substrate according to claim 9, further comprising the step of performing a laser irradiation treatment to melt the plurality of single crystal semiconductor layers by irradiating each of the plurality of single crystal semiconductor layers with laser light after performing the substrate fixing treatment and the electromagnetic wave irradiation treatment twice or more to form the semiconductor substrate.

11. A method for manufacturing a semiconductor substrate, comprising the steps of:
    forming a damaged region in a region at a depth from a surface of single crystal semiconductor substrate, the damaged region being formed by irradiating each of the plurality of single crystal semiconductor substrates with accelerated ions;
    forming a buffer layer on a surface of a base substrate;

performing a substrate fixing treatment to fix one or more of the plurality of single crystal semiconductor substrates to the base substrate by bonding a surface of the one or more of the plurality of single crystal semiconductor substrates and a surface of the buffer layer;

performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz; and performing the substrate fixing treatment and the electromagnetic wave irradiation treatment twice or more to form a semiconductor substrate where a plurality of single crystal semiconductor layers is fixed to the base substrate.

12. The method for manufacturing a semiconductor substrate according to claim 11, further comprising the step of performing a laser irradiation treatment to melt the plurality of single crystal semiconductor layers by irradiating each of the plurality of single crystal semiconductor layers with laser light after performing the substrate fixing treatment and the electromagnetic wave irradiation treatment twice or more to form the semiconductor substrate.

13. A method for manufacturing a semiconductor substrate, comprising the steps of:
forming a buffer layer on each of a plurality of single crystal semiconductor substrates;

forming a damaged region in a region at a depth from a surface of single crystal semiconductor substrate, the damaged region being formed by irradiating each of the plurality of single crystal semiconductor substrates with accelerated hydrogen ions;

performing a substrate fixing treatment to fix one or more of the plurality of single crystal semiconductor substrates to a base substrate by bonding a surface of the buffer layer and a surface of the base substrate;

performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz;

performing the substrate fixing treatment and the electromagnetic wave irradiation treatment twice or more to form a semiconductor substrate where a plurality of single crystal semiconductor layers is fixed to the base substrate;

performing a heat treatment to heat the plurality of single crystal semiconductor layers of the semiconductor substrate at a temperature equal to or higher than 410° C. and lower than a melting point of the plurality of single crystal semiconductor layers; and performing a laser irradiation treatment to melt the plurality of single crystal semiconductor layers by irradiating each of the plurality of single crystal semiconductor layers with laser light after the heat treatment.

14. The method for manufacturing a semiconductor substrate according to claim 13, wherein a laser light irradiation surface is placed in an inert gas atmosphere in the laser irradiation treatment, and wherein the inert gas is a nitrogen gas or a noble gas.

15. The method for manufacturing a semiconductor substrate according to claim 13, wherein the plurality of single crystal semiconductor layers is heated at 500° C. or higher in the heat treatment.

16. The method for manufacturing a semiconductor substrate according to claim 13, wherein a hydrogen concentration of each of the plurality of single crystal semiconductor layers is made $1 \times 10^{21}$ atoms/cm$^3$ or less by the heat treatment.

17. A method for manufacturing a semiconductor substrate, comprising the steps of:
forming a first buffer layer on each of a plurality of single crystal semiconductor substrates;

forming a damaged region in a region at a depth from a surface of single crystal semiconductor substrate, the damaged region being formed by irradiating each of the plurality of single crystal semiconductor substrates with accelerated hydrogen ions;

forming a second buffer layer on a surface of a base substrate;

performing a substrate fixing treatment to fix one or more of the plurality of single crystal semiconductor substrates to the base substrate by bonding a surface of the first buffer layer and a surface of the second buffer layer;

performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz;

performing the substrate fixing treatment and the electromagnetic wave irradiation treatment twice or more to form a semiconductor substrate where a plurality of single crystal semiconductor layers is fixed to the base substrate;

performing a heat treatment to heat the plurality of single crystal semiconductor layers of the semiconductor substrate at a temperature equal to or higher than 410° C. and lower than a melting point of the plurality of single crystal semiconductor layers; and performing a laser irradiation treatment to melt the plurality of single crystal semiconductor layers by irradiating each of the plurality of single crystal semiconductor layers with laser light after the heat treatment.

18. The method for manufacturing a semiconductor substrate according to claim 17, wherein a laser light irradiation surface is placed in an inert gas atmosphere in the laser irradiation treatment, and wherein the inert gas is a nitrogen gas or a noble gas.

19. The method for manufacturing a semiconductor substrate according to claim 17, wherein the plurality of single crystal semiconductor layers is heated at 500° C. or higher in the heat treatment.

20. The method for manufacturing a semiconductor substrate according to claim 17, wherein a hydrogen concentration of each of the plurality of single crystal semiconductor layers is made $1 \times 10^{21}$ atoms/cm$^3$ or less by the heat treatment.

21. A method for manufacturing a semiconductor substrate, comprising the steps of:
forming a damaged region in a region at a depth from a surface of single crystal semiconductor substrate, the damaged region being formed by irradiating each of the plurality of single crystal semiconductor substrates with accelerated hydrogen ions;

forming a buffer layer on a surface of a base substrate;

performing a substrate fixing treatment to fix one or more of the plurality of single crystal semiconductor substrates to the base substrate by bonding a surface of the one or more of the plurality of single crystal semiconductor substrates and a surface of the buffer layer;

performing an electromagnetic wave irradiation treatment to divide the one or more of the plurality of single crystal semiconductor substrates fixed to the base substrate by the substrate fixing treatment along the damaged region by irradiating the one or more of the plurality of single crystal semiconductor substrates with an electromagnetic wave having a frequency of 300 MHz to 300 GHz;

performing the substrate fixing treatment and the electromagnetic wave irradiation treatment twice or more to form a semiconductor substrate where a plurality of single crystal semiconductor layers is fixed to the base substrate;

performing a heat treatment to heat the plurality of single crystal semiconductor layers of the semiconductor substrate at a temperature equal to or higher than 410° C. and lower than a melting point of the plurality of single crystal semiconductor layers; and performing a laser irradiation treatment to melt the plurality of single crystal semiconductor layers by irradiating each of the plurality of single crystal semiconductor layers with laser light after the heat treatment.

22. The method for manufacturing a semiconductor substrate according to claim 21, wherein a laser light irradiation surface is placed in an inert gas atmosphere in the laser irradiation treatment.

23. The method for manufacturing a semiconductor substrate according to claim 21, wherein the plurality of single crystal semiconductor layers is heated at 500° C. or higher in the heat treatment.

24. The method for manufacturing a semiconductor substrate according to claim 21, wherein a hydrogen concentration of each of the plurality of single crystal semiconductor layers is made $1 \times 10^{21}$ atoms/cm$^3$ or less by the heat treatment.

25. The method for manufacturing a semiconductor substrate according to claim 21, further comprising the step of:
dividing an upper portion of at least one of the plurality of single crystal semiconductor substrates into a plurality of protruding portions each including the buffer layer on a surface by partly removing the buffer layer and the at least one of the plurality of single crystal semiconductor substrates after preparing the plurality of single crystal semiconductor substrates each including the buffer layer and the damaged region,
wherein the at least one of the plurality of single crystal semiconductor substrates including the plurality of protruding portions is fixed to the base substrate in the substrate fixing treatment.

26. The method for manufacturing a semiconductor substrate according to claim 21, wherein the buffer layer includes a barrier layer for preventing sodium from entering the plurality of single crystal semiconductor layers fixed to the semiconductor substrate.

27. The method for manufacturing a semiconductor substrate according to claim 21, wherein the base substrate is a glass substrate.

28. The method for manufacturing a semiconductor substrate according to claim 21, further comprising a treatment for forming the damage region in each of the plurality of single crystal semiconductor substrates,
wherein the treatment for forming the damaged region comprising exciting a hydrogen gas to generate plasma including $H_3^+$ and irradiating each of the plurality of single crystal semiconductor substrates with accelerated ions of all ions species included in the plasma.

* * * * *